United States Patent
Lin et al.

(10) Patent No.: US 8,399,989 B2
(45) Date of Patent: Mar. 19, 2013

(54) METAL PAD OR METAL BUMP OVER PAD EXPOSED BY PASSIVATION LAYER

(75) Inventors: Mou-Shiung Lin, Hsin-Chu (TW);
Hsin-Jung Lo, Yonghe (TW);
Chiu-Ming Chou, Kaohsiung (TW);
Chien-Kang Chou, Tainan Hsien (TW);
Ke-Hung Chen, Kao-Hsiung (TW)

(73) Assignee: Megica Corporation, Hsinchu (TW)

( * ) Notice: Subject to any disclaimer, the term of this patent is extended or adjusted under 35 U.S.C. 154(b) by 1191 days.

(21) Appl. No.: 11/461,416

(22) Filed: Jul. 31, 2006

(65) Prior Publication Data

US 2007/0026631 A1    Feb. 1, 2007

Related U.S. Application Data

(60) Provisional application No. 60/703,933, filed on Jul. 29, 2005, provisional application No. 60/703,932, filed on Jul. 29, 2005.

(51) Int. Cl.
*H01L 23/48* (2006.01)
*H01L 23/52* (2006.01)
*H01L 29/40* (2006.01)

(52) U.S. Cl. ......... 257/758; 257/E21.508; 257/E23.021; 257/E23.129

(58) Field of Classification Search ............... 257/778, 257/758, 737–738, 779, 780, 782, 784, E23.015, 257/E23.02, E21.508, E23.021, E23.129
See application file for complete search history.

(56) References Cited

U.S. PATENT DOCUMENTS

| | | | |
|---|---|---|---|
| 5,134,460 A | 7/1992 | Brady et al. | |
| 5,795,833 A * | 8/1998 | Yu et al. | 438/763 |
| 6,413,851 B1 | 7/2002 | Chow et al. | |
| 6,472,304 B2 | 10/2002 | Chittipedi et al. | |
| 6,753,259 B2 | 6/2004 | Jang et al. | |
| 6,798,050 B1 | 9/2004 | Homma et al. | |
| 7,319,277 B2 | 1/2008 | Lin | |
| 7,470,997 B2 * | 12/2008 | Lin et al. | 257/781 |
| 7,531,417 B2 | 5/2009 | Lin | |
| 7,592,246 B2 | 9/2009 | Akram | |
| 8,148,822 B2 | 4/2012 | Lin et al. | |
| 2001/0052644 A1 | 12/2001 | Howell et al. | |
| 2002/0043723 A1 | 4/2002 | Shimizu et al. | |
| 2003/0107137 A1 | 6/2003 | Stierman et al. | |
| 2003/0189261 A1 | 10/2003 | Tong | |
| 2003/0222295 A1 | 12/2003 | Lin | |
| 2004/0007779 A1 | 1/2004 | Arbuthnot | |
| 2004/0070042 A1 | 4/2004 | Lee | |

(Continued)

FOREIGN PATENT DOCUMENTS

| CN | 1314225 A | 9/2001 |
|---|---|---|
| CN | 1574345 A | 2/2005 |

(Continued)

OTHER PUBLICATIONS

Hong, Xiao: "Introduction to Semiconductor Manufacturing Technology," 2001 p. 612 and pp. 624-628.

(Continued)

*Primary Examiner* — Ngan Ngo

(74) *Attorney, Agent, or Firm* — Seyfarth Shaw LLP

(57) ABSTRACT

A circuitry component comprising a semiconductor substrate, a pad over said semiconductor substrate, a tantalum-containing layer on a side wall and a bottom surface of said pad, a passivation layer over said semiconductor substrate, an opening in said passivation layer exposing said pad, a titanium-containing layer over said pad exposed by said opening, and a gold layer over said titanium-containing layer.

40 Claims, 91 Drawing Sheets

U.S. PATENT DOCUMENTS

| | | | |
|---|---|---|---|
| 2005/0098605 A1 | 5/2005 | Edelstein et al. | |
| 2005/0167837 A1* | 8/2005 | Cheng et al. | 257/751 |
| 2005/0167840 A1 | 8/2005 | Kothandaraman | |
| 2005/0277283 A1 | 12/2005 | Lin et al. | |
| 2006/0091536 A1* | 5/2006 | Huang et al. | 257/734 |
| 2006/0202346 A1* | 9/2006 | Shih et al. | 257/774 |
| 2007/0042596 A1* | 2/2007 | McTeer | 438/622 |

FOREIGN PATENT DOCUMENTS

| | | |
|---|---|---|
| EP | 1024531 A2 | 8/2000 |
| EP | 1126519 A2 | 8/2001 |
| TW | 444288 | 7/2001 |
| TW | 468245 | 12/2001 |
| TW | 469591 | 12/2001 |
| TW | 494510 | 7/2002 |
| TW | 531873 | 5/2003 |
| TW | 586208 | 5/2004 |
| TW | 200426990 | 12/2004 |
| TW | I225288 | 12/2004 |
| TW | I229930 | 3/2005 |
| TW | I236722 | 7/2005 |
| TW | I249822 | 2/2006 |

OTHER PUBLICATIONS

Search Report for Taiwan Application No. 095127947 dated Dec. 29, 2009 with English Translation.

Search Report for Taiwan Application No. 095127948 dated Dec. 30, 2009 with English Translation.

Search Report for Taiwan Patent Application No. 095127947 dated Jun. 26, 2010, with English Translation.

Search Report for Taiwan Patent Application No. 095127948 dated Jun. 25, 2010, with English Translation.

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Decision for Taiwan Patent Application No. 095127947 dated Mar. 15, 2011, with English translated summary.

* cited by examiner

METAL PAD OR METAL BUMP OVER PAD EXPOSED BY PASSIVATION LAYER

This application claims priority to U.S. provisional application No. 60/703,932, filed on Jul. 29, 2005, and to U.S. provisional application No. 60/703,933, filed on Jul. 29, 2005, which are herein incorporated by reference in their entirety.

BACKGROUND OF THE PRESENT INVENTION

1. Field of Invention

The invention relates to a metallization structure over a semiconductor chip or wafer and the method for forming the same, and more particularly to a metallization structure over a copper pad and the method for forming the same.

2. Description of Related Arts

The reduction of the feature sizes of semiconductor devices using state-of-the-art semiconductor techniques have dramatically increased the device packing density of a single integrated circuit (IC) chip. However, as the device packing density increases, it is necessary to increase the number of electrical metal interconnect layers on the IC chip to effectively wire up the discrete devices on a substrate while reducing the chip size. For example, having two to six levels of metal interconnect layers in a single IC chip is a commonplace in this field.

After completing the multilevel interconnect structure, bonding pads are formed on the top surface of the interconnect structure to provide external electrical connections to the chip or die. A passivation layer is applied, such as silicon oxide, silicon nitride, silicon oxy-nitride or a combination thereof to protect the chip from moisture and contamination. After the passivation layer is formed, die containing a plurality of circuit patterns is connected to a package substrate. The package substrate may have a plurality of pins for connecting the circuitry to an external printed circuit board.

One method for forming electrical connections between the die and the package substrate is wire bonding. A corresponding set of contacts is located on the package substrate. A connecting wire is bonded to connect each bonding pad to a respective contact on the package substrate, using a method such as ultrasonic bonding. Following wire bonding, the package is encapsulated and sealed.

The reliability of the bonding process is particularly critical since the bonding process occurs so late in the production cycle. Die being packaged have typically already been tested and sorted. Any problems in the wire bonding process thus impact only good die. Secure, reliable bonding of the wire to the bonding pad requires that the bonding pad be formed of metals compatible with the bonding process. Aluminum and aluminum alloys are typically employed to achieve the most reliable bonds.

To prevent the shifting of bonding wires during the step of injecting the plastic material or the lengthening of the bonding wires, the bonding pads have been disposed on the peripheral of the chips. Therefore, longer conductive traces are needed to connect the device to the bonding pads. As the trend of chip advances toward higher speeds and higher capabilities, the number of I/O connections rapidly increases. However, the high inductance created in the connection of bonding pads and bonding wires obstructs the high-speed operation of the chips.

SUMMARY OF THE PRESENT INVENTION

The invention provides a circuitry component comprising a semiconductor substrate, a pad over said semiconductor substrate, a tantalum-containing layer on a sidewall and a bottom surface of said pad, a passivation layer over said semiconductor substrate, an opening in said passivation layer exposing said pad, a titanium-containing layer over said pad exposed by said opening, and a gold layer over said titanium-containing layer.

The invention provides another circuitry component comprising a semiconductor substrate, a pad over said semiconductor substrate, a passivation layer over said semiconductor substrate, an opening in said passivation layer exposing said pad, wherein said passivation layer comprises a first silicon-nitride layer, a silicon-oxide layer over said first silicon nitride layer, and a second silicon-nitride layer over said silicon-oxide layer, a titanium-containing layer over said pad exposed by said opening, and a gold layer over said titanium-containing layer.

The invention provides another circuitry component comprising a semiconductor substrate, an insulating layer over said semiconductor substrate, wherein said insulating layer has a dielectric constant of lower than 3, a copper pad over said insulating layer, a passivation layer over said insulating layer, an opening in said passivation layer exposing said copper pad, a titanium-containing layer over said copper pad exposed by said opening, and a gold layer over said titanium-containing layer.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

DETAILED DESCRIPTION OF THE PREFERRED EMBODIMENT

The following are the embodiments to illustrate the processes and structures to form a metallization structure, such as a metal bump or metal trace, over a copper pad on a semiconductor wafer. After the steps of forming metallization structure are finished, the semiconductor wafer is cut into multiple semiconductor chips for the following packaging processes.

Figure 1:
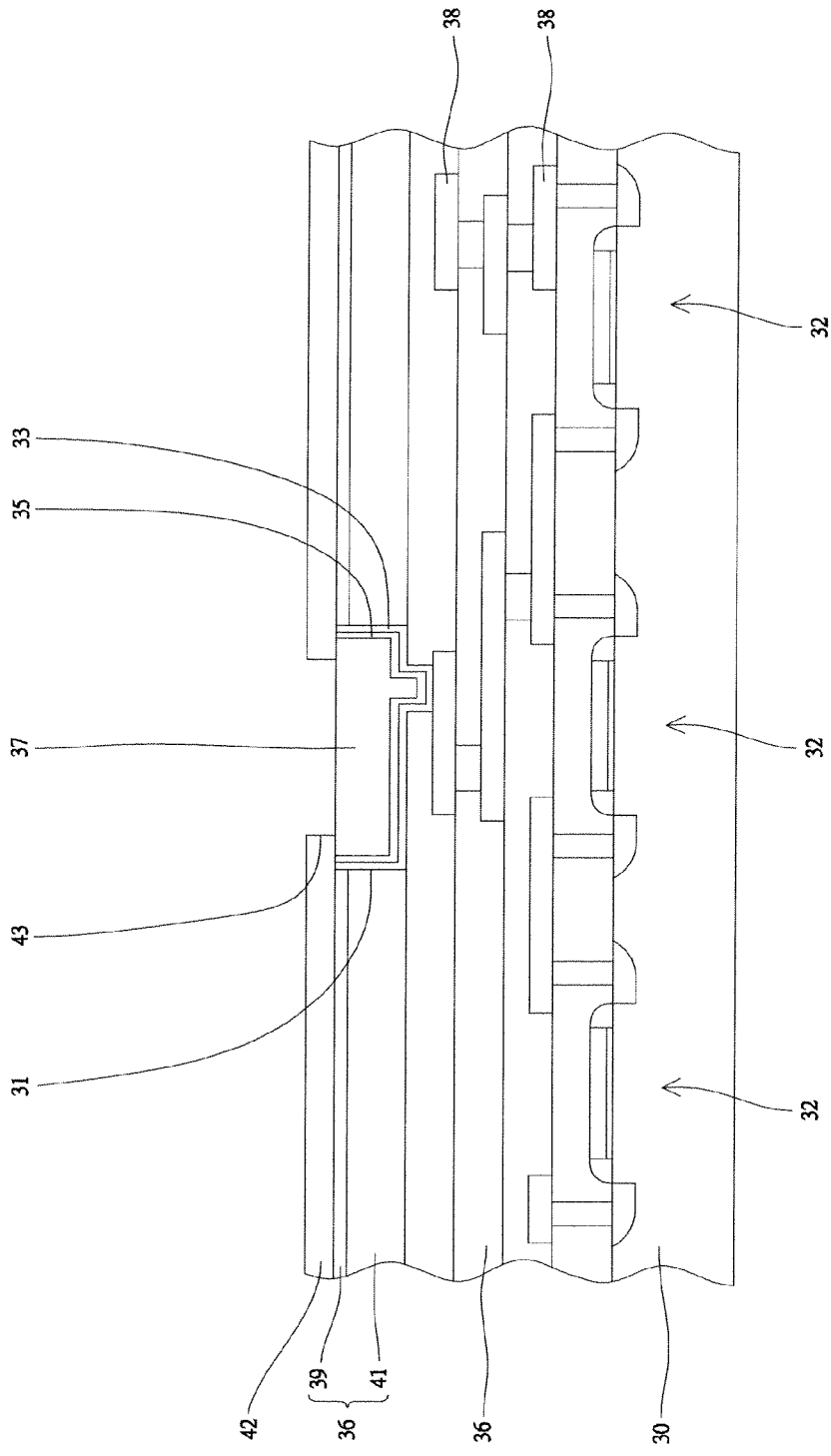
FIGS. 1-15 are cross-sectional views showing a process of forming a metal pad or metal bump over a copper pad according to a first embodiment.

Referring to FIG. 1, a semiconductor substrate 30 is provided, and the semiconductor substrate 30 may be Si substrate, GaAs substrate, GeSi substrate or SOI (silicon-on-insulator) substrate. The semiconductor substrate 30 is a circular semiconductor wafer. The semiconductor substrate 30 has an active surface having multiple electronic elements 32, which are formed via doping trivalent or pentavalent ions, such as boron ions or phosphorus ions. The electronic elements 32 may be MOS transistors, MOS devices, p-channel MOS devices, n-channel MOS devices, BiCMOS devices, Bipolar Junction Transistors, diffusion areas, resistors, capacitors, or CMOS devices.

Referring to FIG. 1, a multiple thin-film insulating layers 36 and multiple thin-film circuit layers 38 are formed over the active surface of the semiconductor substrate 30. Each of the thin-film insulating layers 36 has a thickness less than 3 µm. Each of the thin-film circuit layers 38 has a thickness less than 3 µm. The thin-film circuit layers 38 are made of a copper material or an aluminum material. The thin-film insulating layers 36 are usually formed with a CVD (Chemical Vapor Deposition) method. The material of the thin-film insulating layers 36 may be silicon oxide, TEOS (Tetraethoxysilane), SiwCxOyHz, compound of silicon and nitrogen/compound of silicon, nitrogen and oxygen, SOG (Spin-On Glass), FSG (Fluoro-Silicate Glass), SiLK, black diamond, polyarylene ether, PBO (Polybenzoxazole), or porous silicon oxide. The dielectric constant of the thin-film insulating layers 36 may be lower than 3.

When a damascene process is used to form one of multiple thin-film circuit layers 38, such as the topmost one under the passivation layer 42, over the semiconductor substrate 30, a diffusion-barrier layer 33, such as Ta, TaN, Co, Ni, W, WN, Nb, Al, silicate, TiN, TiSiN, having a thickness of between 0.05 and 0.5 microns, is firstly sputtered or evaporated on the upper surface of one of the thin-film insulating layers 36 and on the bottoms and the sidewalls of the openings 31 in said one of the thin-film insulating layers 36; next, a seed layer 35, such as copper, having a thickness of between 0.05 and 0.5 microns, is sputtered on the diffusion-barrier layer; next, another copper layer 37 is electroplated on the seed layer 35; and then, the electroplated copper layer 37, seed layer 35 and diffusion-barrier layer 33 outside the openings 31 in said one of the thin-film insulating layers 36 are removed with a chemical mechanical polishing (CMP) method until the upper surface of an etching stop layer 39, such as silicon nitride, silicon oxynitride or silicon carbide, having a thickness of between 0.01 and 0.1 microns, of said one of the thin-film insulating layers 36 is exposed. The topmost insulating layer 36 under the passivation layer 42 may comprises a layer 41 of above-mentioned low-k material under the etching stop layer 39.

In another method to form one of multiple thin-film circuit layers 38, such as the second topmost one under the passivation layer 42, over the semiconductor substrate 30, an aluminum layer or an aluminum-copper alloy layer is sputtered on one of the thin-film insulating layers 36; and then, the aluminum layer or the aluminum-copper alloy layer is patterned with photolithographic and etching processes.

The thin-film circuit layers 38 formed by the above two methods can be interconnected or connected to the electronic elements 32 via conductive vias in openings in the thin-film insulating layers 36. The thickness of one of the thin-film circuit layers 38 formed by the above two methods is generally between 0.05 and 2 microns, and preferably between 0.1 and 1 microns. The thin-film circuit layers 38 formed by the above two methods are fabricated with a 5X stepper or 5X scanner or other superior equipment in the step of a photolithographic process.

Next, a passivation layer 42 is formed over the thin-film insulating layers 36 and the thin-film circuit layers 38 with a CVD method. The passivation layer 42 can protect the electronic elements 32 in the semiconductor substrate 30 from foreign ion contamination. The passivation layer 42 can retard the penetration of mobile ions (such as sodium ions), moisture, transition metals (such as gold, silver, and copper) and impurities. Thereby, the passivation layer 42 can protect the thin-film circuit layers 38, the thin-film insulating layers 36 and the underlying electronic elements 32 including: transistors, polysilicon resistors, polysilicon-polysilicon capacitors. The passivation layer 42 is usually composed of silicon oxide, compounds of silicon and oxygen, silicate and phosphate glass, silicon nitride, or silicon oxy-nitride, etc. An opening in the passivation layer 42 exposes the copper pad 37, wherein the opening in the passivation layer 42 has a greatest lateral dimension of between 5 and 20 microns, or of between 20 and 60 microns. Below, eleven methods for depositing the passivation layer 42 are to be introduced.

Method 1

A silicon oxide layer with a thickness of between 0.2 and 1.2 µm is formed with a CVD method; and next, a silicon nitride layer with a thickness of between 0.2 and 1.2 µm is formed on the silicon oxide with a CVD method.

Method 2

A silicon oxide layer with a thickness of between 0.2 and 1.2 µm is formed with a CVD method; next, a silicon oxy-nitride layer with a thickness of between 0.05 and 0.15 µm is formed on the silicon oxide with a plasma-enhanced CVD method; and next, a silicon nitride layer with a thickness of between 0.2 and 1.2 µm is formed on the silicon oxy-nitride layer with a CVD method.

Method 3

A silicon oxy-nitride layer with a thickness of between 0.05 and 0.15 µm is formed with a CVD method; next, a silicon oxide layer with a thickness of between 0.2 and 1.2 µm is formed on the silicon oxy-nitride layer with a CVD method; and next, a silicon nitride layer with a thickness of between 0.2 and 1.2 µm is formed on the silicon oxide layer with a CVD method.

Method 4

A first silicon oxide layer with a thickness of between 0.2 and 0.5 µm is formed with a CVD method; next, a second silicon oxide layer with a thickness of between 0.5 and 1 µm is formed on the first silicon oxide layer with a spin-coating method; next, a third silicon oxide layer with a thickness of between 0.2 and 0.5 µm is formed on the second silicon oxide layer with a CVD method; and next, a silicon nitride layer with a thickness of between 0.2 and 1.2 µm is formed on the third silicon oxide layer with a CVD method.

Method 5

A silicon oxide layer with a thickness of between 0.5 and 2 µm is formed with a HDP-CVD (High Density Plasma-Chemical Vapor Deposition) method; and next, a silicon nitride layer with a thickness of between 0.2 and 1.2 µm is formed on the silicon oxide layer with a CVD method.

Method 6

A USG (Undoped Silicate Glass) layer with a thickness of between 0.2 and 3 µm is firstly formed; next, an insulating layer with a thickness of between 0.5 and 3 µm, such as TEOS, BPSG (Borophosphosilicate Glass) or PSG (Borophosphosilicate Glass), is formed on the USG layer; and next, a silicon nitride layer with a thickness of between 0.2 and 1.2 µm is formed on the insulating layer with a CVD method.

Method 7

A first silicon oxy-nitride layer with a thickness of between 0.05 and 0.15 µm is optionally formed with a CVD method; next, a silicon oxide layer with a thickness of between 0.2 and 1.2 µm is formed on the first silicon oxy-nitride layer with a CVD method; next, a second silicon oxy-nitride layer with a thickness of between 0.05 and 0.15 µm is optionally formed on the silicon oxide layer with a CVD method; next, a silicon nitride layer with a thickness of between 0.2 and 1.2 µm is formed on the second silicon oxy-nitride layer or on the silicon oxide layer with a CVD method; next, a third silicon oxy-nitride layer with a thickness of between 0.05 and 0.15 µm is optionally formed on the silicon nitride layer with a CVD method; and next, a silicon oxide layer with a thickness of between 0.2 and 1.2 µm is formed on the third silicon oxy-nitride layer or on the silicon nitride layer with a CVD method.

Method 8

A first silicon oxide layer with a thickness of between 0.2 and 1.2 µm is formed with a PECVD (Plasma Enhanced Chemical Vapor Deposition) method; next, a second silicon oxide layer with a thickness of between 0.5 and 1 µm is formed on the first silicon oxide layer with a spin-coating method; next, a third silicon oxide layer with a thickness of between 0.2 and 1.2 µm is formed on the second silicon oxide layer with a CVD method; next, a silicon nitride layer with a thickness of between 0.2 and 1.2 µm is formed on the third silicon oxide layer with a CVD method; and next, a fourth silicon oxide layer with a thickness of between 0.2 and 1.2 µm is formed on the silicon nitride layer with a CVD method.

Method 9

A first silicon oxide layer with a thickness of between 0.5 and 2 µm is formed with a HDP-CVD method; next, a silicon nitride layer with a thickness of between 0.2 and 1.2 µm is formed on the first silicon oxide layer with a CVD method; and next, a second silicon oxide layer with a thickness of between 0.5 and 2 µm is formed on the silicon nitride layer with a HDP-CVD method.

Method 10

A first silicon nitride layer with a thickness of between 0.2 and 1.2 µm is formed with a CVD method; next, a silicon oxide layer with a thickness of between 0.2 and 1.2 µm is formed on the first silicon nitride layer with a CVD method; and next, a second silicon nitride layer with a thickness of between 0.2 and 1.2 µm is formed on the silicon oxide layer with a CVD method.

Method 11

A silicon oxy-nitride layer with a thickness of between 0.05 and 0.15 µm is formed with a CVD method; next, a first silicon oxide layer with a thickness of between 0.2 and 1.2 µm is formed on the silicon oxy-nitride layer with a CVD method; next, a silicon nitride layer with a thickness of between 0.2 and 1.2 µm is formed on the first silicon oxide layer with a CVD method; and next, a second silicon oxide layer with a thickness of between 0.2 and 1.2 µm is formed on the silicon nitride layer with a CVD method.

The total thickness of the passivation layer 42 is generally more than 0.35 cm, and the thickness of the silicon nitride layer is generally more than 0.3 µm under an optimal condition. Typically, the passivation layer 42 comprises a topmost silicon-nitride layer of the completed semiconductor wafer or chip. The passivation layer 42 comprises a topmost silicon-oxide layer of the completed semiconductor wafer or chip. The passivation layer 42 comprises a topmost silicon-oxynitride layer of the completed semiconductor wafer or chip. The passivation layer 42 comprises a topmost CVD-formed layer of the completed semiconductor wafer or chip.

Next, a metal bump or metal pad can be formed over the copper pad 37 exposed by the opening 43 in the passivation layer 42.

Figure 2:
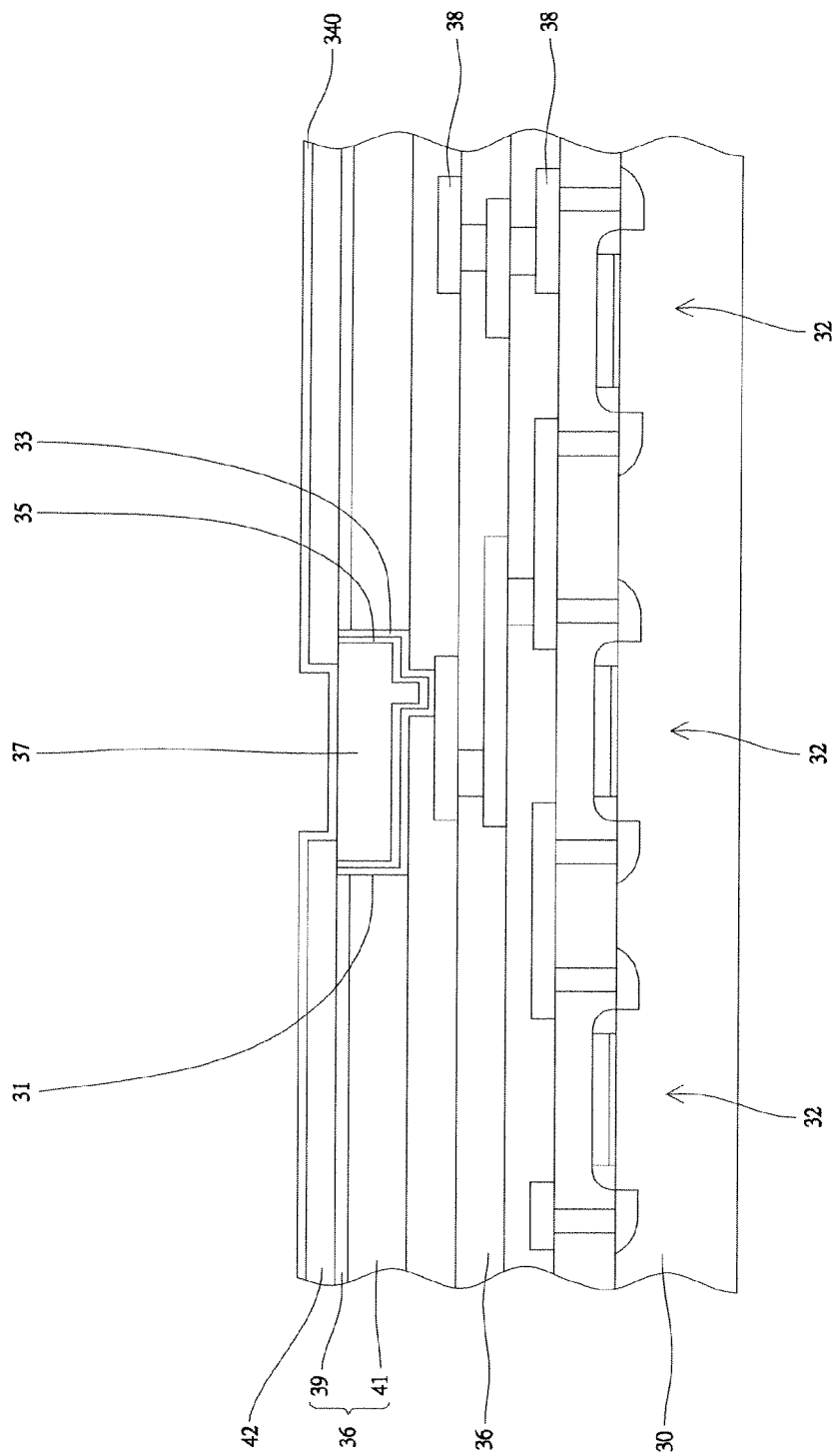

Referring to FIG. 2, an adhesion/barrier layer 340 is formed by sputtering, evaporating, electroless plating or electroplating a metal layer of titanium, tungsten, cobalt, nickel, titanium nitride, a titanium-tungsten alloy, chromium, copper, a chromium-copper alloy, tantalum, or tantalum nitride, with a thickness of between 1000 and 6000 angstroms, on the passivation layer 42 and on the copper pad 37.

Figure 3:
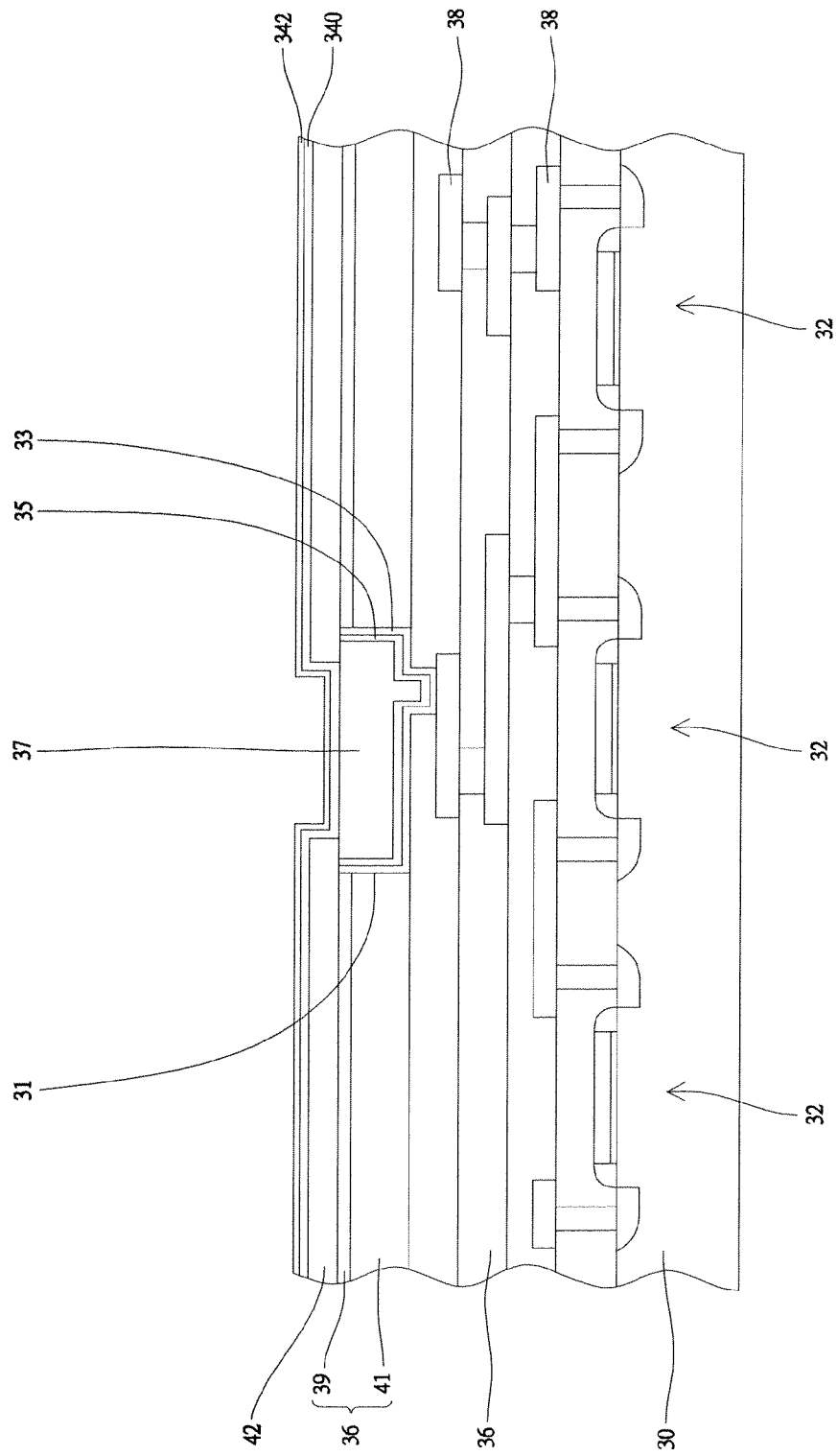

Next, referring to FIG. 3, a seed layer 342 may be formed by sputtering, evaporating, electroless plating or electroplating a metal layer of copper, with a thickness of between 500 and 3000 angstroms on the adhesion/barrier layer 340. If the adhesion/barrier layer 340 is copper, the step of forming the seed layer 342 of copper can be omitted.

Figure 4:
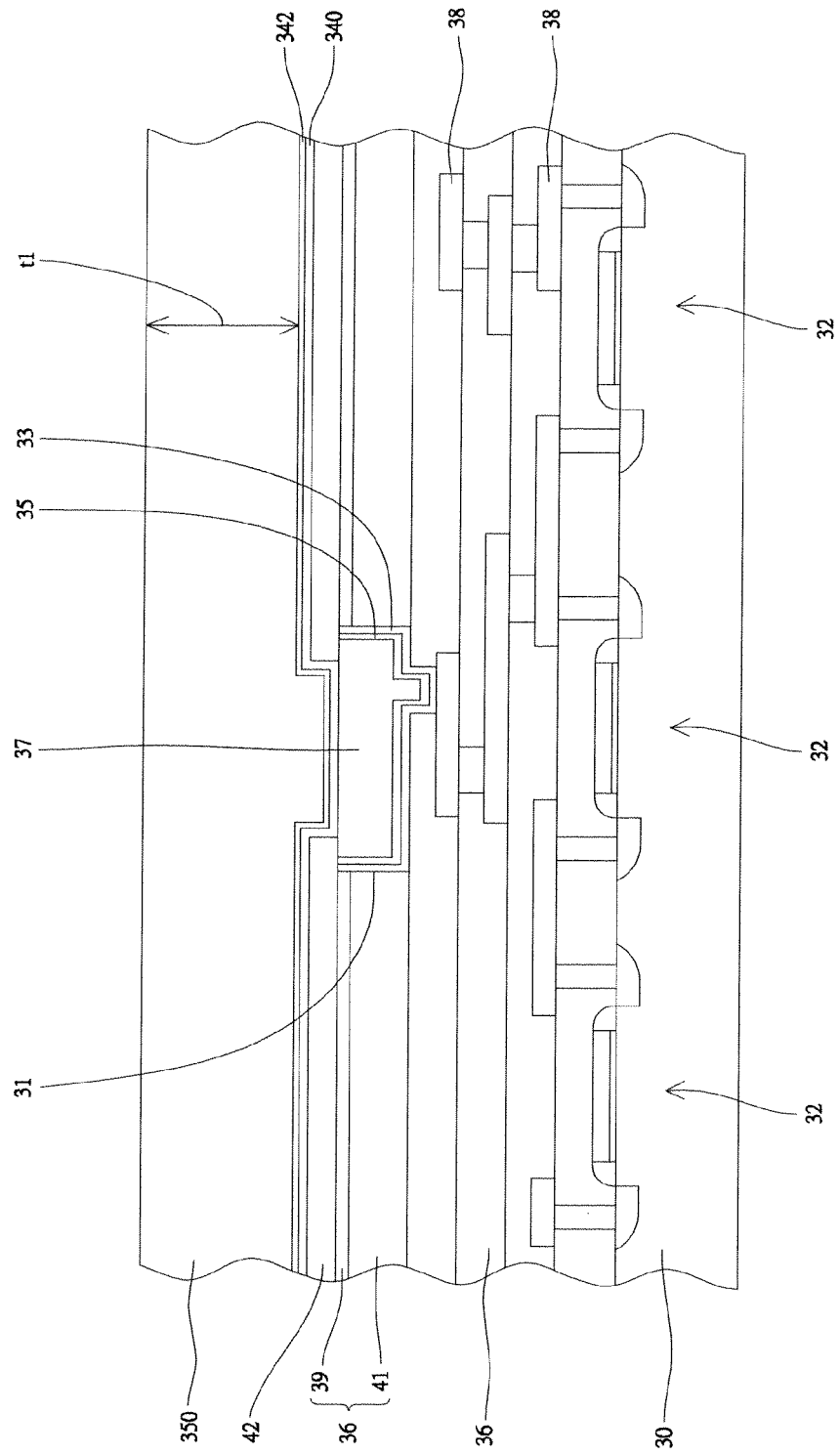

Next, referring to FIG. 4, a positive-type photoresist layer 350, such as napthoquinone diazide, photosensitive polyimide, photosensitive benzo-cyclo-butene (BCB), photosensitive parylene-based material, photosensitive epoxy-based material, with a thickness t1 of between 4 and 30 microns, is formed on the seed layer 342 using a spin coating process.

Figure 5:
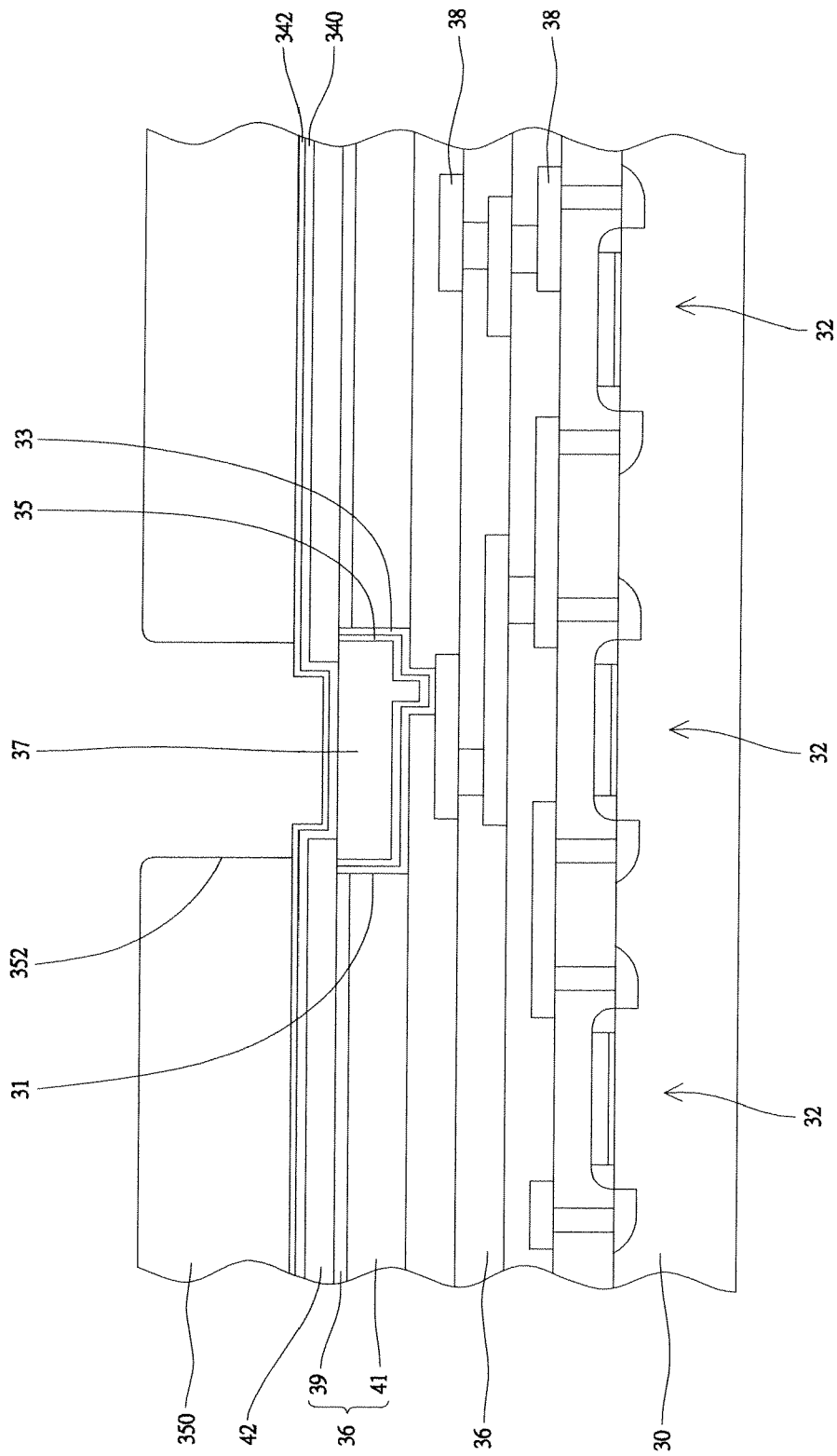

Next, referring to FIG. 5, a photolithography process including exposing and developing steps is used to pattern the photoresist layer 350 and to form an opening 352, with a bump pattern or pad pattern from a top view, in the photoresist layer 350 exposing the seed layer 342. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used.

Figure 6:
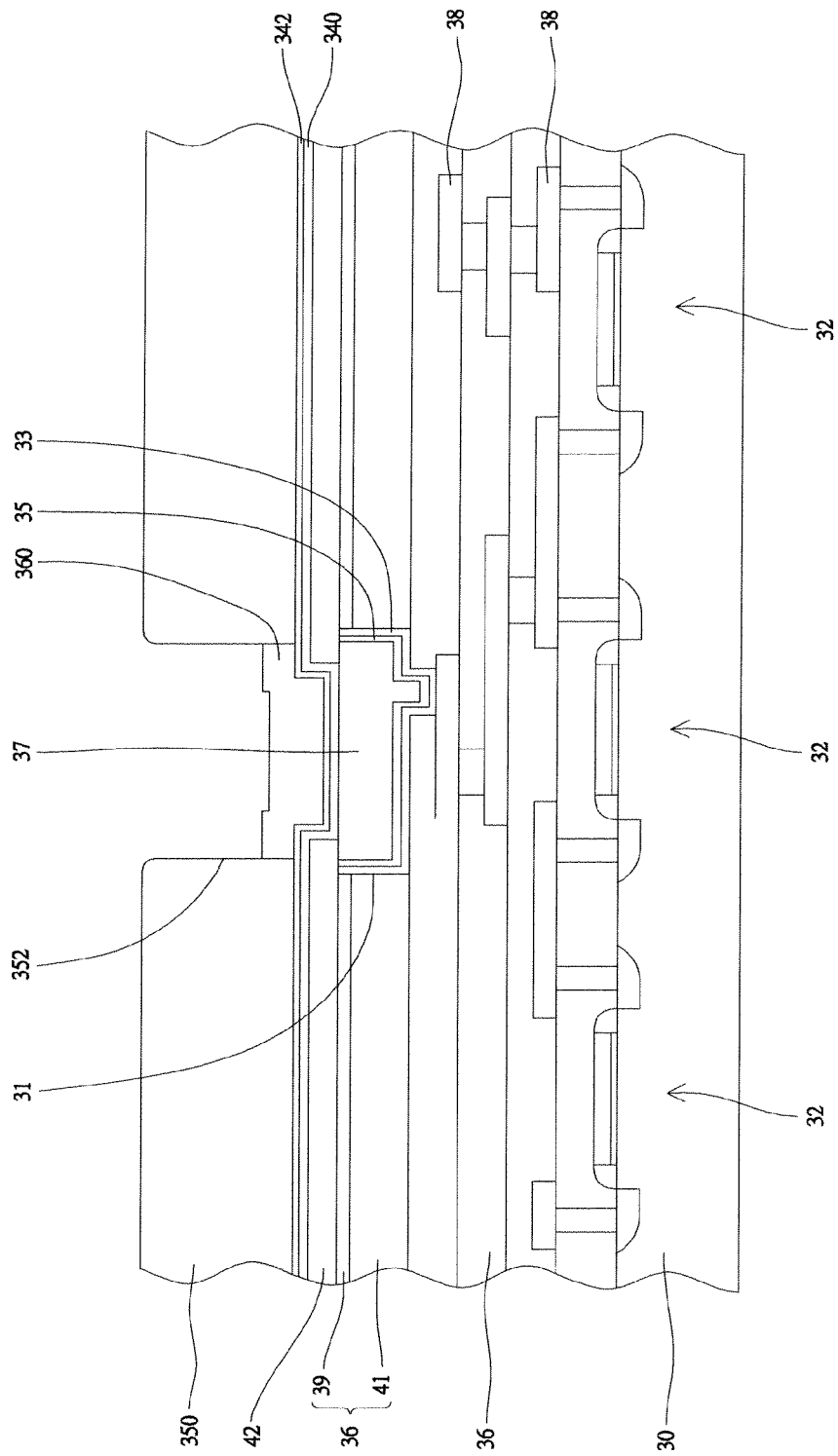

Next, referring to FIG. 6, a copper layer 360 having a thickness of between 0.1 and 10 microns is electroplated or electroless plated on the seed layer 342 exposed by the opening 352 in the photoresist layer 350.

Figure 7:
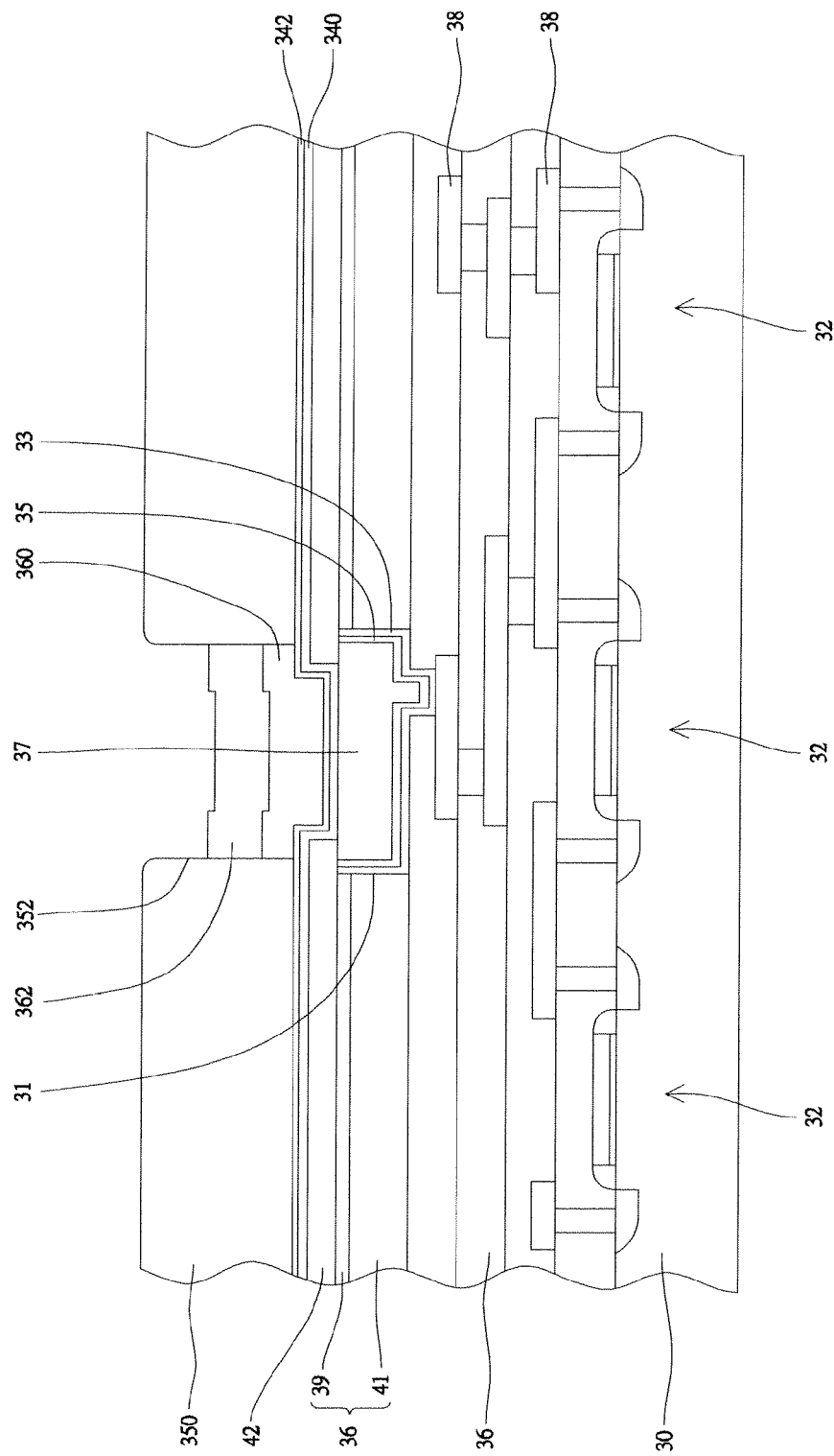

Next, referring to FIG. 7, a nickel layer 362 having a thickness of between 0.1 and 10 microns is electroplated or electroless plated on the copper layer 360 in the opening 352 in the photoresist layer 350.

Figure 8:
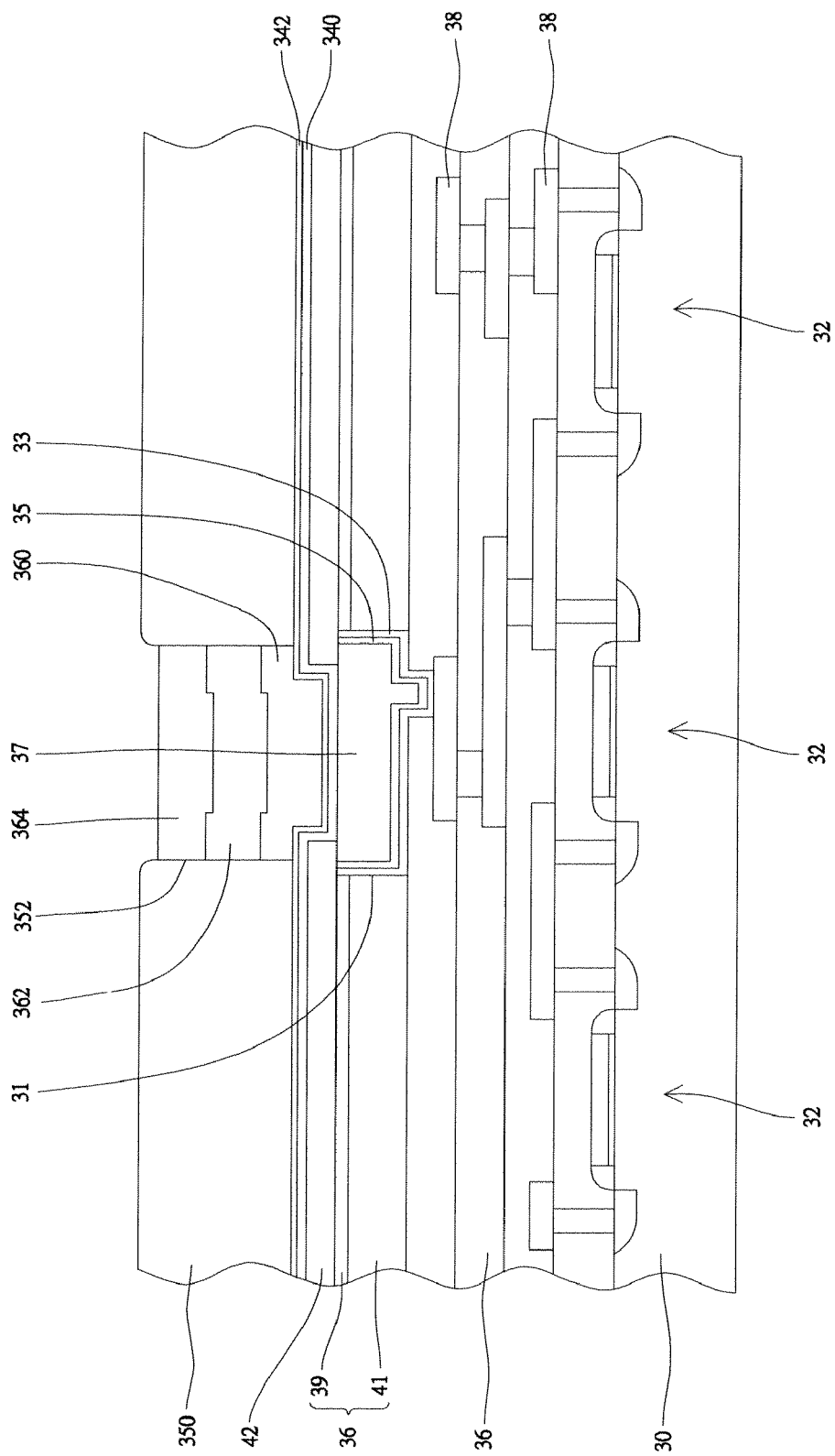

Next, referring to FIG. 8, a metal layer 364 of gold, copper, nickel, silver, palladium, platinum, rhodium, ruthenium, or rhenium, having a thickness of between 0.1 and 30 microns, and preferably of between 1.6 and 20 microns or of between 2 and 30 microns, is electroplated or electroless plated on the nickel layer 362 in the opening 352 in the photoresist layer 350. Alternatively, the metal layer 364 can be deposited by electroplating or electroless plating a tin-containing layer, such as tin-lead alloy or tin-silver alloy, having a thickness of between 10 and 500 microns on the nickel layer 362 in the opening 352 in the photoresist layer 350.

Figure 9:
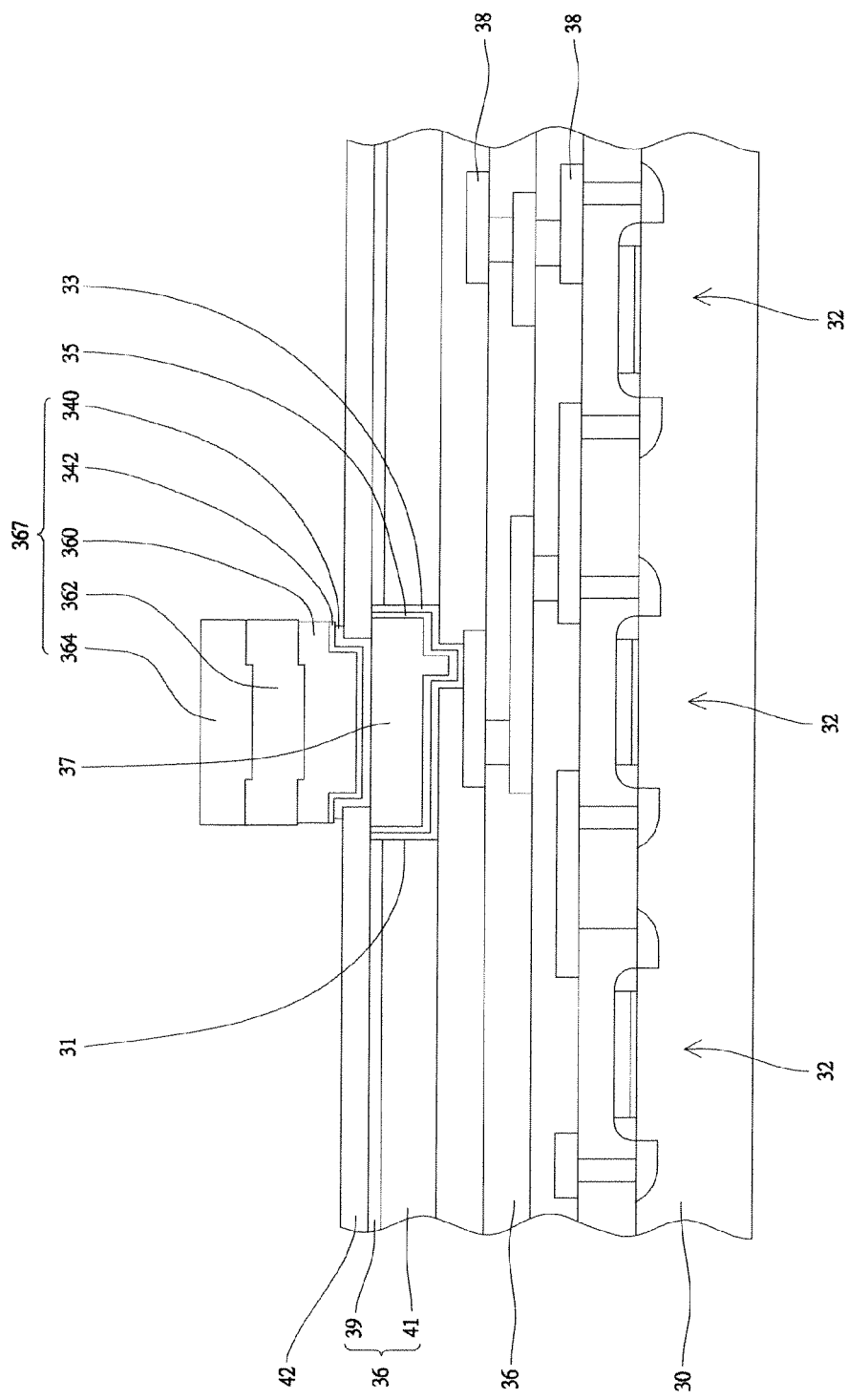

Next, referring to FIG. 9, the photoresist layer 350 is stripped. Next, the seed layer 342 not under the copper layer 360 is removed using a dry etching process or a wet etching process. Thereafter, the adhesion/barrier layer 340 not under the copper layer 360 is removed using a dry etching process or a wet etching process. If the adhesion/barrier layer 340 is a titanium tungsten alloy and removed by a wet etching process, the etchant for etching the adhesion/barrier layer 340 is hydrogen peroxide or hydrofluoric acid. If the adhesion/barrier layer 340 is titanium and removed by a wet etching process, the etchant for etching the adhesion/barrier layer 340 is hydrofluoric acid. Thereafter, a cutting process can be used to divide the semiconductor wafer having the above-mentioned metal pad or metal bump 367 formed thereover into multiple semiconductor chips. Thereafter, the semiconductor chips can be used for a packaging process, such as tape-automated-bonding (TAB) process, chip-on-glass (COG) process or chip-on-film (COF) process, as mentioned below.

Figure 10:
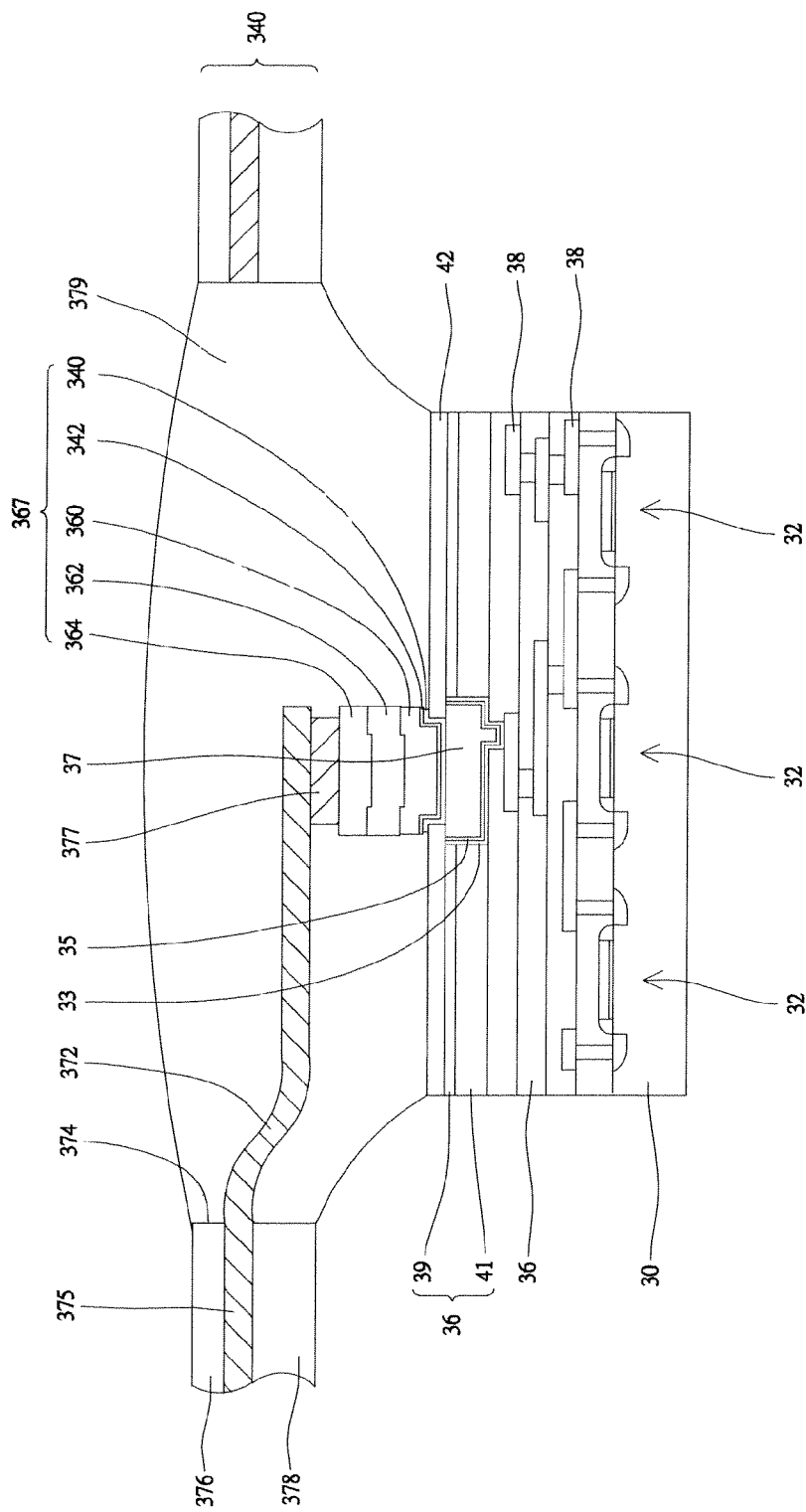

When the metallization structure formed for the metal layers 340, 342, 360, 362 and 364 is used as a metal bump 367, the metal bump 367 can be used to be TAB bonded thereto, as shown in FIG. 10. Referring to FIG. 10, a tape 370 is provided with multiple inner leads 372, such as copper, extending in an opening 374 in the tape 340 and multiple outer leads (not shown), such as copper, extending at the peripheral region of the tape 370, wherein the inner leads 372 are connected to the outer leads through multiple metal trace 375 between the polymer layers 376 and 378, such as polyimide or benzo-cyclo-butene (BCB), each having a thickness of between 1 and 20 microns, of the tape 370. The metal bump 367 can be bonded on a tin-containing layer 377, such as a tin-lead alloy or a tin-silver alloy, which is formed on the inner leads 372 before the metal bump 367 is connected to the tin-containing layer 377 on the inner leads 372. The outer leads can be connected to an external circuitry component, such as a printed circuit board (PCB). After the metal bump 367 is connected to the tin-containing layer 377 on the inner leads 372, a polymer layer 379, such as polyimide or benzo-cyclo-butene (BCB), is filled into the opening 374 in the tape 340 and covers the metal bump 367 and the inner leads 372.

Figure 11:
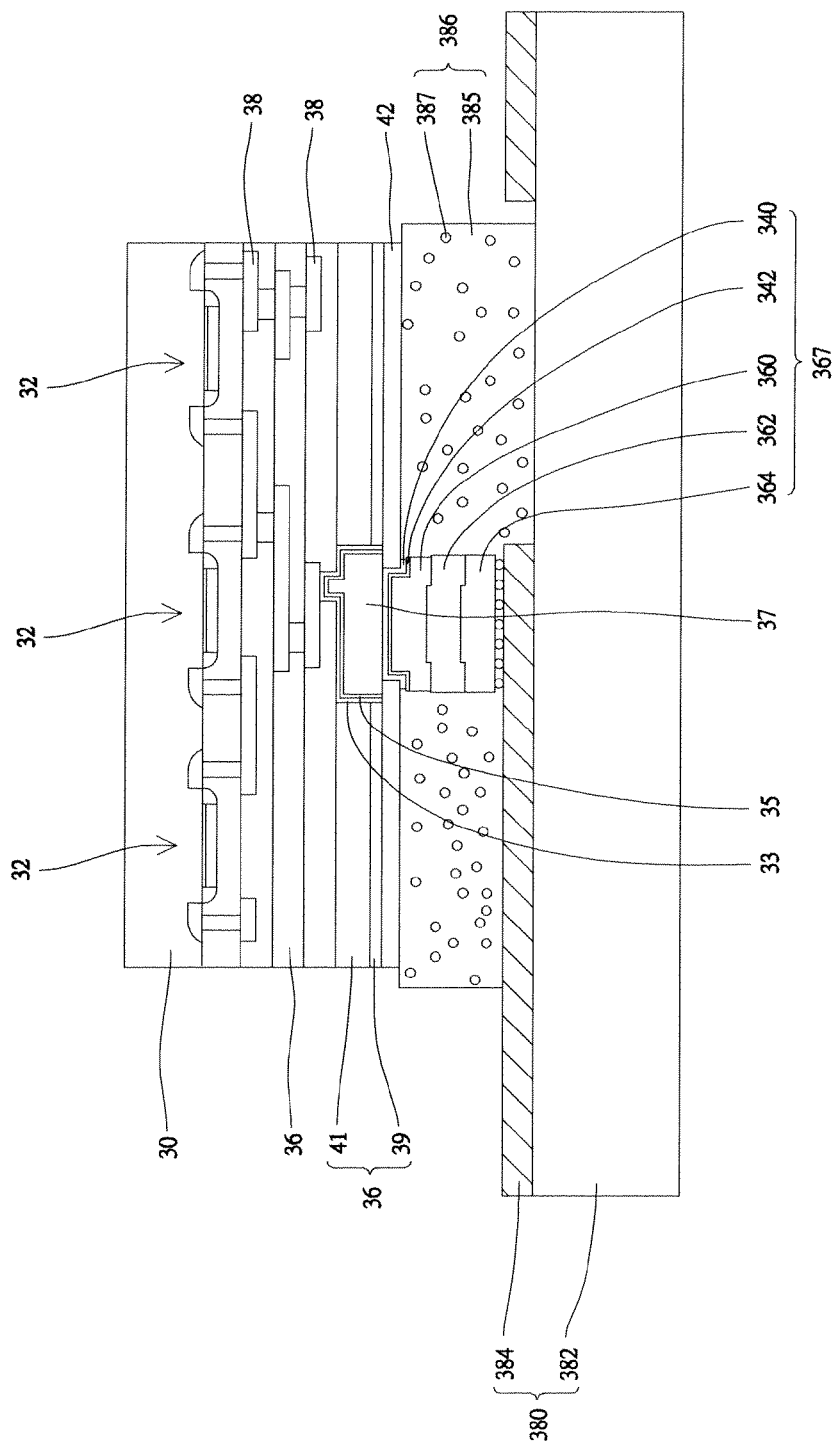

Alternatively, the metal bump 367 can be applied to a chip-on-glass (COG) package, as shown in FIG. 11. A circuitry component 380 is provided with a glass substrate 382 and a transparent conductive trace 384, such as indium-tin oxide, formed on the glass substrate 382. Before the metal bump 367 is connected to the circuitry component 380, an anisotropic conductive paste (ACP) or anisotropic conductive film (ACF) 386 having a polymer layer 385 and multiple metal particles 387 mixed with the polymer layer 385 is formed on the glass substrate 382 and the transparent conductive trace 384. Next, the metal bump 367 is pressed into the ACP or ACF 386 such that the bump 367 can be electrically connected to the transparent conductive trace 384 through the metal particles 387 in the ACP or ACF 386.

Figure 12:
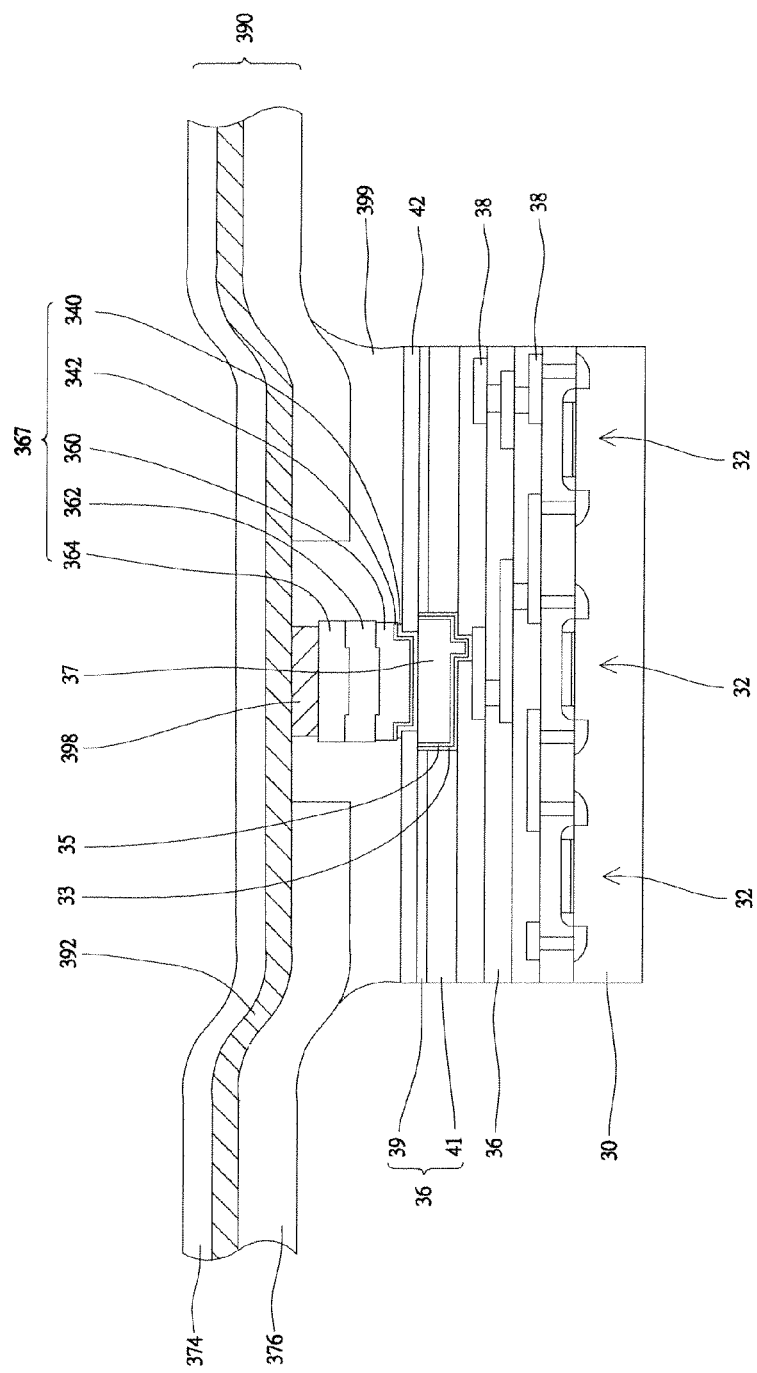

Alternatively, the metal bump 367 can be applied to a chip-on-film (COF) package, as shown in FIG. 12. A flexible circuit film 390 is provided with a metal trace 392, such as copper, and two polymer layers 394 and 396, such as polyimide or benzo-cyclo-butene (BCB), each having a thickness of between 1 and 20 microns. The metal trace 392 is between the polymer layers 394 and 396. The metal bump 367 can be bonded on a tin-containing layer 398, such as a tin-lead alloy or a tin-silver alloy, which is formed on the metal trace 392 before the metal bump 367 is connected to the tin-containing layer 398 on the metal trace 392. After the metal bump 367 is connected to the tin-containing layer 398 on the metal trace 392, a polymer layer 399, such as polyimide or benzo-cyclo-butene (BCB), is filled into the gap between the semiconductor chip and the flexible circuit film 390 and covers the metal bump 367.

Alternatively, the metal bump 367 formed on the copper pad 37 can be used to be bond onto a printed circuit board, ceramic substrate or other semiconductor wafer or chip.

Figure 13:
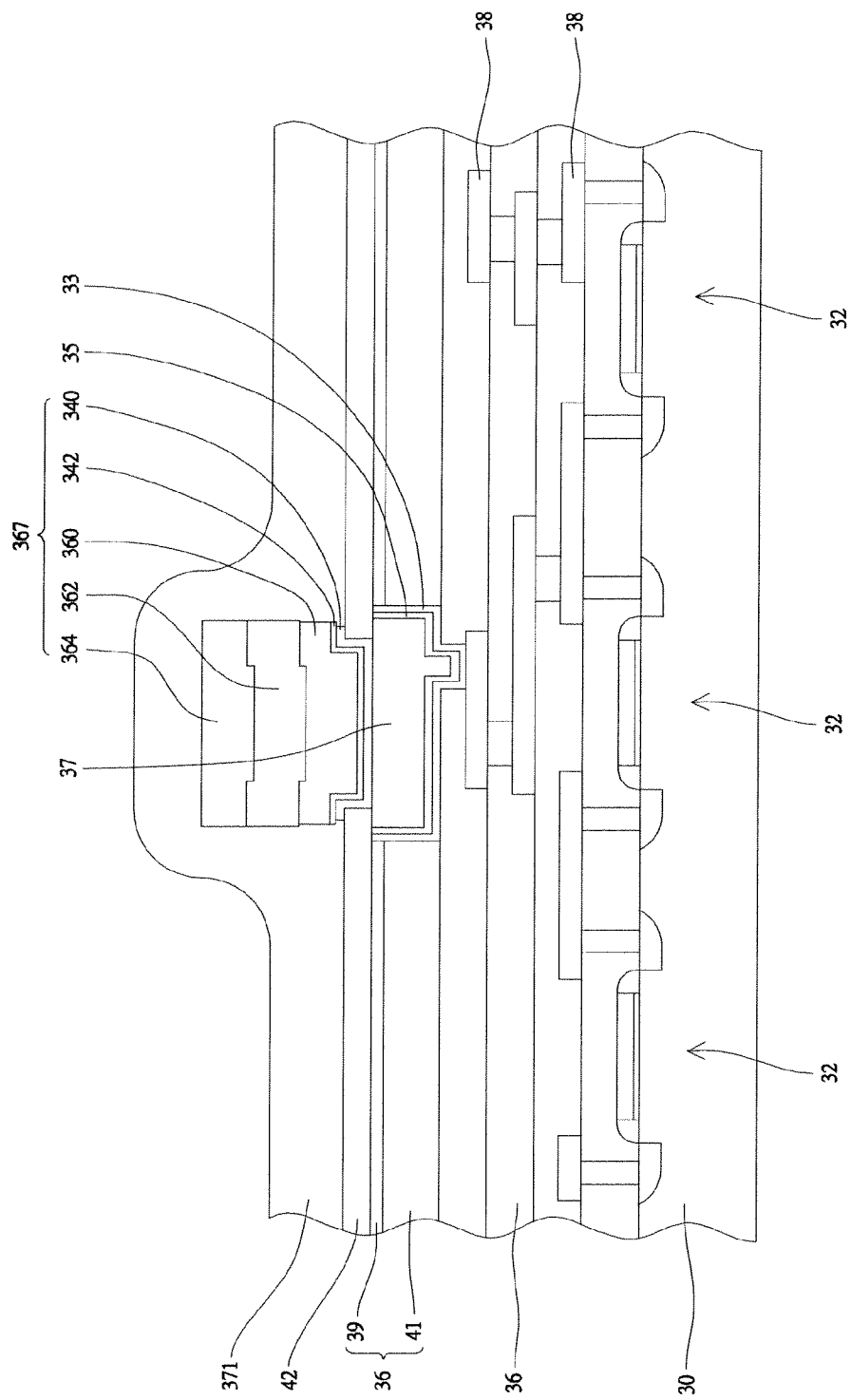
Figure 14:
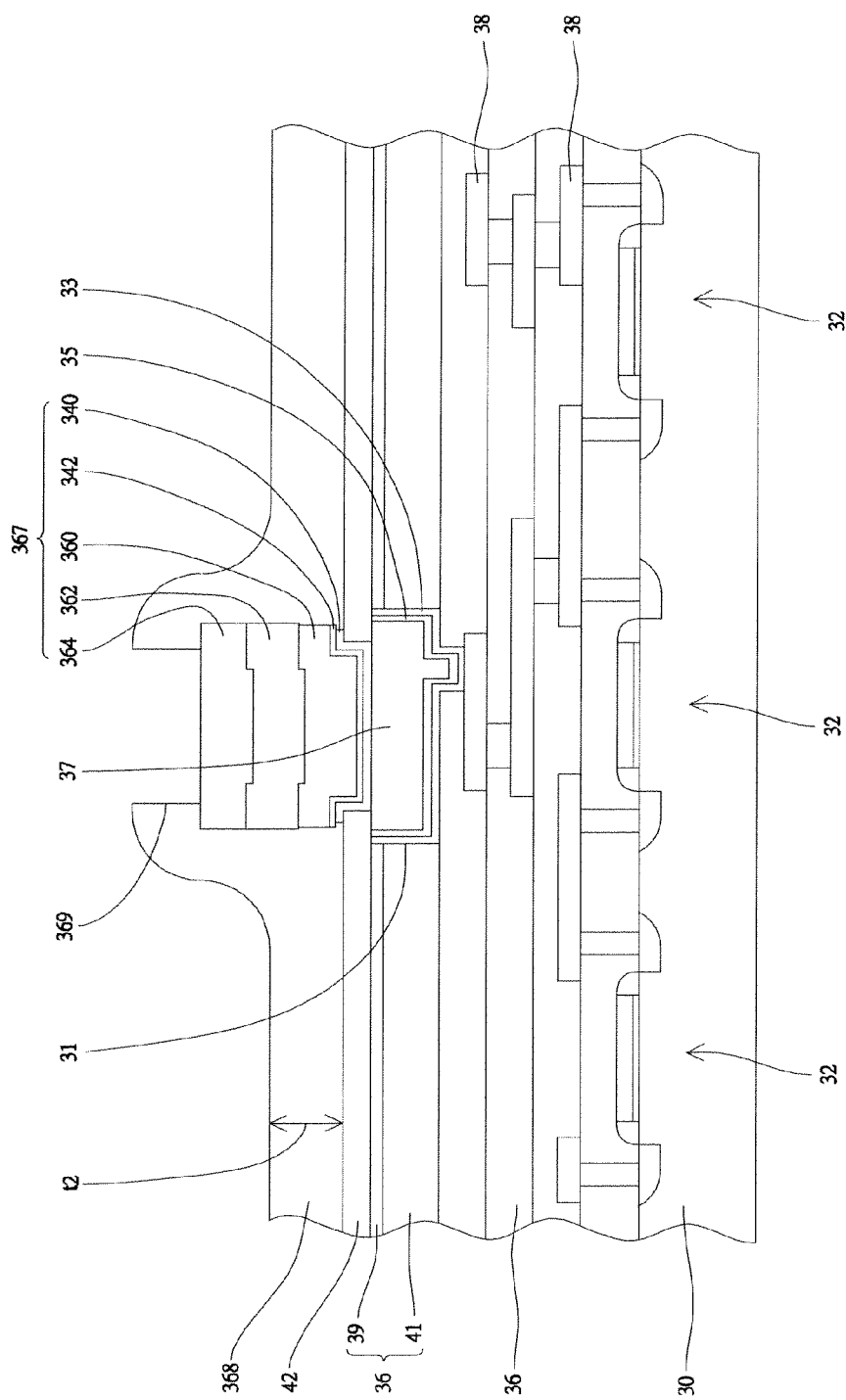

If the metallization structure formed for the metal layers 340, 342, 360, 362 and 364 is used as a metal pad 367, a patterned polymer layer 368 can be optionally formed on the passivation layer 42 and on the peripheral region of the metal pad 367, as shown in FIGS. 13 and 14.

Referring to FIGS. 13-14, it is an optional process to form the patterned polymer layer 368. The patterned polymer layer 368 can be formed by spin coating a polymer layer 371 of polyimide, benzo-cyclo-butene (BCB), parylene-based material, epoxy-based material, or elastomer, with a thickness of between 2 and 50 microns, and preferably between 8 and 30 microns, on the metal pads 367 and on the passivation layer 42.

Next, if the spin-coated polymer layer 371 is photosensitive, a photolithography process including exposing and developing steps can be used to form an opening 369 in the spin-coated polymer layer 371, shown as the patterned polymer layer 368, exposing the metal layer 367. Next, the patterned polymer layer 368 is cured at the temperature of 300 and 450 degrees centigrade if the patterned polymer layer 368 is polyimide. The patterned polymer layer 368 after being cured may have a thickness t2 of between 2 and 50 microns, and preferably between 6 and 20 microns.

If the spin-coated polymer layer 371 is non-photosensitive, photolithography and etching processes are typically needed to pattern the spin-coated polymer layer 371.

Alternatively, the patterned polymer layer 368 can be formed by screen printing a patterned polymer layer of polyimide, benzocyclobutene (BCB), parylene-based material or epoxy-based material, with a thickness of between 5 and 50 microns on the metal pads 367 and on the passivation layer 42, and then curing the screen-printed polymer layer at the temperature of 300 and 450 degrees centigrade if the screen-printed polymer layer is polyimide. Alternatively, the patterned polymer layer 368 can be formed by laminating a patterned dry film of polyimide, benzocyclobutene (BCB), parylene-based material or epoxy, with a thickness of between 10 and 500 microns on the metal pads 367 and on the passivation layer 42.

Figure 15:
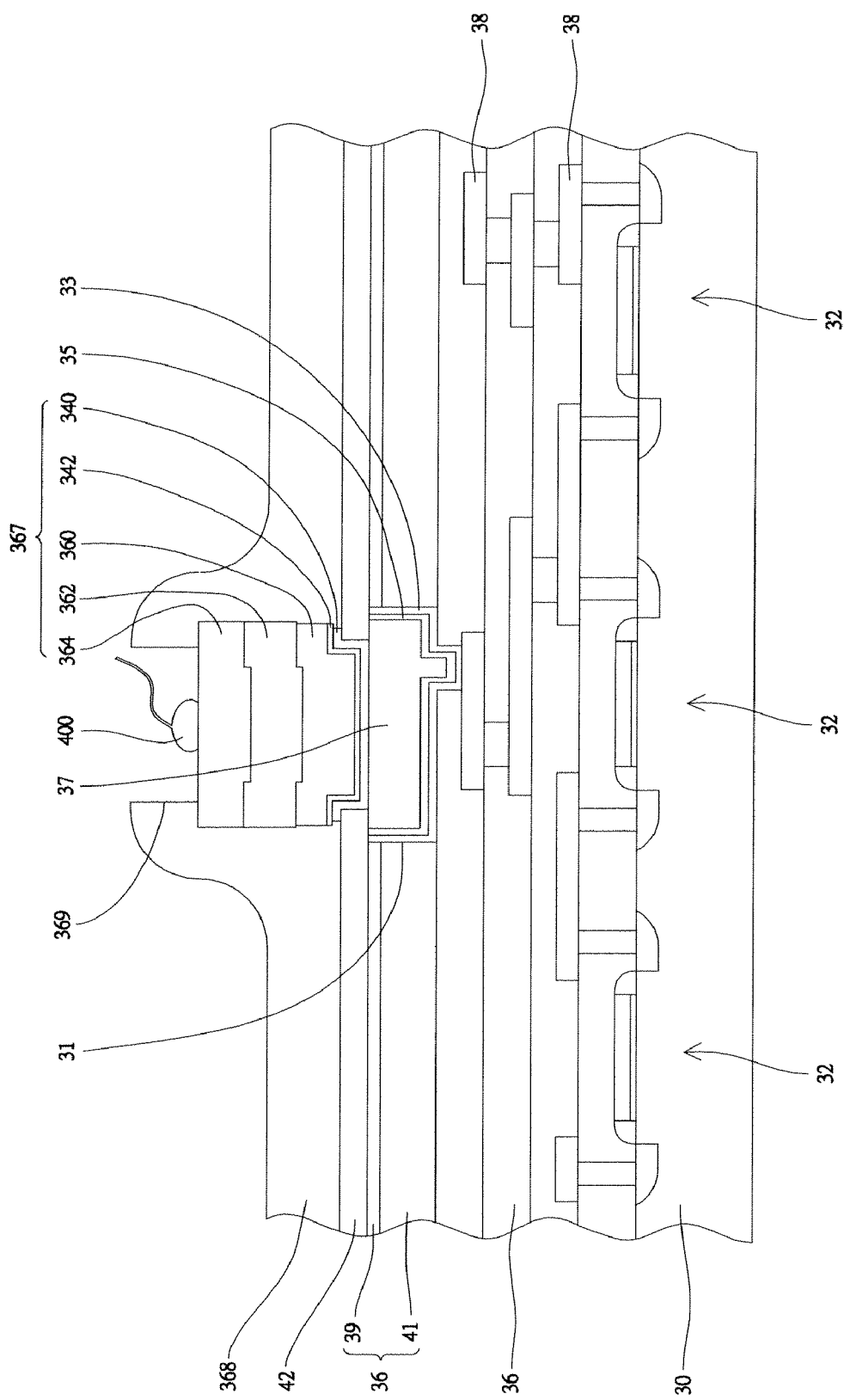

Next, referring to FIG. 15, the metal pad 367 can be used for being wirebonded thereto or having a gold bump or solder bump formed thereover. A gold wire 400 can be connected to the metal pad 367 exposed by the opening 369 in the polymer layer 368 using a wirebonding process. Alternatively, a gold bump or tin-containing bump, not shown, can be formed over the metal pad 367 exposed by the opening 369 in the polymer layer 368.

Alternatively, other kinds of metal bump or metal pad can be formed over the above-mentioned copper pad 37, as shown in FIGS. 16-24. The elements shown in FIGS. 16-24 having same reference numbers as those shown in FIGS. 1-15 indicate similar ones described above in FIGS. 1-15.

Figure 16:
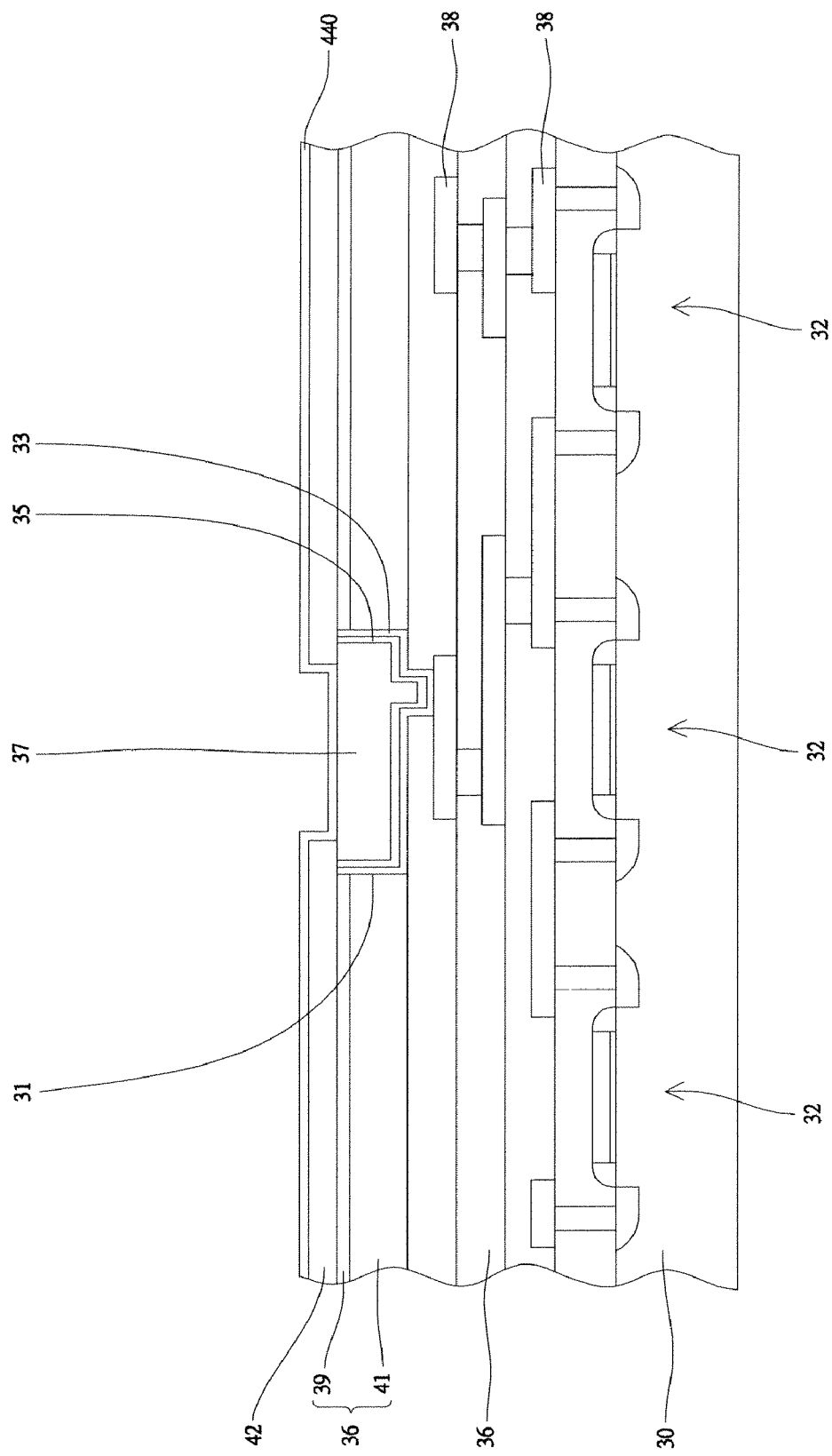
FIGS. 16-24 are cross-sectional views showing a process of forming a metal pad or metal bump over a copper pad according to a second embodiment.

Referring to FIG. 16, an adhesion/barrier layer 440 is formed by sputtering, evaporating, electroless plating or electroplating a metal layer of titanium, tungsten, cobalt, nickel, titanium nitride, a titanium-tungsten alloy, chromium, copper, a chromium-copper alloy, tantalum, or tantalum nitride, with a thickness of between 1000 and 6000 angstroms, on the passivation layer 42 and on the copper pad 37.

Figure 17:
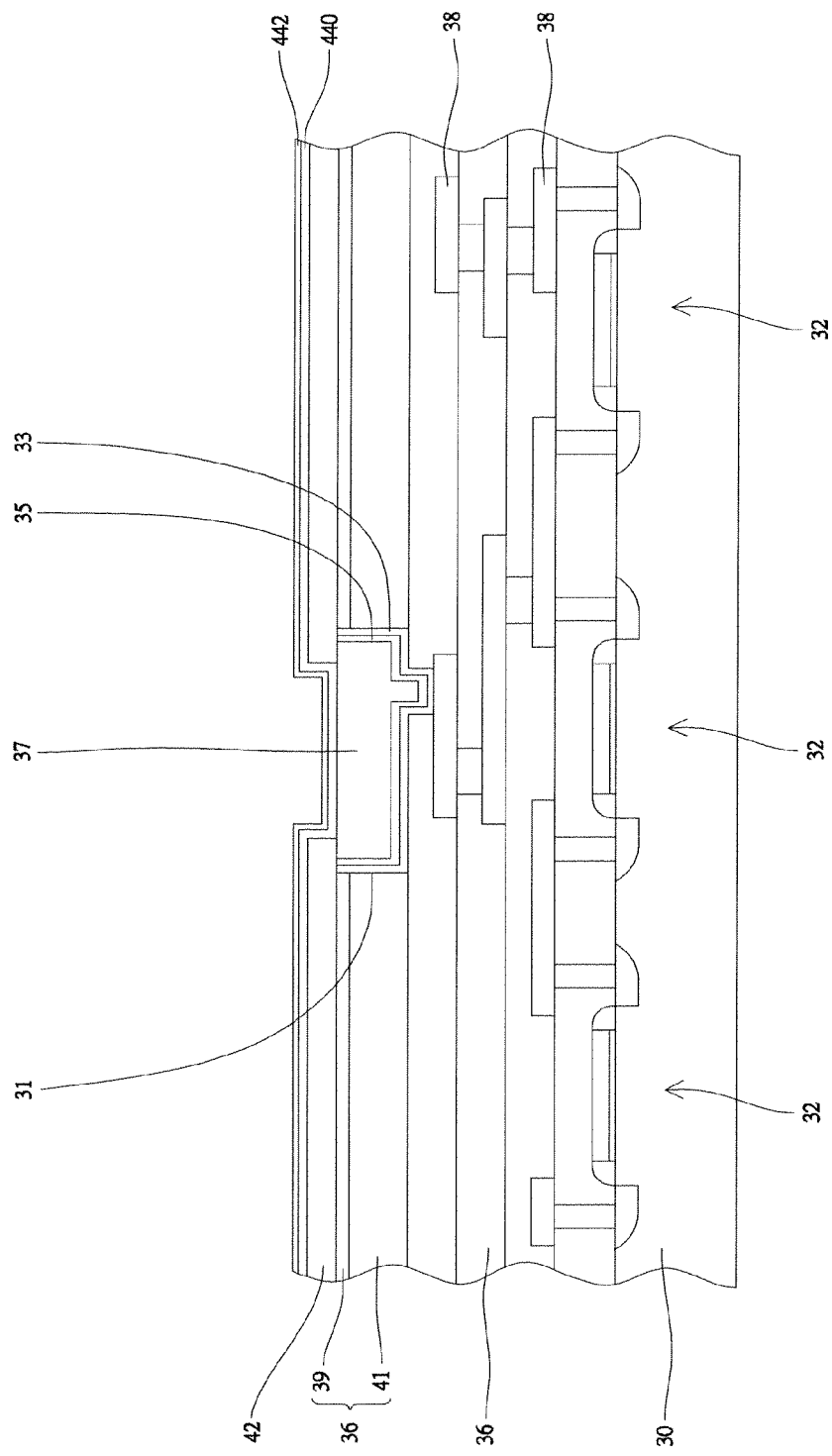

Next, referring to FIG. 17, a seed layer 442 may be formed by sputtering, evaporating, electroless plating or electroplating a metal layer of gold, copper, nickel, silver, palladium, platinum, rhodium, ruthenium, rhenium, tin-lead alloy or tin-silver alloy, with a thickness of between 500 and 3000 angstroms on the adhesion/barrier layer 440. If the adhesion/barrier layer 440 is copper, the step of forming the seed layer 342 of copper can be omitted.

Figure 18:
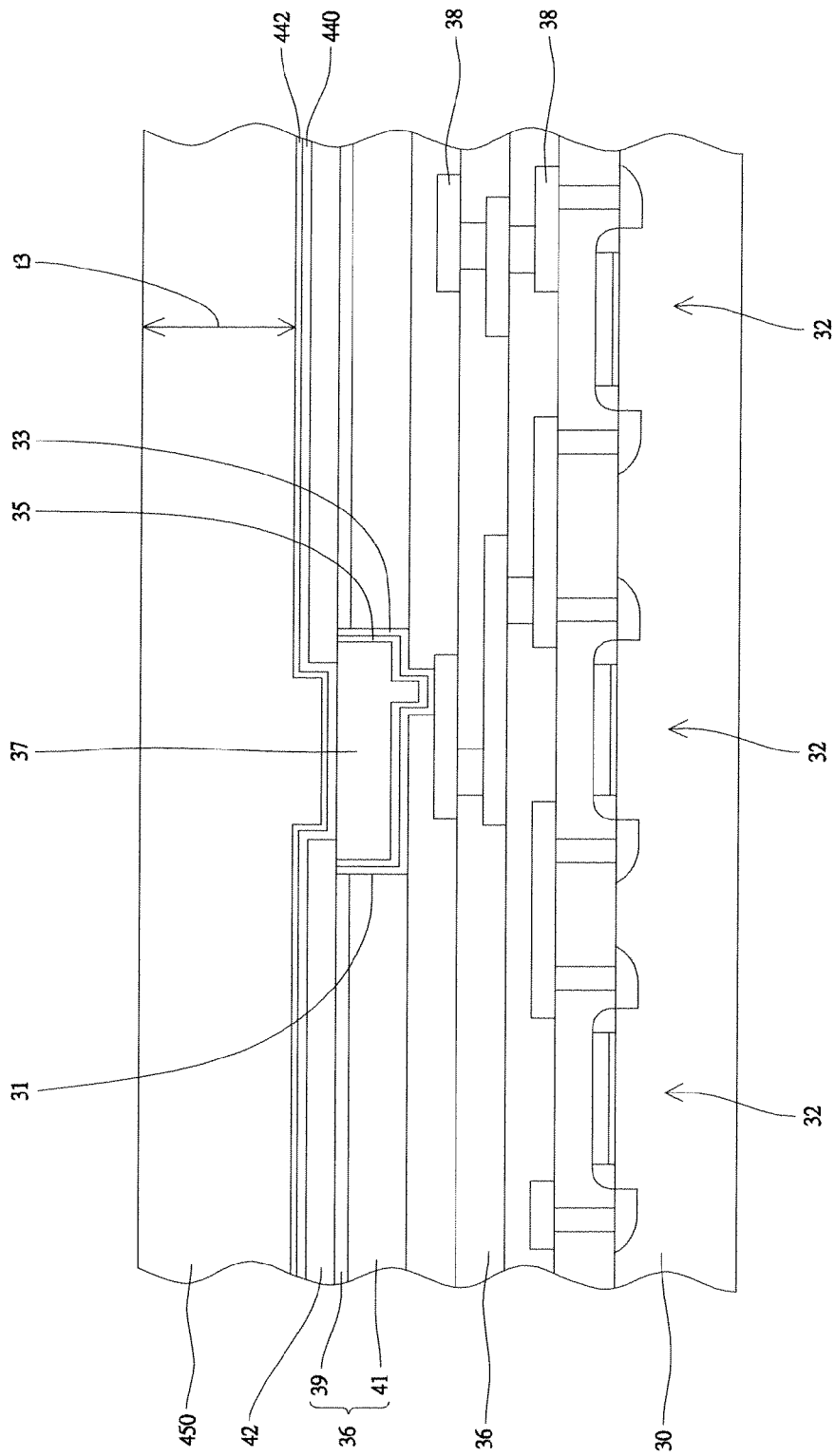

Next, referring to FIG. 18, a positive-type photoresist layer 450, such as napthoquinone diazide, photosensitive polyimide, photosensitive benzo-cyclo-butene (BCB), photosensitive parylene-based material, photosensitive epoxy-based material, with a thickness t3 of between 4 and 30 microns, is formed on the seed layer 442 using a spin coating process.

Figure 19:
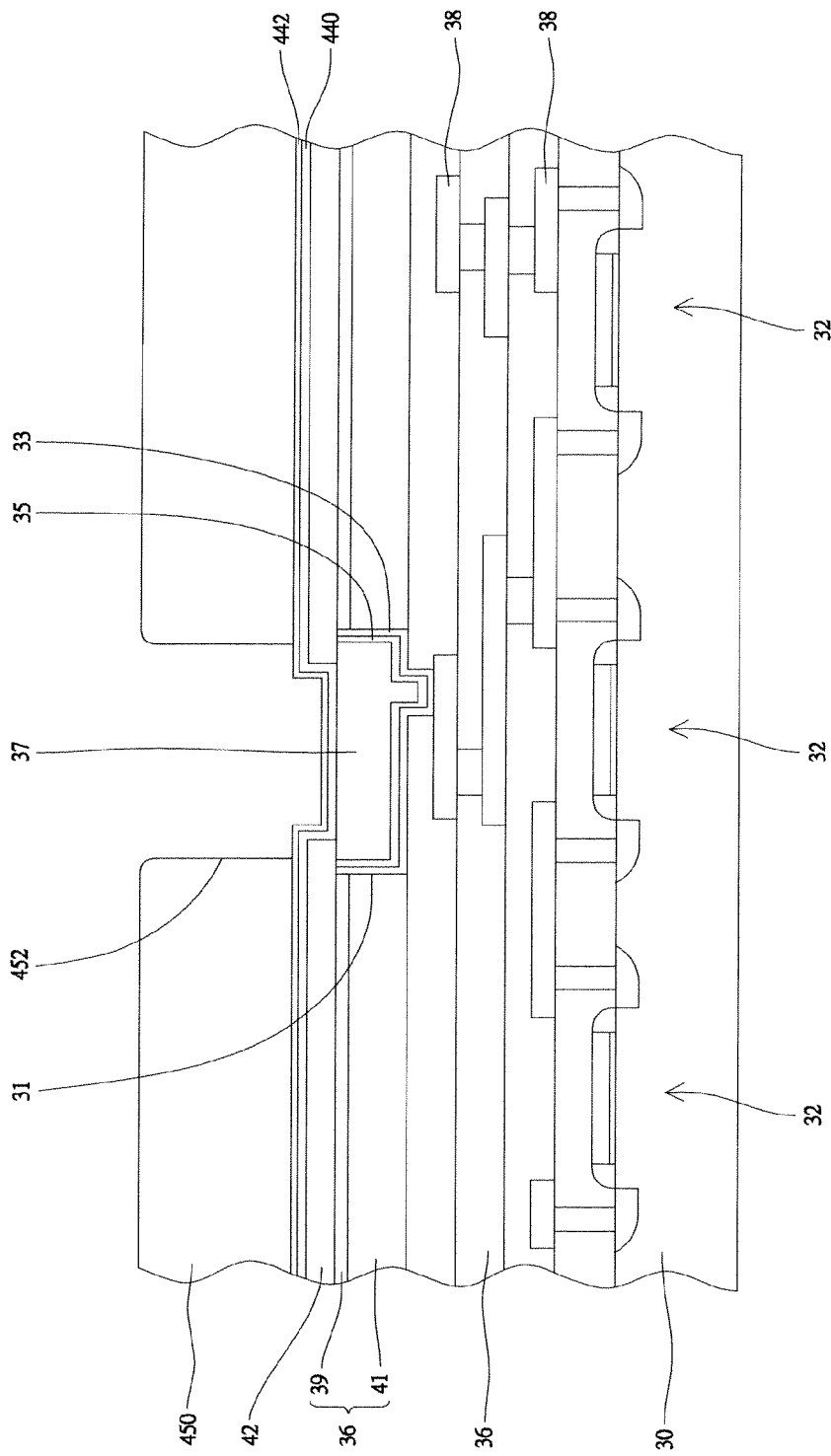

Next, referring to FIG. 19, a photolithography process including exposing and developing steps is used to pattern the photoresist layer 450 and to form an opening 452, with a bump pattern or pad pattern from a top view, in the photoresist layer 450 exposing the seed layer 342. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used.

Figure 20:
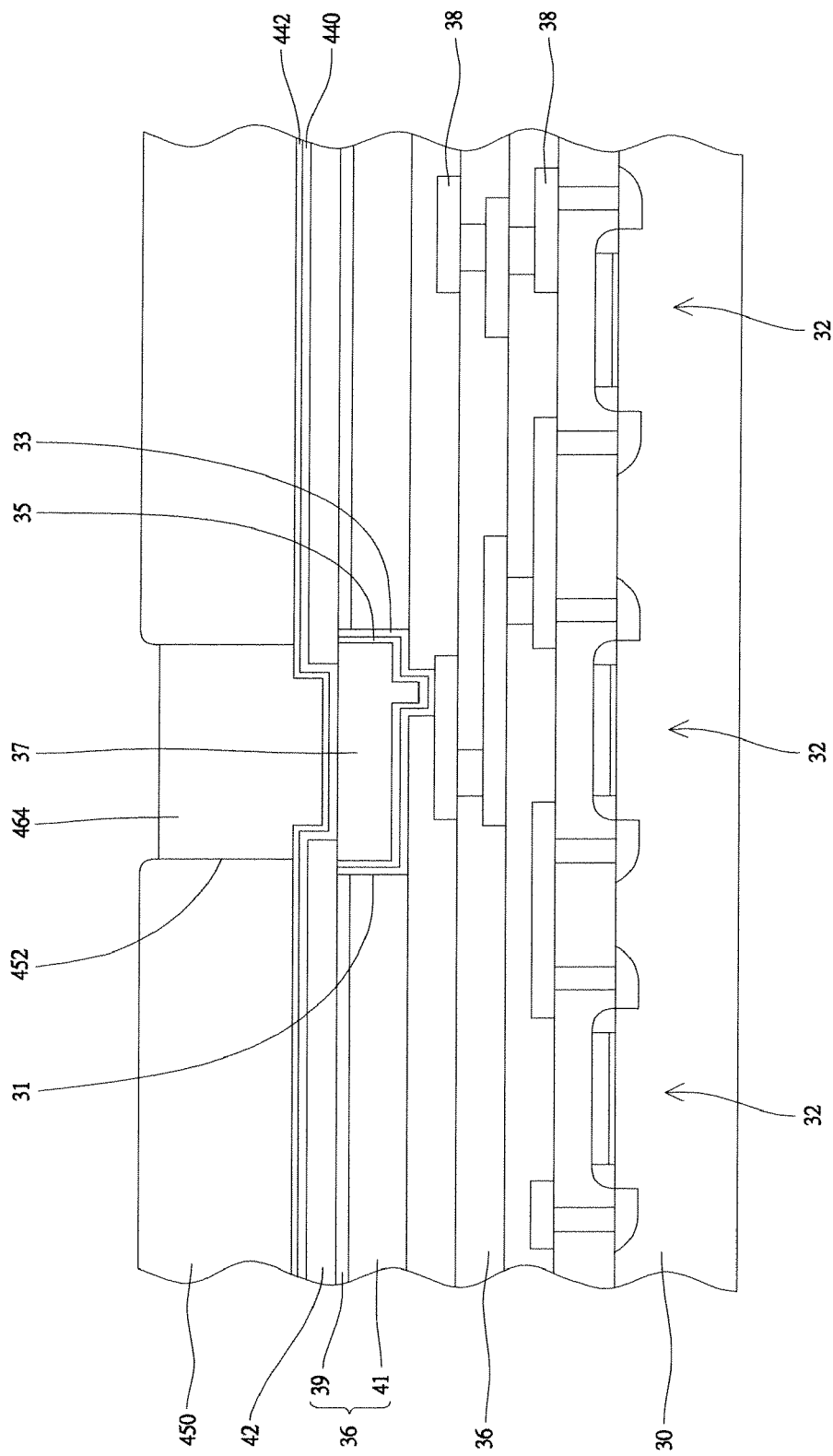

Next, referring to FIG. 20, a metal layer 464 of gold, copper, nickel, silver, palladium, platinum, rhodium, ruthenium, rhenium, tin-lead alloy or tin-silver alloy, having a thickness of between 0.1 and 30 microns, and preferably of between 1.6 and 20 microns or of between 2 and 30 microns, is electroplated or electroless plated on the seed layer 442 exposed by the opening 452 in the photoresist layer 450. The metal layer 464 can be deposited by electroplating a single layer of gold with a thickness of between 1 and 30 microns, and preferably between 3 and 20 microns, on the seed layer 442 preferably of gold exposed by the opening 452 in the photoresist layer 450. Alternatively, the metal layer 460 can be deposited by electroplating a single layer of copper with a thickness of between 1 and 30 microns, and preferably 3 and 20 microns, on the seed layer 442 preferably of copper exposed by the opening 452 in the photoresist layer 450. Alternatively, the metal layer 464 can be deposited by electroplating a single layer of silver with a thickness of between 1 and 30 microns, and preferably 3 and 20 microns, on the seed layer 342 preferably of silver exposed by the opening 452 in the photoresist layer 450. Alternatively, the metal layer 464 can be deposited by electroplating a single layer of nickel with a thickness of between 1 and 30 microns, and preferably 3 and 20 microns, on the seed layer 442 preferably of nickel exposed by the opening 452 in the photoresist layer 450. Alternatively, the metal layer 464 can be deposited by electroplating a single layer of palladium with a thickness of between 1 and 30 microns, and preferably 3 and 20 microns, on the seed layer 442 preferably of palladium exposed by the opening 452 in the photoresist layer 450. Alternatively, the metal layer 464 can be deposited by electroplating a single layer of platinum with a thickness of between 1 and 30 microns, and preferably 3 and 20 microns, on the seed layer 442 preferably of platinum exposed by the opening 452 in the photoresist layer 450. Alternatively, the metal layer 464 can be deposited by electroplating a single layer of rhodium with a thickness of between 1 and 30 microns, and preferably 3 and 20 microns, on the seed layer 442 preferably of rhodium exposed by the opening 452 in the photoresist layer 450. Alternatively, the metal layer 464 can be deposited by electroplating a single layer of ruthenium with a thickness of between 1 and 30 microns, and preferably 3 and 20 microns, on the seed layer 442 preferably of ruthenium exposed by the opening 452 in the photoresist layer 450. Alternatively, the metal layer 464 can be deposited by electroplating a single layer of rhenium with a thickness of between 1 and 30 microns, and preferably 3 and 20 microns, on the seed layer 442 preferably of rhenium exposed by the opening 452 in the photoresist layer 450. Alternatively, the metal layer 464 can be deposited by electroplating a single layer of a tin-lead alloy with a thickness of between 10 and 500 microns, and preferably 30 and 150 microns, on the seed layer 442 preferably of nickel or tin-lead alloy exposed by the opening 452 in the photoresist layer 450. Alternatively, the metal layer 464 can be deposited by electroplating a single layer of a tin-silver alloy with a thickness of between 10 and 500 microns, and preferably 30 and 150 microns, on the seed layer 442 preferably of nickel or tin-silver alloy exposed by the opening 452 in the photoresist layer 450.

Figure 21:
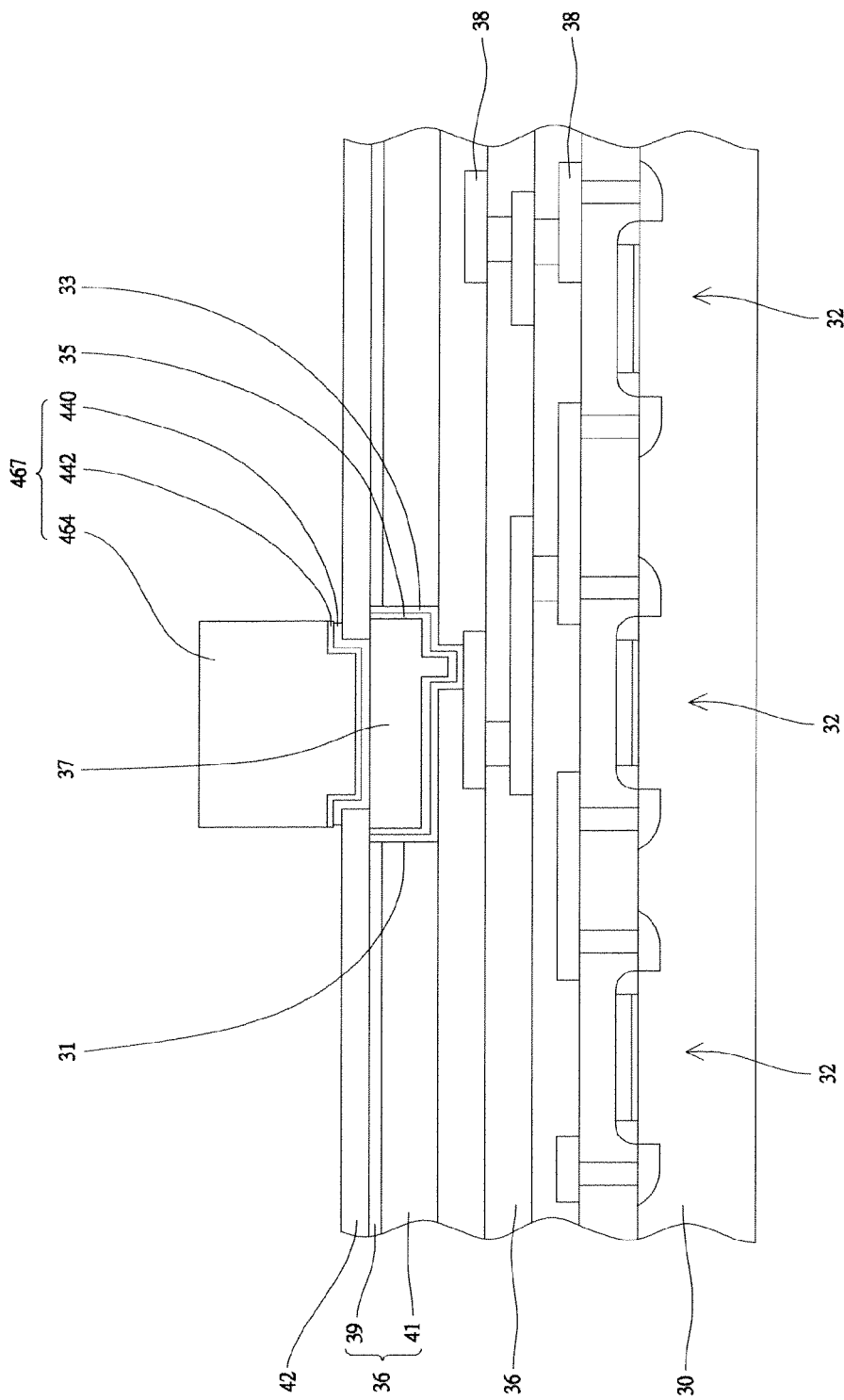

Next, referring to FIG. 21, the photoresist layer 450 is stripped. Next, the seed layer 442 not under the metal layer 464 is removed using a dry etching process or a wet etching process. If the seed layer 442 is gold and removed by a wet etching process, the etchant for etching the seed layer 442 is potassium iodide. Thereafter, the adhesion/barrier layer 440 not under the metal layer 460 is removed using a dry etching process or a wet etching process. If the adhesion/barrier layer 440 is a titanium tungsten alloy and removed by a wet etching process, the etchant for etching the adhesion/barrier layer 440 is hydrogen peroxide or hydrofluoric acid. If the adhesion/barrier layer 440 is titanium and removed by a wet etching process, the etchant for etching the adhesion/barrier layer 440 is hydrofluoric acid. Thereafter, a cutting process can be used to divide the semiconductor wafer having the above-mentioned metal pad or metal bump 467 formed thereover into multiple semiconductor chips. Thereafter, the semiconductor chips can be used for a packaging process, such as tape-automated-bonding (TAB) process, chip-on-glass (COG) process or chip-on-film (COF) process, as mentioned below.

When the metallization structure formed for the metal layers 440, 442, and 464 is used as a metal bump 467, the metal bump 467 can be used to be TAB bonded thereto, as shown in FIGS. 10 and 21. The metal bump 467 can be bonded on the tin-containing layer 377, such as a tin-lead alloy or a tin-silver alloy, which is formed on the inner leads 372 before the metal bump 467 is connected to the tin-containing layer 377 on the inner leads 372. After the metal bump 467 is connected to the tin-containing layer 377 on the inner leads 372, a polymer layer 379, such as polyimide or benzo-cyclo-butene (BCB), is filled into the opening 374 in the tape 340 and covers the metal bump 467 and the inner leads 372.

Alternatively, the metal bump 467 can be applied to a chip-on-glass (COG) package, as shown in FIGS. 11 and 21. Before the metal bump 467 is connected to the circuitry component 380, an anisotropic conductive paste (ACP) or anisotropic conductive film (ACF) 386 having a polymer layer 385 and multiple metal particles 387 mixed with the polymer layer 385 is formed on the glass substrate 382 and the transparent conductive trace 384. Next, the metal bump 467 is pressed into the ACP or ACF 386 such that the bump 467 can be electrically connected to the transparent conductive trace 384 through the metal particles 387 in the ACP or ACF 386.

Alternatively, the metal bump 467 can be applied to a chip-on-film (COF) package, as shown in FIGS. 12 and 21. The metal bump 467 can be bonded on a tin-containing layer 398, such as a tin-lead alloy or a tin-silver alloy, which is formed on the metal trace 392 before the metal bump 467 is connected to the tin-containing layer 398 on the metal trace 392. After the metal bump 467 is connected to the tin-containing layer 398 on the metal trace 392, a polymer layer 399, such as polyimide or benzo-cyclo-butene (BCB), is filled into the gap between the semiconductor chip and the flexible circuit film 390 and covers the metal bump 467.

Alternatively, the metal bump 367 formed on the copper pad 37 can be used to be bond onto a printed circuit board, ceramic substrate or other semiconductor wafer or chip.

Figure 22:
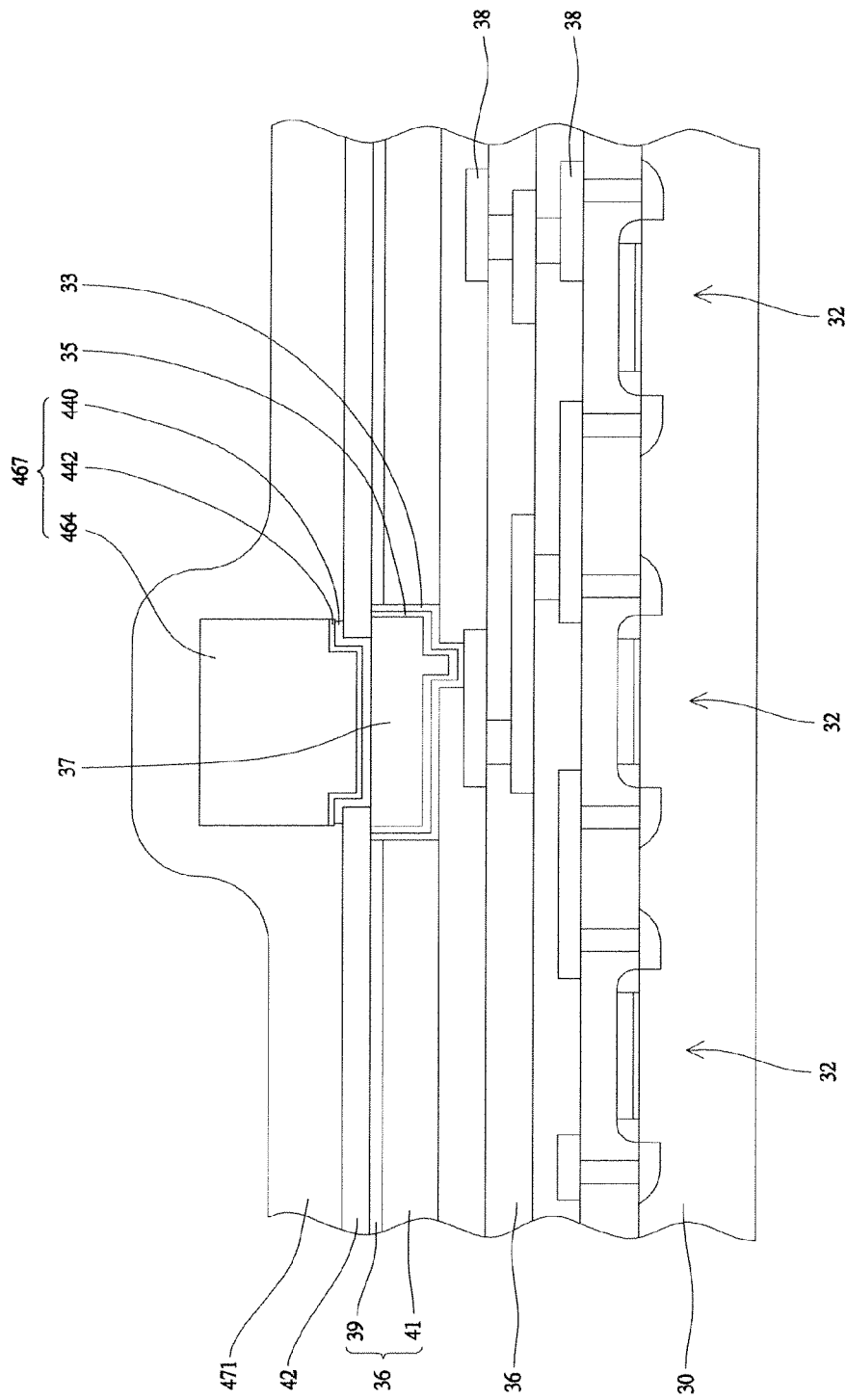
Figure 23:
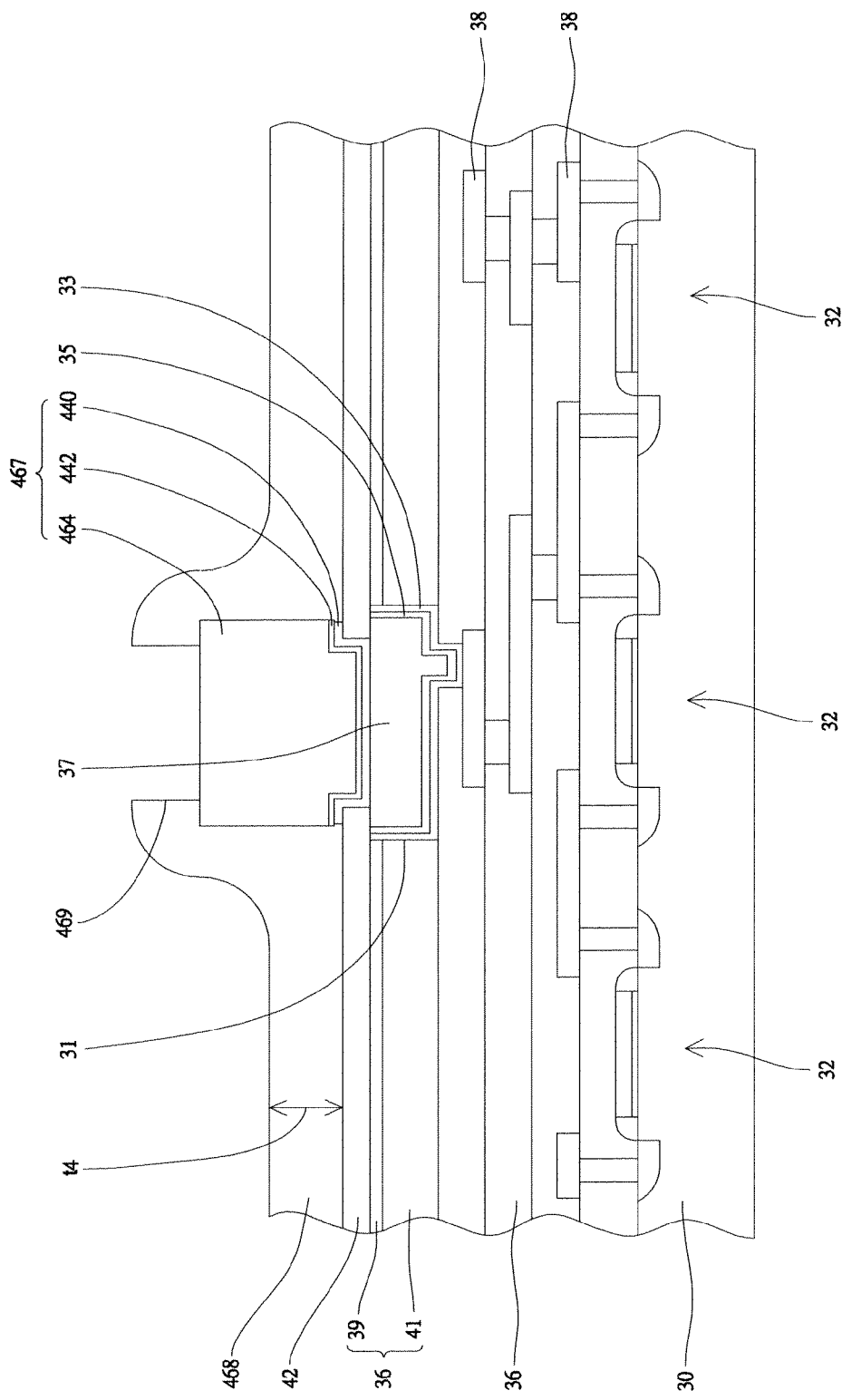

If the metallization structure formed for the metal layers 340, 342 and 364 is used as a metal pad 467, a patterned polymer layer 468 can be optionally formed on the passivation layer 42 and on the peripheral region of the metal pad 467, as shown in FIGS. 22 and 23.

Referring to FIGS. 22-23, it is an optional process to form the patterned polymer layer 468. The patterned polymer layer 468 can be formed by spin coating a polymer layer 471 of polyimide, benzo-cyclo-butene (BCB), parylene-based material, epoxy-based material, or elastomer, with a thickness of between 2 and 50 microns, and preferably between 8 and 30 microns, on the metal pads 467 and on the passivation layer 42.

Next, if the spin-coated polymer layer 471 is photosensitive, a photolithography process including exposing and developing steps can be used to form an opening 469 in the spin-coated polymer layer 471, shown as the patterned polymer layer 468, exposing the metal layer 467. Next, the patterned polymer layer 468 is cured at the temperature of 300 and 450 degrees centigrade if the patterned polymer layer 468 is polyimide. The patterned polymer layer 468 after being cured may have a thickness t4 of between 2 and 50 microns, and preferably between 6 and 20 microns.

If the spin-coated polymer layer 471 is non-photosensitive, photolithography and etching processes are typically needed to pattern the spin-coated polymer layer 371.

Alternatively, the patterned polymer layer 468 can be formed by screen printing a patterned polymer layer of polyimide, benzocyclobutene (BCB), parylene-based material or epoxy-based material, with a thickness of between 5 and 50 microns on the metal pads 467 and on the passivation layer 42, and then curing the screen-printed polymer layer at the temperature of 300 and 450 degrees centigrade if the screen-printed polymer layer is polyimide. Alternatively, the patterned polymer layer 468 can be formed by laminating a patterned dry film of polyimide, benzocyclobutene (BCB), parylene-based material or epoxy, with a thickness of between 10 and 500 microns on the metal pads 467 and on the passivation layer 42.

Figure 24:
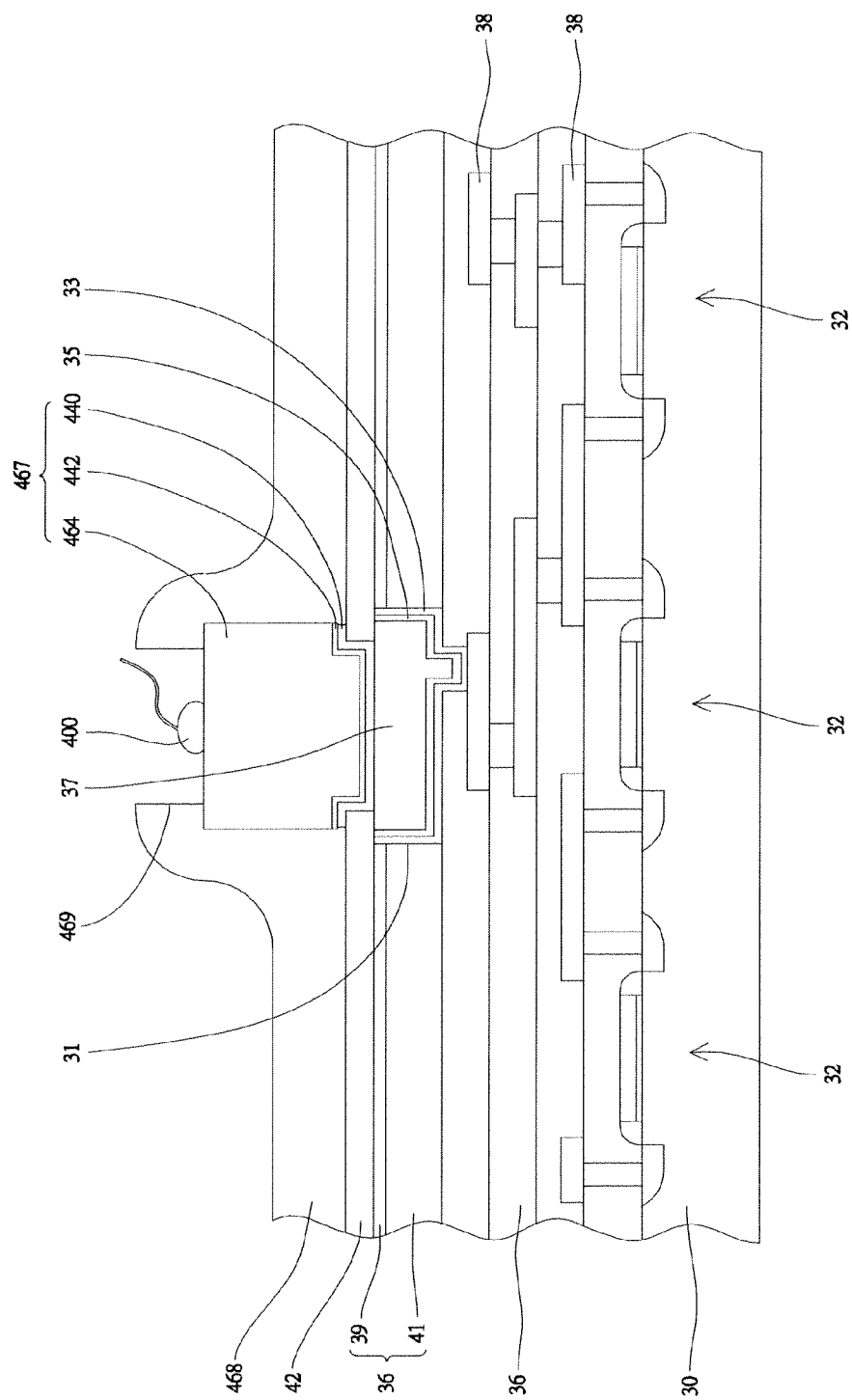

Next, referring to FIG. 24, the metal pad 467 can be used for being wirebonded thereto or having a gold bump or solder bump formed thereover. A gold wire 400 can be connected to the metal pad 467 exposed by the opening 469 in the polymer layer 468 using a wirebonding process. Alternatively, a gold bump or tin-containing bump, not shown, can be formed over the metal pad 467 exposed by the opening 369 in the polymer layer 468.

Alternatively, other kinds of metal bump or metal pad can be formed over the above-mentioned copper pad 37, as shown in FIGS. 25-34. The elements shown in FIGS. 25-34 having same reference numbers as those shown in FIGS. 1-15 indicate similar ones described above in FIGS. 1-15.

Figure 25:
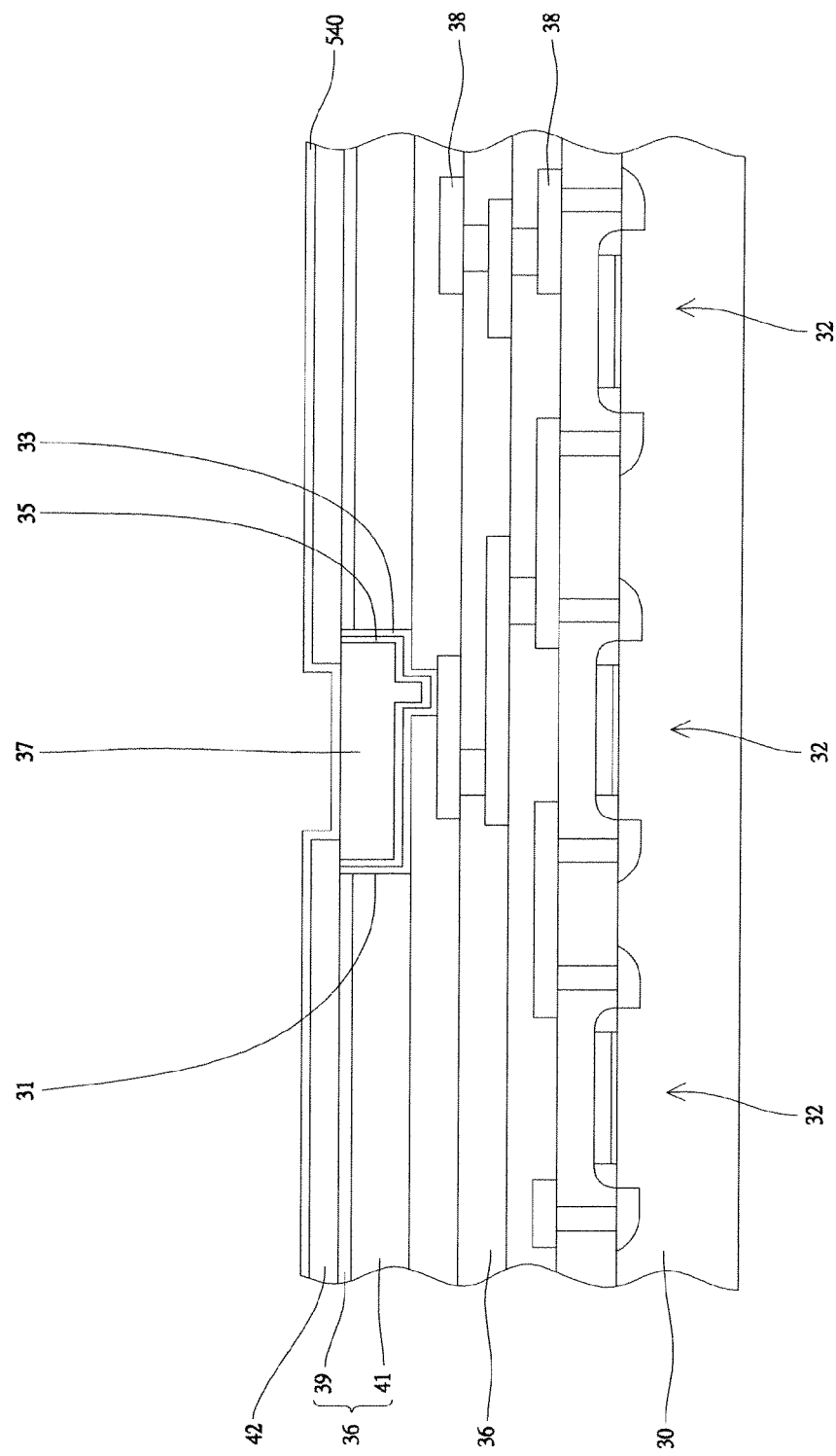
FIGS. 25-34 are cross-sectional views showing a process of forming a metal pad or metal bump over a copper pad according to a third embodiment.

Referring to FIG. 25, an adhesion/barrier layer 540 is formed by sputtering, evaporating, electroless plating or electroplating a metal layer of titanium, tungsten, cobalt, nickel, titanium nitride, a titanium-tungsten alloy, chromium, copper, a chromium-copper alloy, tantalum, or tantalum nitride, with a thickness of between 1000 and 6000 angstroms, on the passivation layer 42 and on the copper pad 37.

Figure 26:
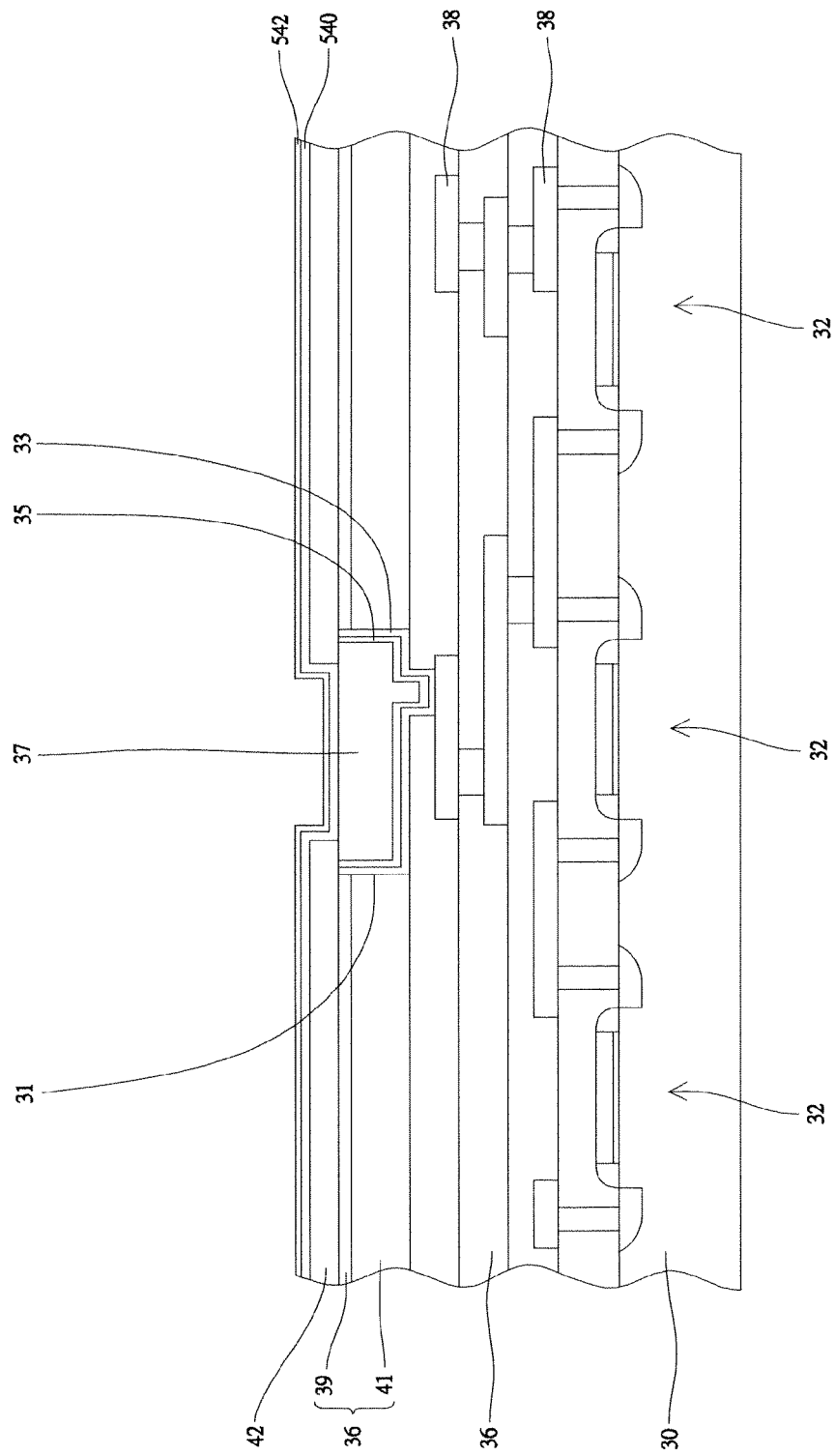

Next, referring to FIG. 26, a seed layer 542 may be formed by sputtering, evaporating, electroless plating or electroplating a metal layer of nickel, copper or gold, with a thickness of between 500 and 3000 angstroms on the adhesion/barrier layer 540. If the adhesion/barrier layer 540 is nickel, the step of forming the seed layer 542 of nickel can be omitted.

Figure 27:
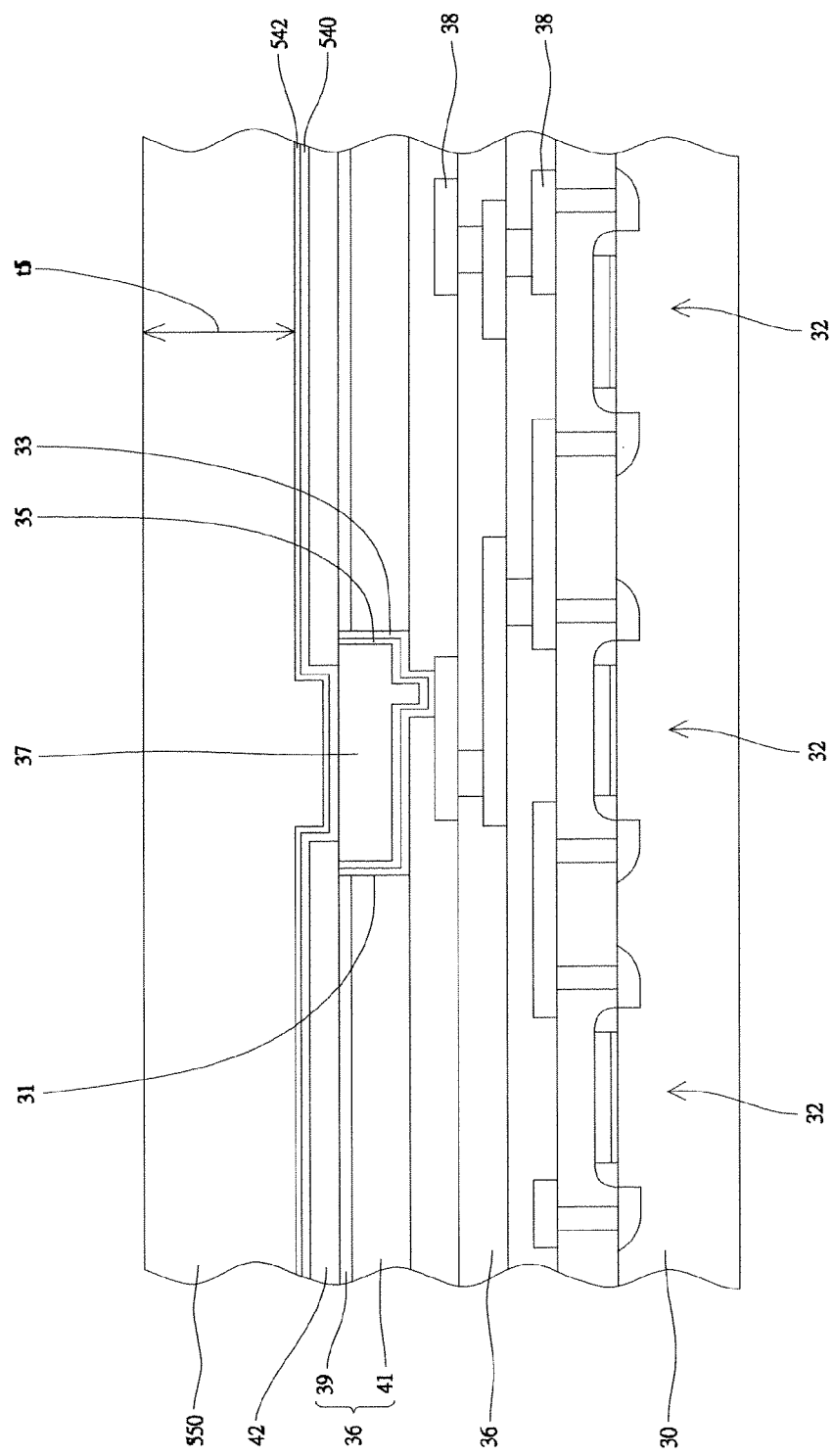

Next, referring to FIG. 27, a positive-type photoresist layer 550, such as napthoquinone diazide, photosensitive polyimide, photosensitive benzo-cyclo-butene (BCB), photosensitive parylene-based material, photosensitive epoxy-based material, with a thickness t1 of between 4 and 30 microns, is formed on the seed layer 542 using a spin coating process.

Figure 28:
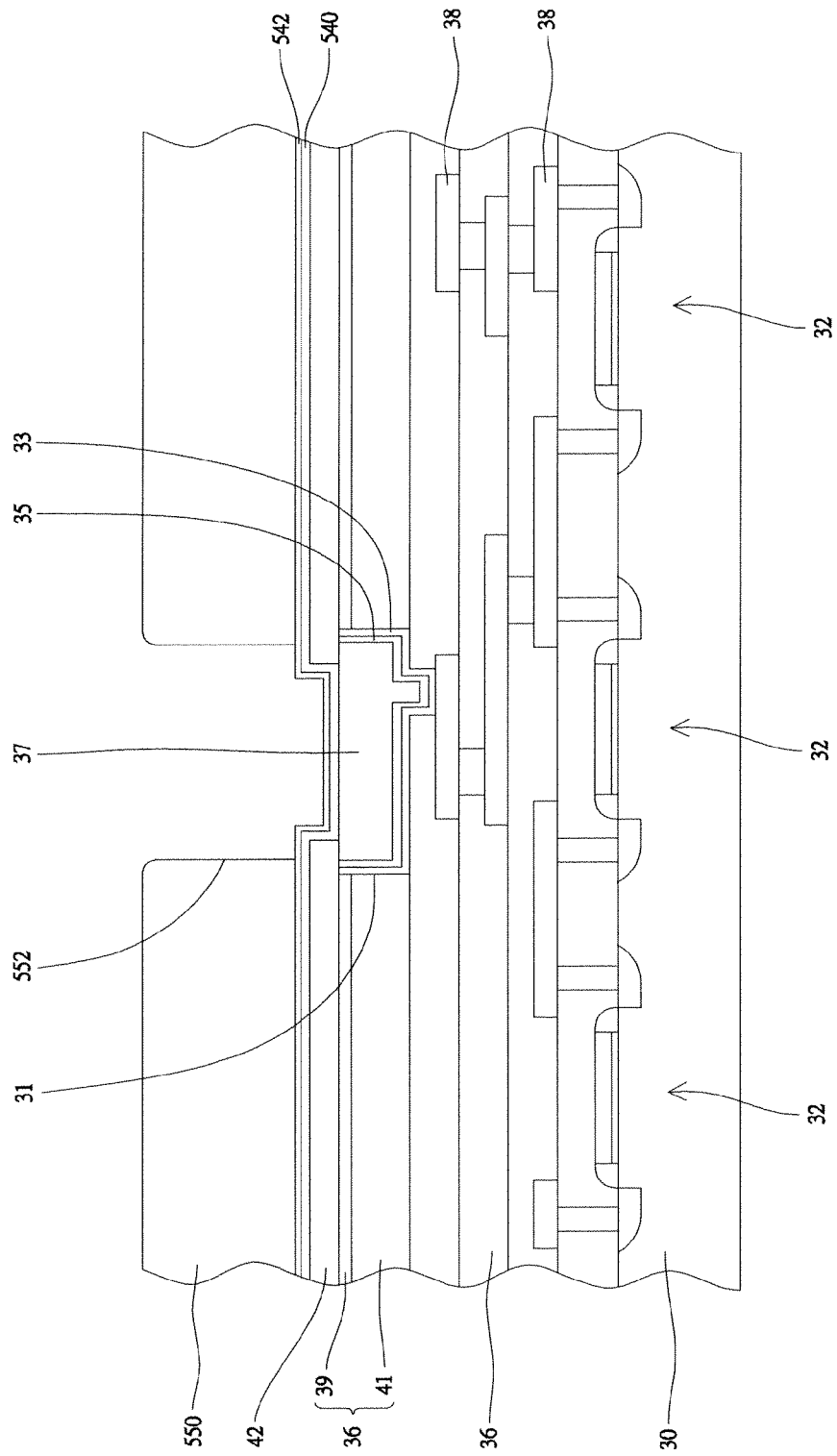

Next, referring to FIG. 28, a photolithography process including exposing and developing steps is used to pattern the photoresist layer 550 and to form an opening 552, with a bump pattern or pad pattern from a top view, in the photoresist layer 550 exposing the seed layer 542. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used.

Figure 29:
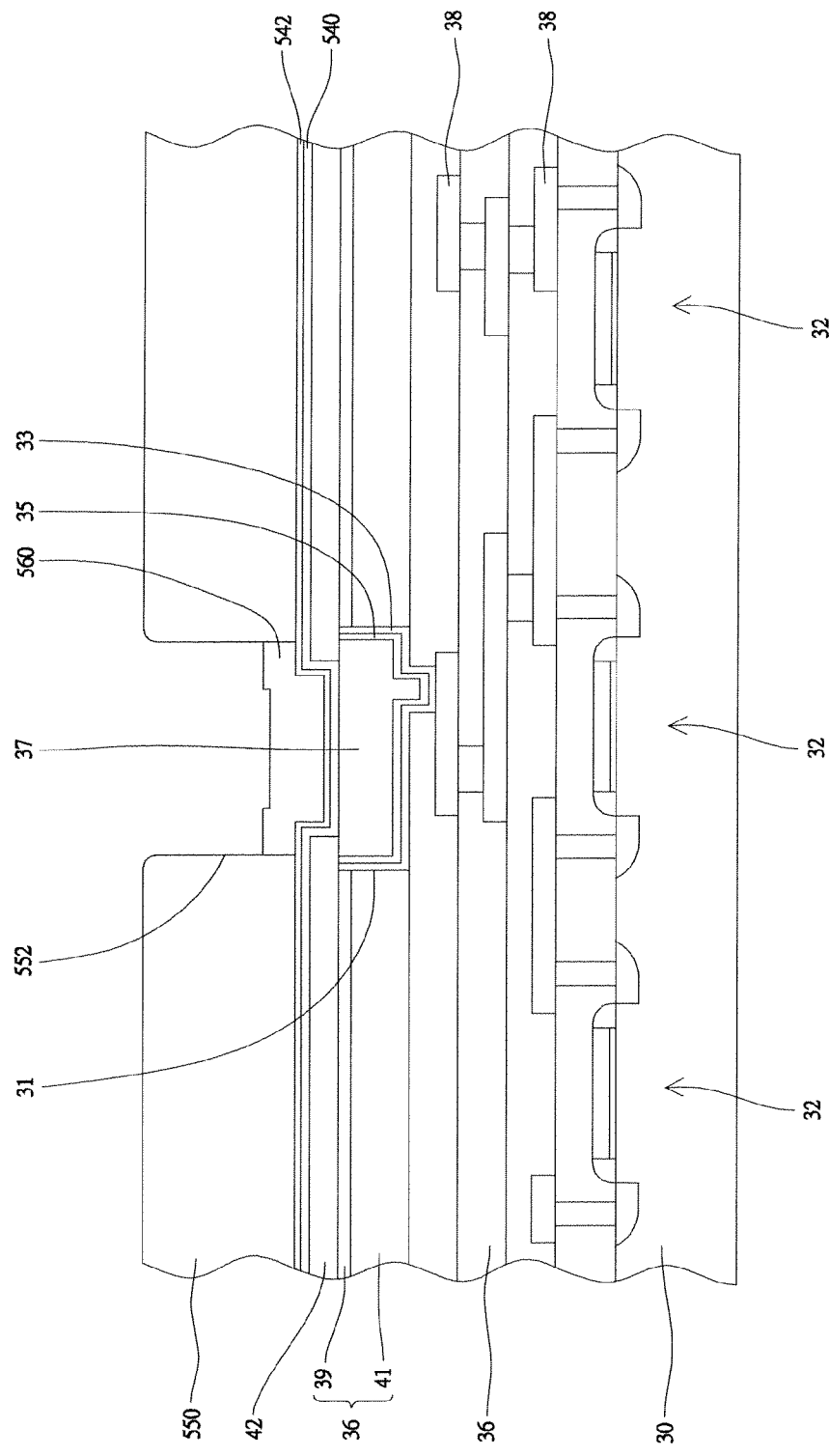

Next, referring to FIG. 29, a nickel layer 560 having a thickness of between 0.1 and 10 microns is electroplated or electroless plated on the seed layer 542 in the opening 552 in the photoresist layer 550.

Figure 30:
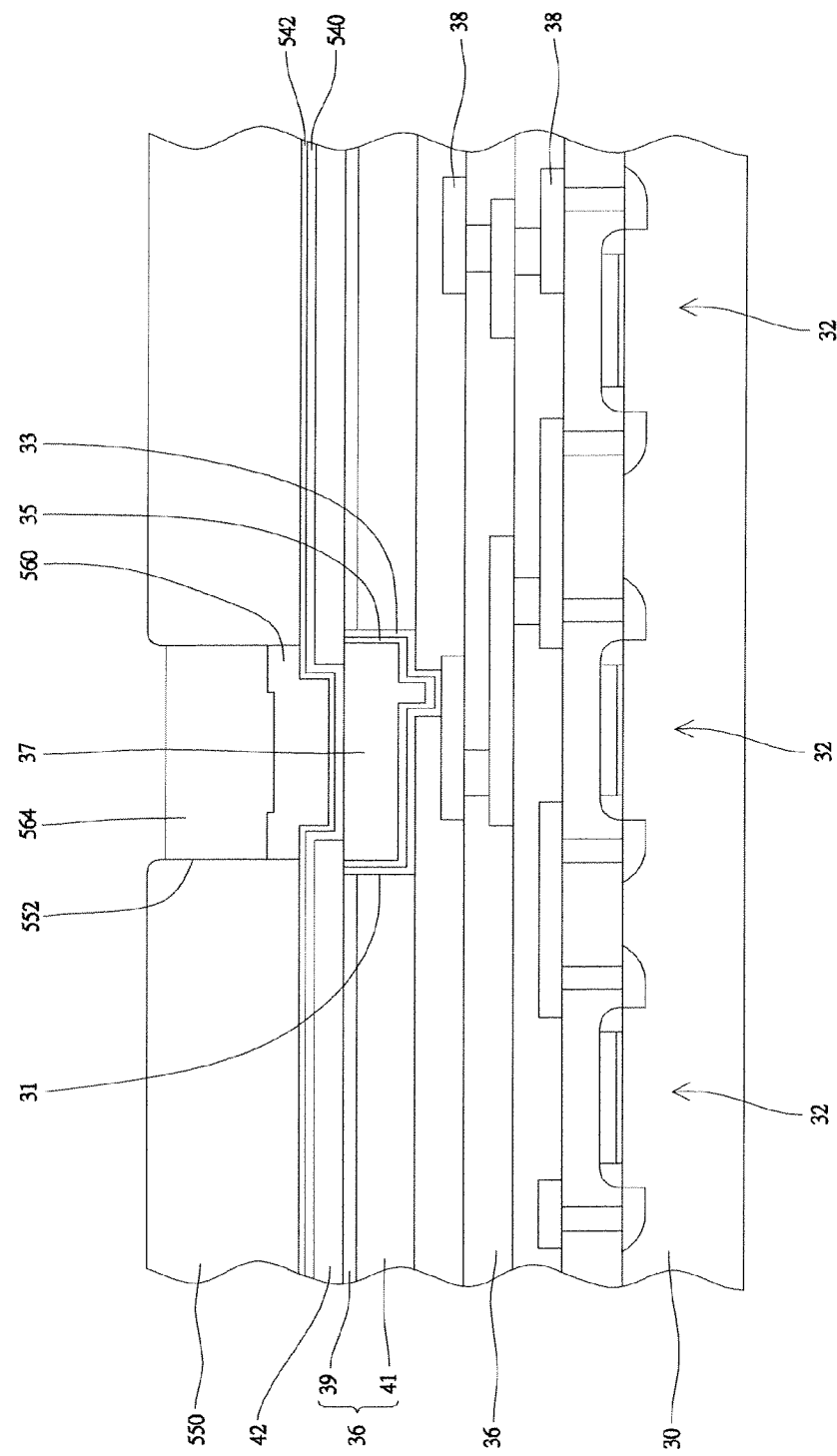

Next, referring to FIG. 30, a metal layer 564 of gold, copper, nickel, silver, palladium, platinum, rhodium, ruthenium, or rhenium, having a thickness of between 0.1 and 30 microns, and preferably of between 1.6 and 20 microns or of between 2 and 30 microns, is electroplated or electroless plated on the nickel layer 560 in the opening 552 in the photoresist layer 550. Alternatively, the metal layer 564 can be deposited by electroplating or electroless plating a tin-containing layer, such as tin-lead alloy or tin-silver alloy, having a thickness of between 10 and 500 microns on the nickel layer 560 in the opening 552 in the photoresist layer 550.

Figure 31:
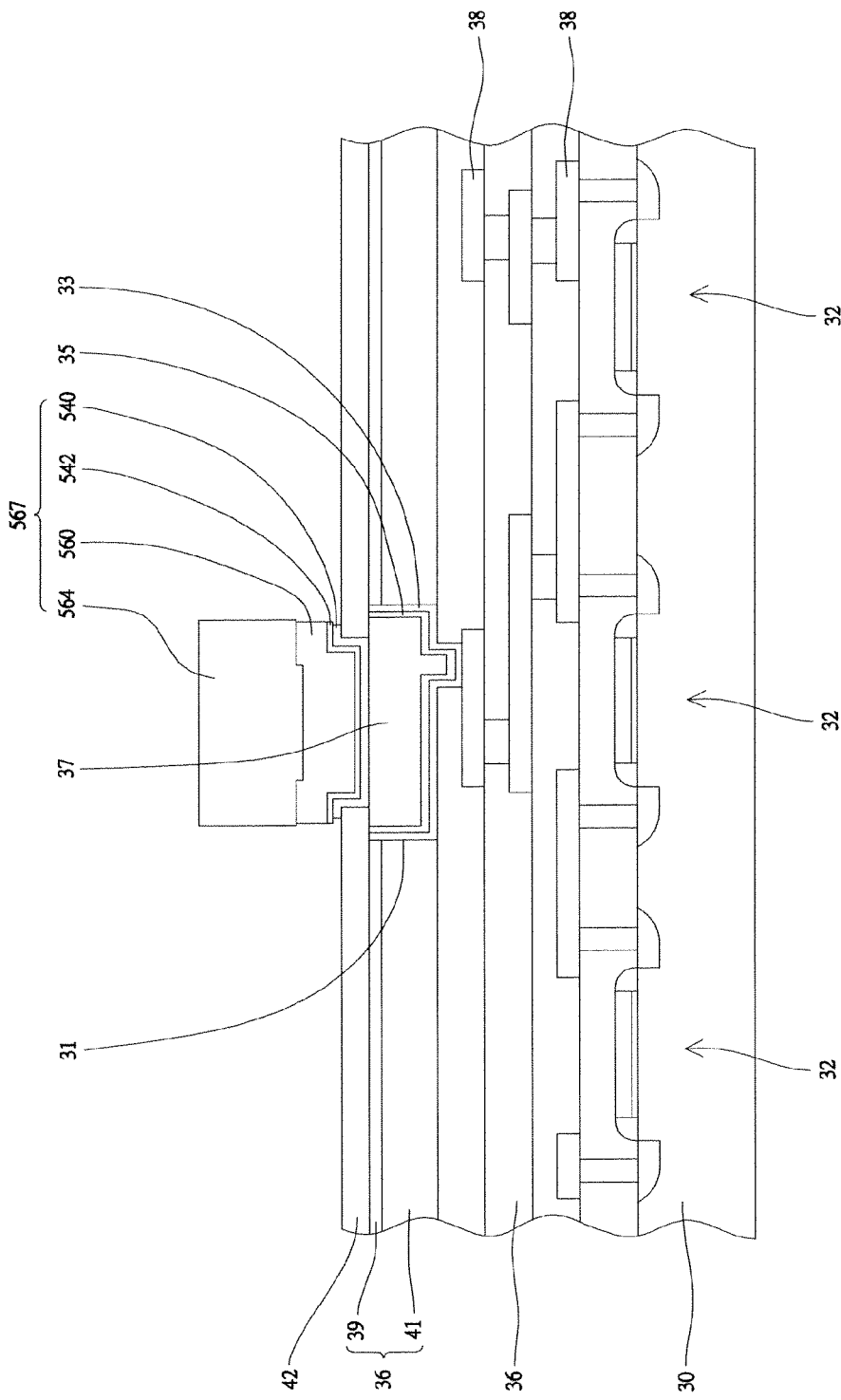

Next, referring to FIG. 31, the photoresist layer 550 is stripped. Next, the seed layer 542 not under the nickel layer 560 is removed using a dry etching process or a wet etching process. If the seed layer 542 is gold and removed by a wet etching process, the etchant for etching the seed layer 542 is potassium iodide. Thereafter, the adhesion/barrier layer 540 not under the copper layer 560 is removed using a dry etching process or a wet etching process. If the adhesion/barrier layer 540 is a titanium tungsten alloy and removed by a wet etching process, the etchant for etching the adhesion/barrier layer 540 is hydrogen peroxide or hydrofluoric acid. If the adhesion/barrier layer 540 is titanium and removed by a wet etching process, the etchant for etching the adhesion/barrier layer 540 is hydrofluoric acid. Thereafter, a cutting process can be used to divide the semiconductor wafer having the above-mentioned metal pad or metal bump 567 formed thereover into multiple semiconductor chips. Thereafter, the semiconductor chips can be used for a packaging process, such as tape-automated-bonding (TAB) process, chip-on-glass (COG) process or chip-on-film (COF) process, as mentioned below.

When the metallization structure formed for the metal layers 540, 542, 560 and 564 is used as a metal bump 567, the metal bump 567 can be used to be TAB bonded thereto, as shown in FIGS. 10 and 31. The metal bump 567 can be bonded on a tin-containing layer 577, such as a tin-lead alloy or a tin-silver alloy, which is formed on the inner leads 572 before the metal bump 567 is connected to the tin-containing layer 377 on the inner leads 372. After the metal bump 567 is connected to the tin-containing layer 377 on the inner leads 372, a polymer layer 379, such as polyimide or benzo-cyclo-butene (BCB), is filled into the opening 374 in the tape 340 and covers the metal bump 567 and the inner leads 372.

Alternatively, the metal bump 567 can be applied to a chip-on-glass (COG) package, as shown in FIGS. 11 and 31. Before the metal bump 567 is connected to the circuitry component 380, an anisotropic conductive paste (ACP) or anisotropic conductive film (ACF) 386 having a polymer layer 385 and multiple metal particles 387 mixed with the polymer layer 385 is formed on the glass substrate 382 and the transparent conductive trace 384. Next, the metal bump 567 is pressed into the ACP or ACF 386 such that the bump 567 can be electrically connected to the transparent conductive trace 384 through the metal particles 387 in the ACP or ACF 386.

Alternatively, the metal bump 567 can be applied to a chip-on-film (COF) package, as shown in FIGS. 12 and 31. The metal bump 567 can be bonded on a tin-containing layer 398, such as a tin-lead alloy or a tin-silver alloy, which is formed on the metal trace 392 before the metal bump 567 is connected to the tin-containing layer 398 on the metal trace 392. After the metal bump 567 is connected to the tin-containing layer 398 on the metal trace 392, a polymer layer 399, such as polyimide or benzo-cyclo-butene (BCB), is filled into the gap between the semiconductor chip and the flexible circuit film 390 and covers the metal bump 567.

Alternatively, the metal bump 567 formed on the copper pad 37 can be used to be bond onto a printed circuit board, ceramic substrate or other semiconductor wafer or chip.

Figure 32:
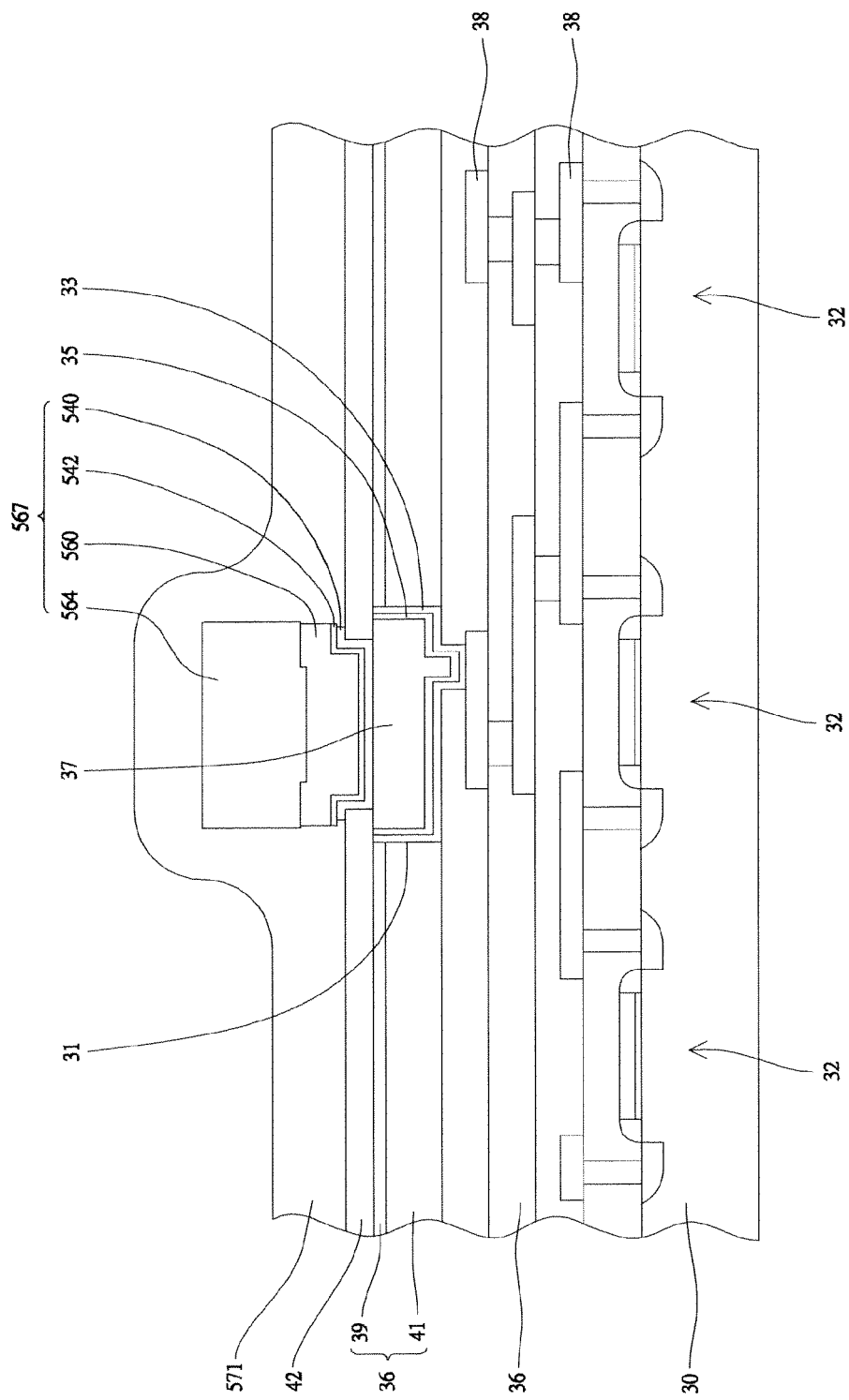
Figure 33:
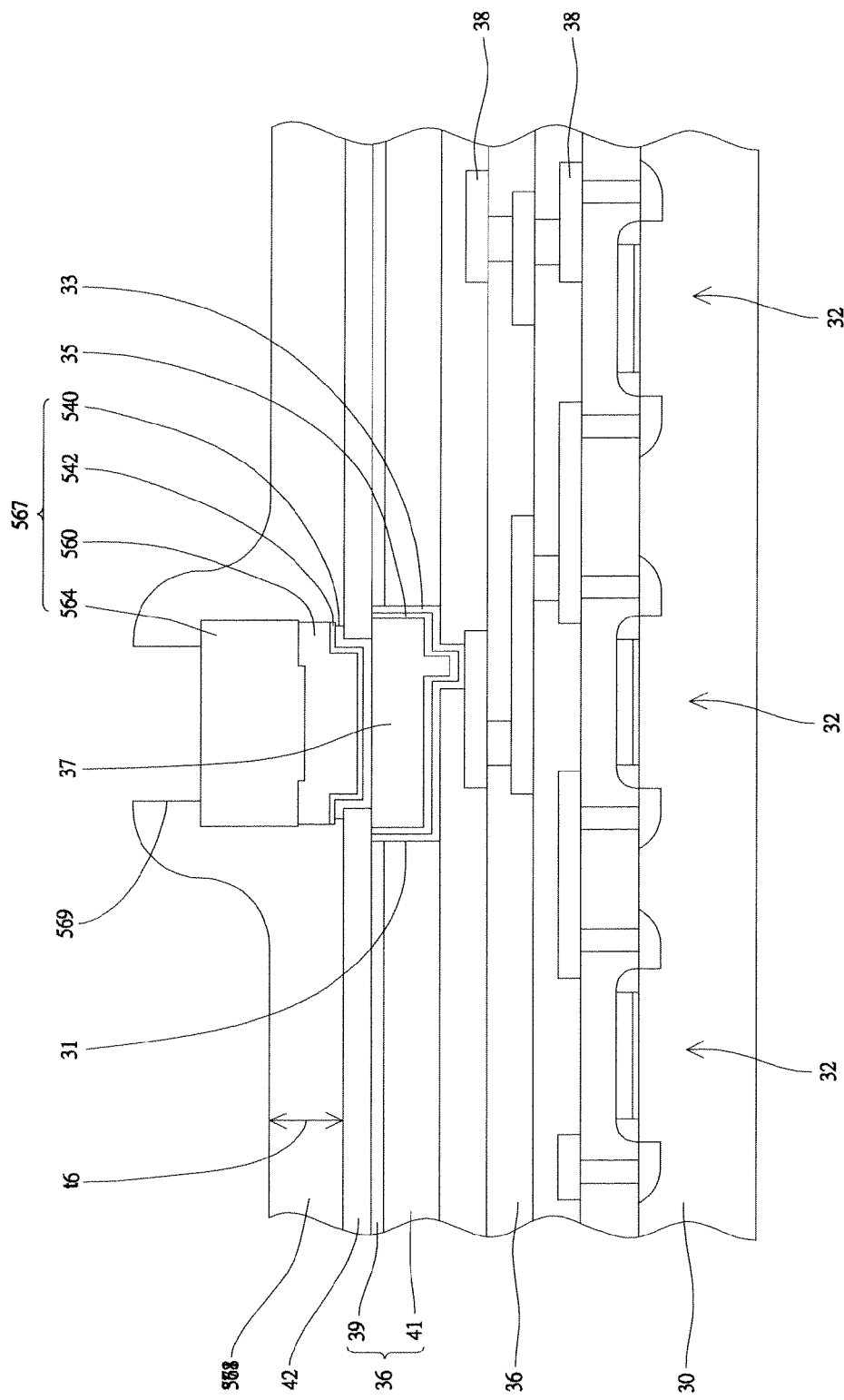

If the metallization structure formed for the metal layers 540, 542, 560 and 564 is used as a metal pad 567, a polymer layer 568 can be optionally formed on the passivation layer 42 and on the peripheral region of the metal pad 567, as shown in FIGS. 32 and 33.

Referring to FIGS. 32-33, it is an optional process to form the patterned polymer layer 568. The patterned polymer layer 568 can be formed by spin coating a polymer layer 571 of polyimide, benzo-cyclo-butene (BCB), parylene-based material, epoxy-based material, or elastomer, with a thickness of between 2 and 50 microns, and preferably between 8 and 30 microns, on the metal pads 567 and on the passivation layer 42.

Next, if the spin-coated polymer layer 571 is photosensitive, a photolithography process including exposing and developing steps can be used to form an opening 569 in the spin-coated polymer layer 571, shown as the patterned polymer layer 568, exposing the metal layer 567. Next, the patterned polymer layer 568 is cured at the temperature of 300 and 450 degrees centigrade if the patterned polymer layer 568 is polyimide. The patterned polymer layer 568 after being cured may have a thickness t6 of between 2 and 50 microns, and preferably between 6 and 20 microns.

If the spin-coated polymer layer 571 is non-photosensitive, photolithography and etching processes are typically needed to pattern the spin-coated polymer layer 571.

Alternatively, the patterned polymer layer 568 can be formed by screen printing a patterned polymer layer of polyimide, benzocyclobutene (BCB), parylene-based material or epoxy-based material, with a thickness of between 5 and 50 microns on the metal pads 567 and on the passivation layer 42, and then curing the screen-printed polymer layer at the temperature of 300 and 450 degrees centigrade if the screen-printed polymer layer is polyimide. Alternatively, the patterned polymer layer 568 can be formed by laminating a patterned dry film of polyimide, benzocyclobutene (BCB), parylene-based material or epoxy, with a thickness of between 10 and 500 microns on the metal pads 567 and on the passivation layer 42.

Figure 34:
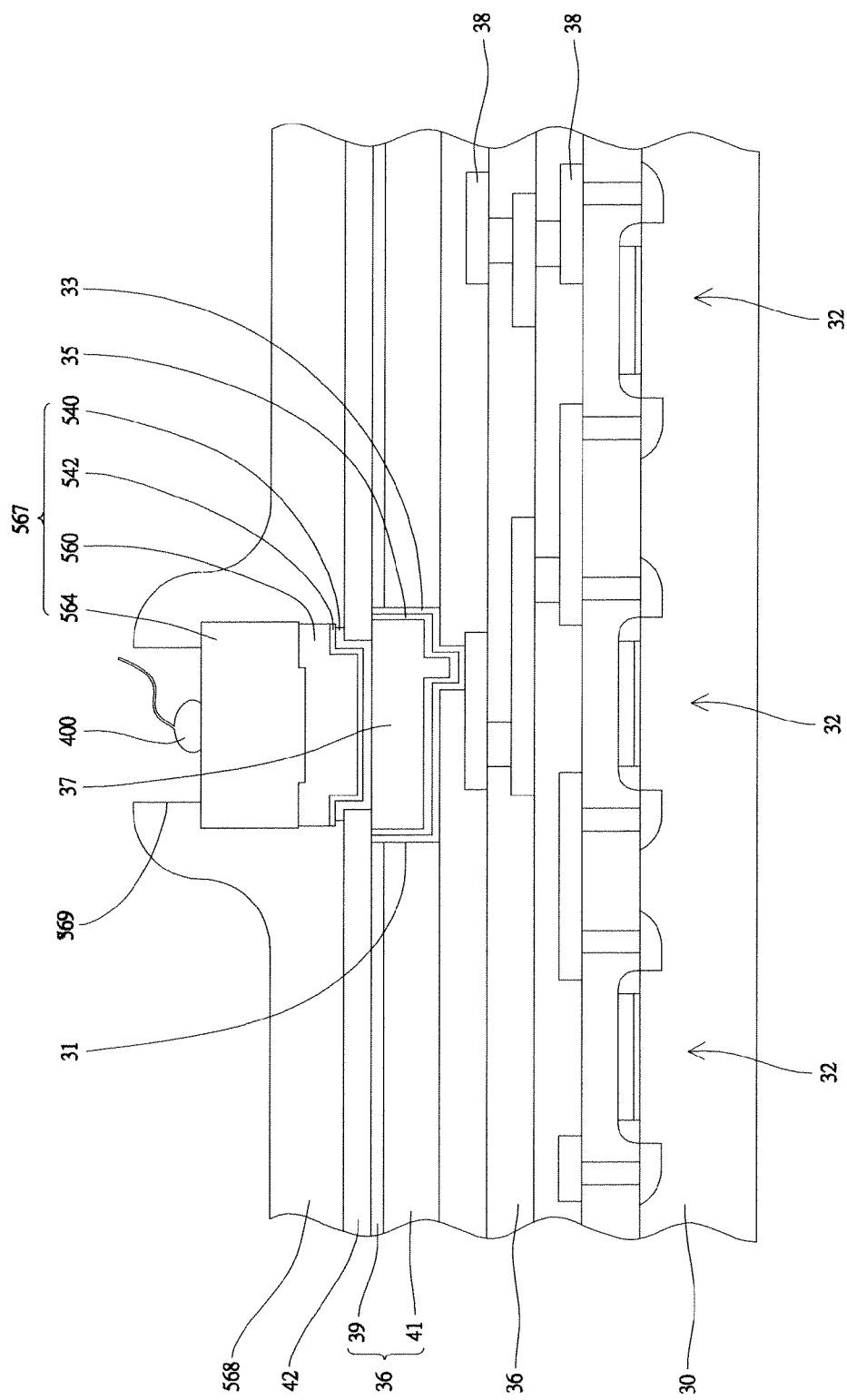

Next, referring to FIG. 34, the metal pad 567 can be used for being wirebonded thereto or having a gold bump or solder bump formed thereover. A gold wire 400 can be connected to the metal pad 567 exposed by the opening 569 in the polymer layer 568 using a wirebonding process. Alternatively, a gold bump or tin-containing bump, not shown, can be formed over the metal pad 567 exposed by the opening 569 in the polymer layer 568.

Alternatively, other kinds of metal bump or metal pad can be formed over the above-mentioned copper pad 37, as shown in FIGS. 35-46. The elements shown in FIGS. 35-46 having same reference numbers as those shown in FIGS. 1-15 indicate similar ones described above in FIGS. 1-15.

Figure 35:
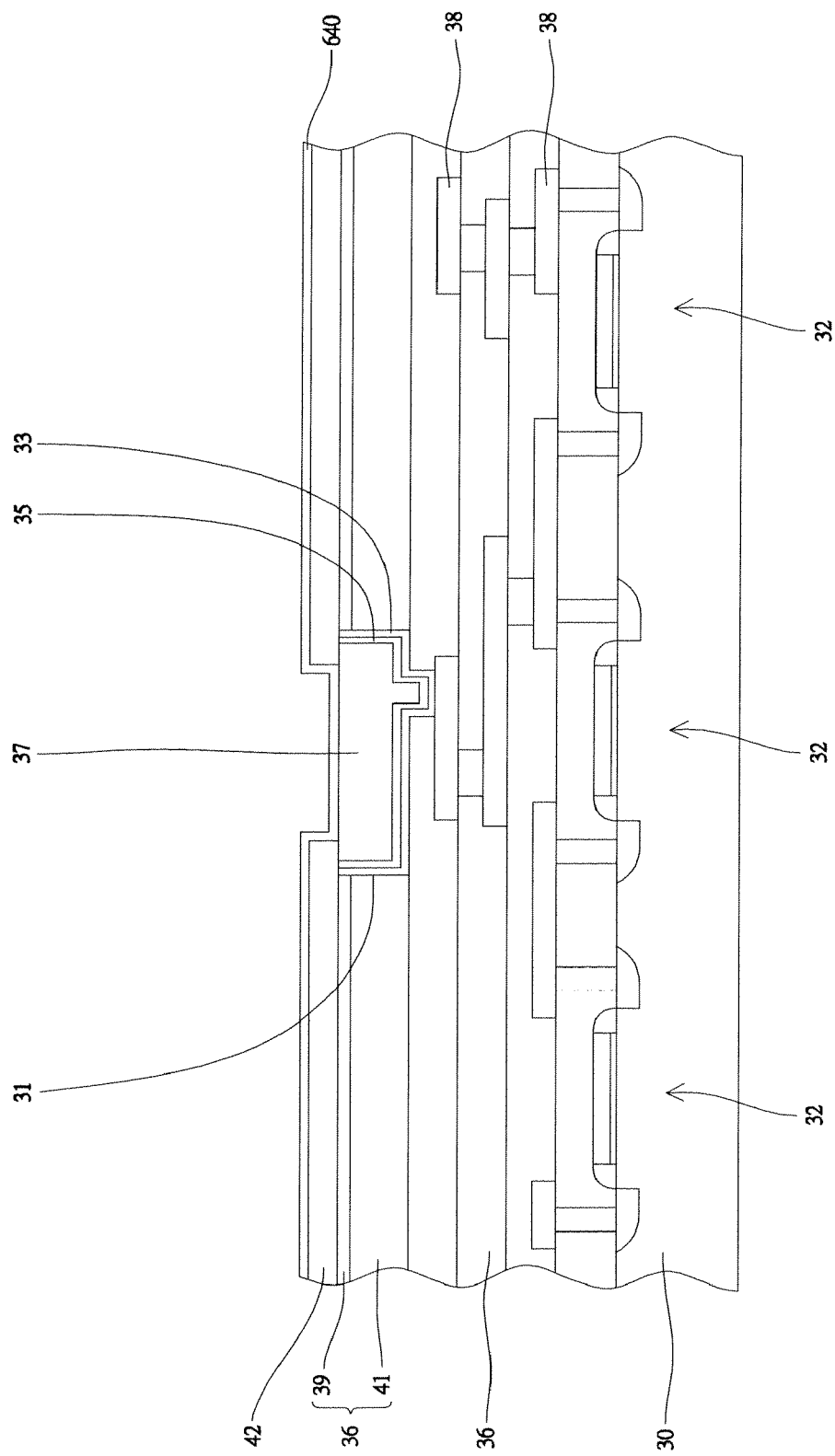
FIGS. 35-46 are cross-sectional views showing a process of forming a metal pad or metal bump over a copper pad according to a fourth embodiment.

Referring to FIG. 35, an adhesion/barrier layer 640 is formed by sputtering, evaporating, electroless plating or electroplating a metal layer of titanium, tungsten, cobalt, nickel, titanium nitride, a titanium-tungsten alloy, chromium, copper, a chromium-copper alloy, tantalum, or tantalum nitride, with a thickness of between 1000 and 6000 angstroms, on the passivation layer 42 and on the copper pad 37.

Figure 36:
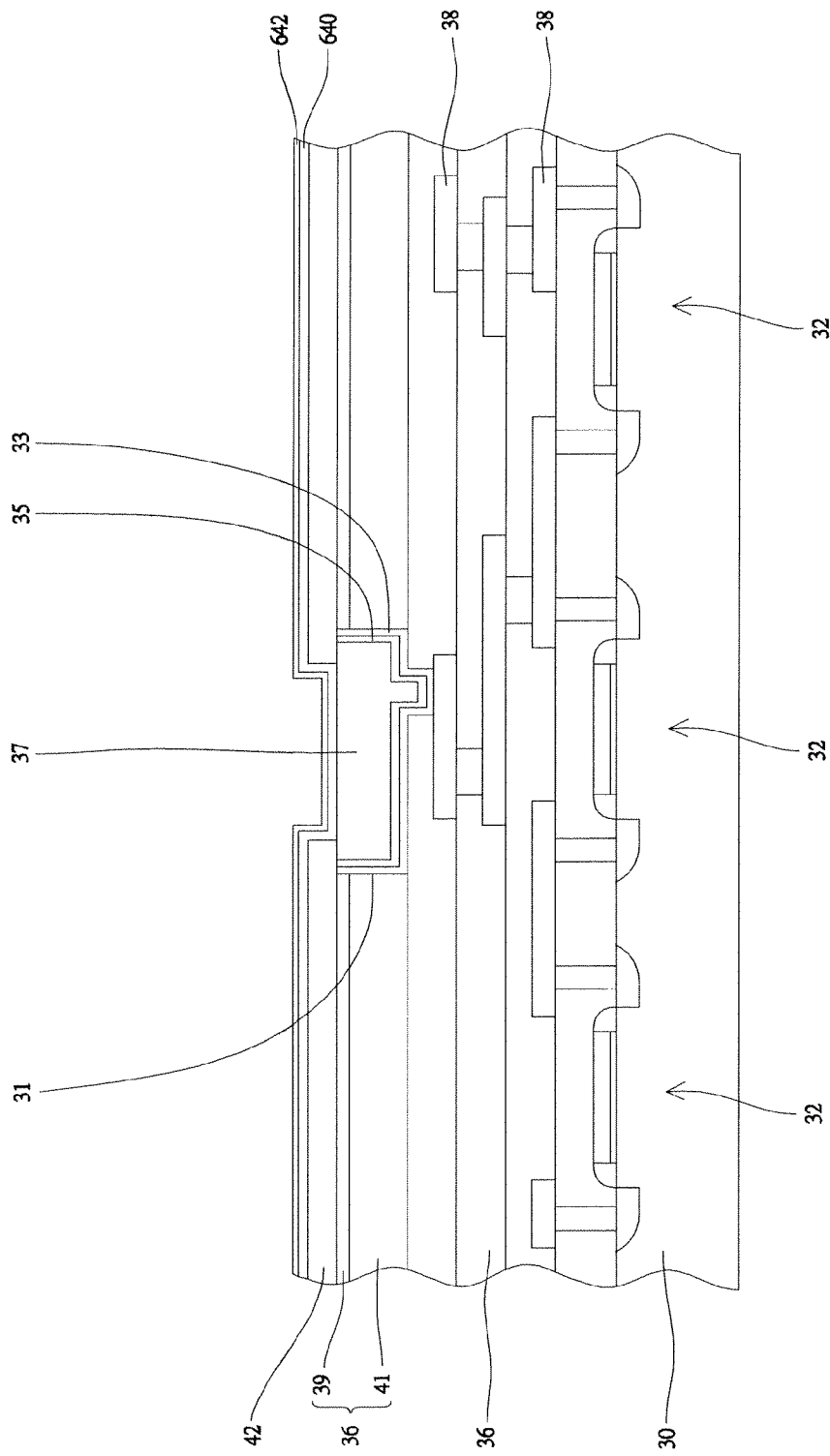

Next, referring to FIG. 36, a seed layer 642 may be formed by sputtering, evaporating, electroless plating or electroplating a metal layer of copper, with a thickness of between 500 and 3000 angstroms on the adhesion/barrier layer 640. If the adhesion/barrier layer 640 is copper, the step of forming the seed layer 642 of copper can be omitted.

Figure 37:
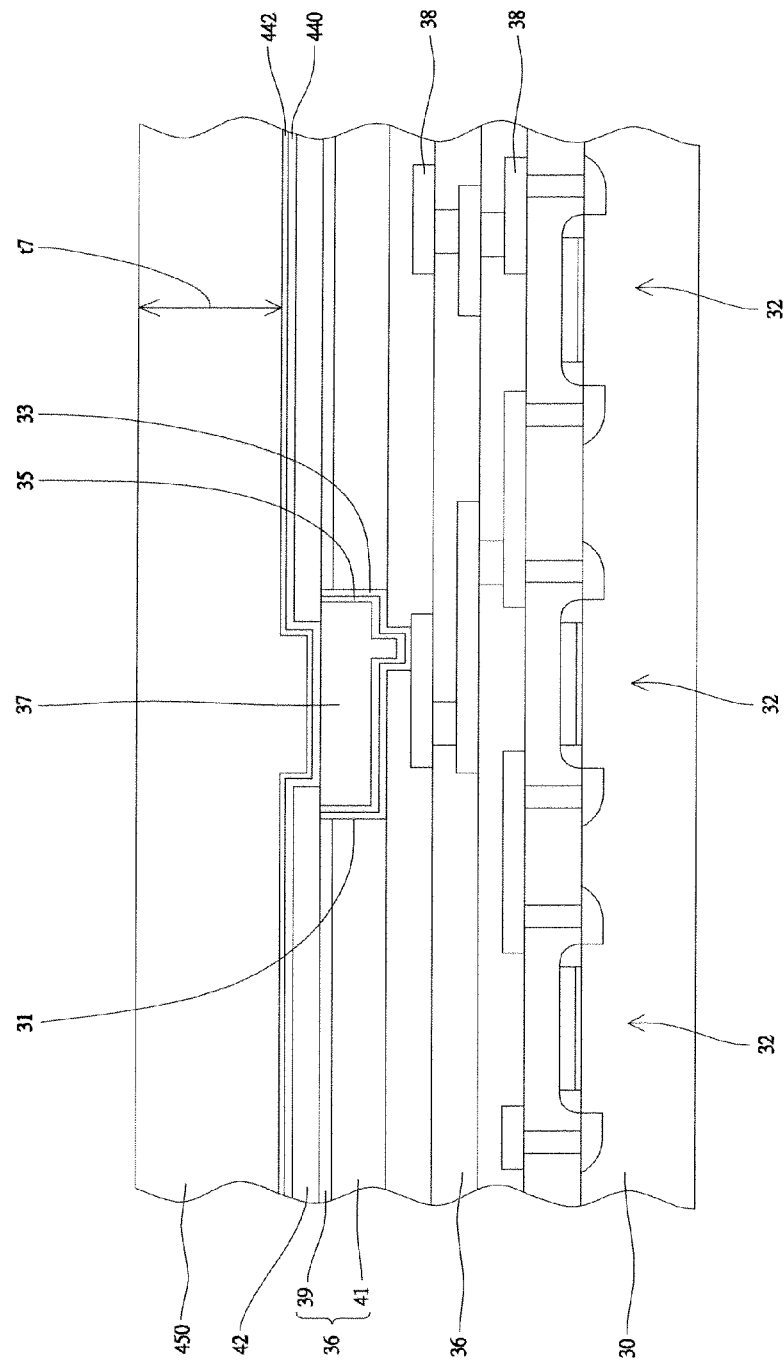

Next, referring to FIG. 37, a positive-type photoresist layer 650, such as napthoquinone diazide, photosensitive polyimide, photosensitive benzo-cyclo-butene (BCB), photosensitive parylene-based material, photosensitive epoxy-based material, with a thickness t7 of between 4 and 30 microns, is formed on the seed layer 642 using a spin coating process.

Figure 38:
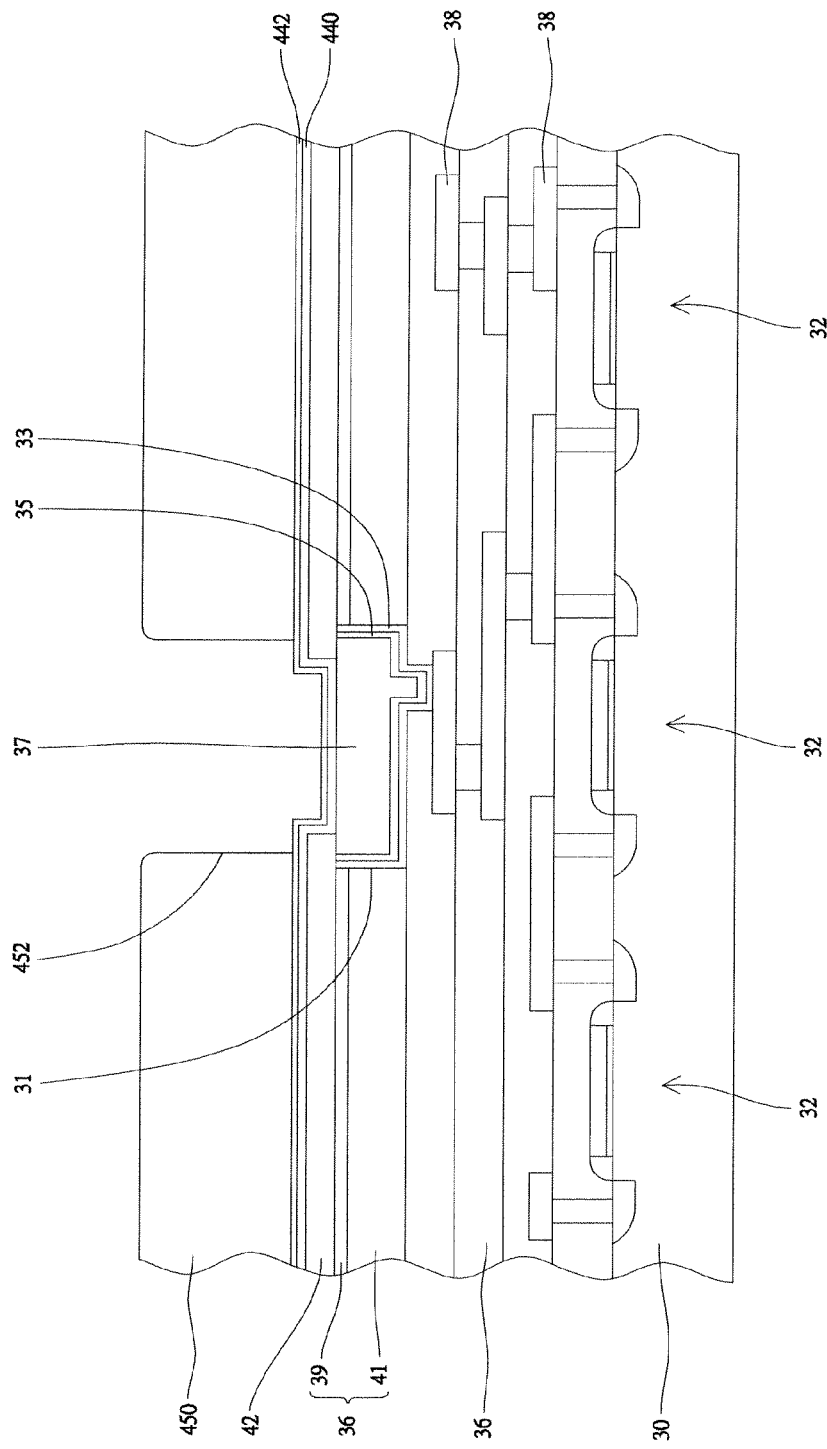

Next, referring to FIG. 38, a photolithography process including exposing and developing steps is used to pattern the photoresist layer 650 and to form an opening 652, with a bump pattern or pad pattern from a top view, in the photoresist layer 650 exposing the seed layer 642. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used.

Figure 39:
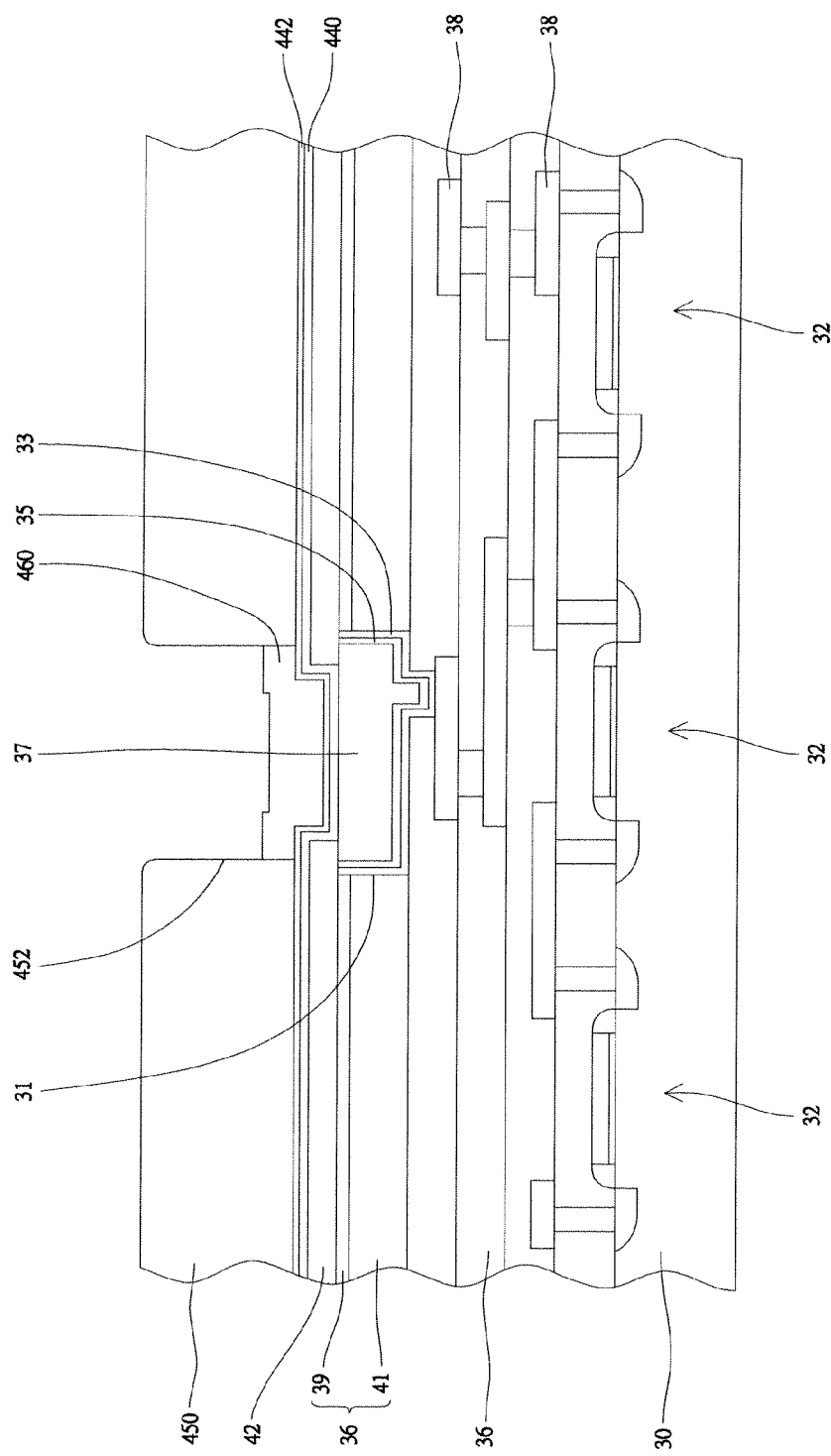

Next, referring to FIG. 39, a copper layer 660 having a thickness of between 0.1 and 10 microns is electroplated or electroless plated on the seed layer 642 exposed by the opening 652 in the photoresist layer 650.

Figure 40:
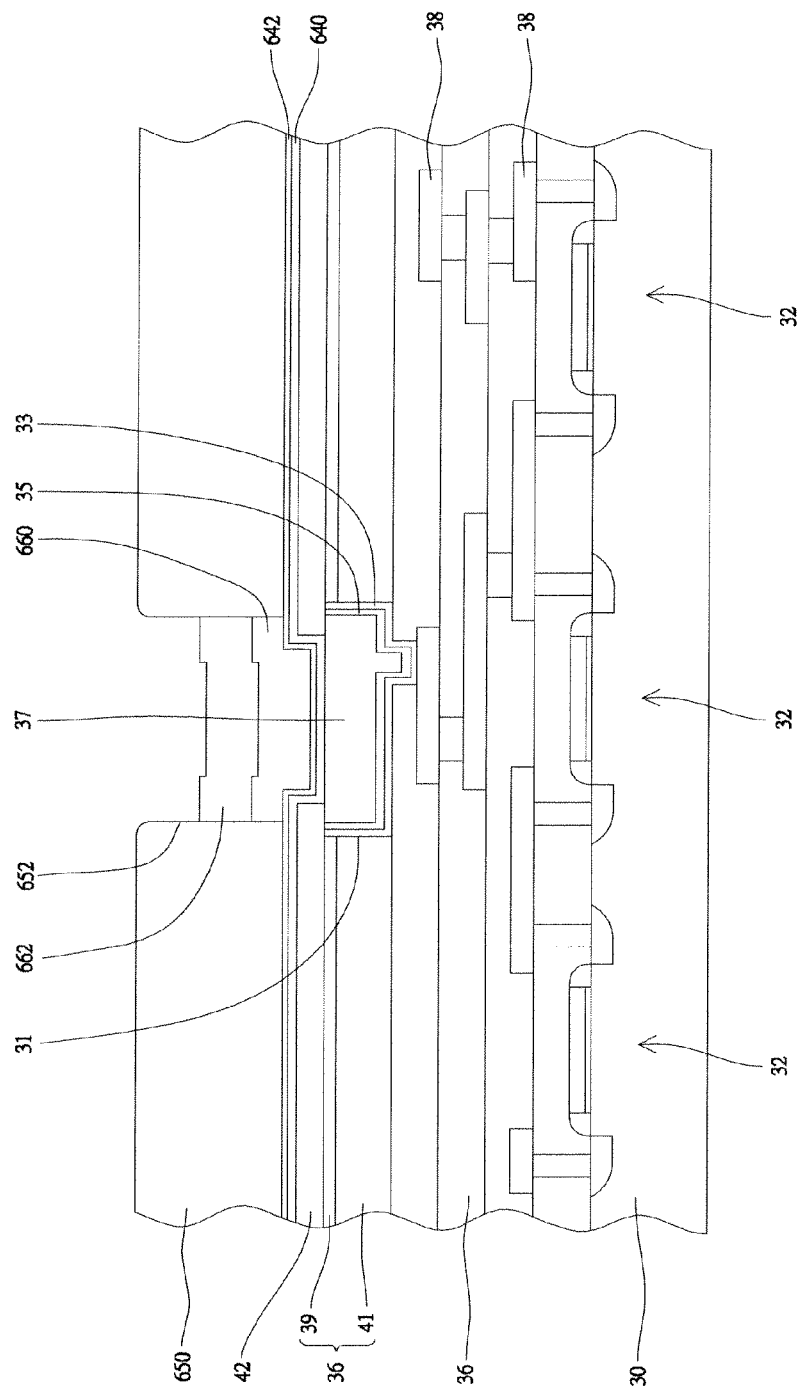

Next, referring to FIG. 40, a nickel layer 662 having a thickness of between 0.1 and 10 microns is electroplated or electroless plated on the copper layer 660 in the opening 652 in the photoresist layer 650.

Figure 41:
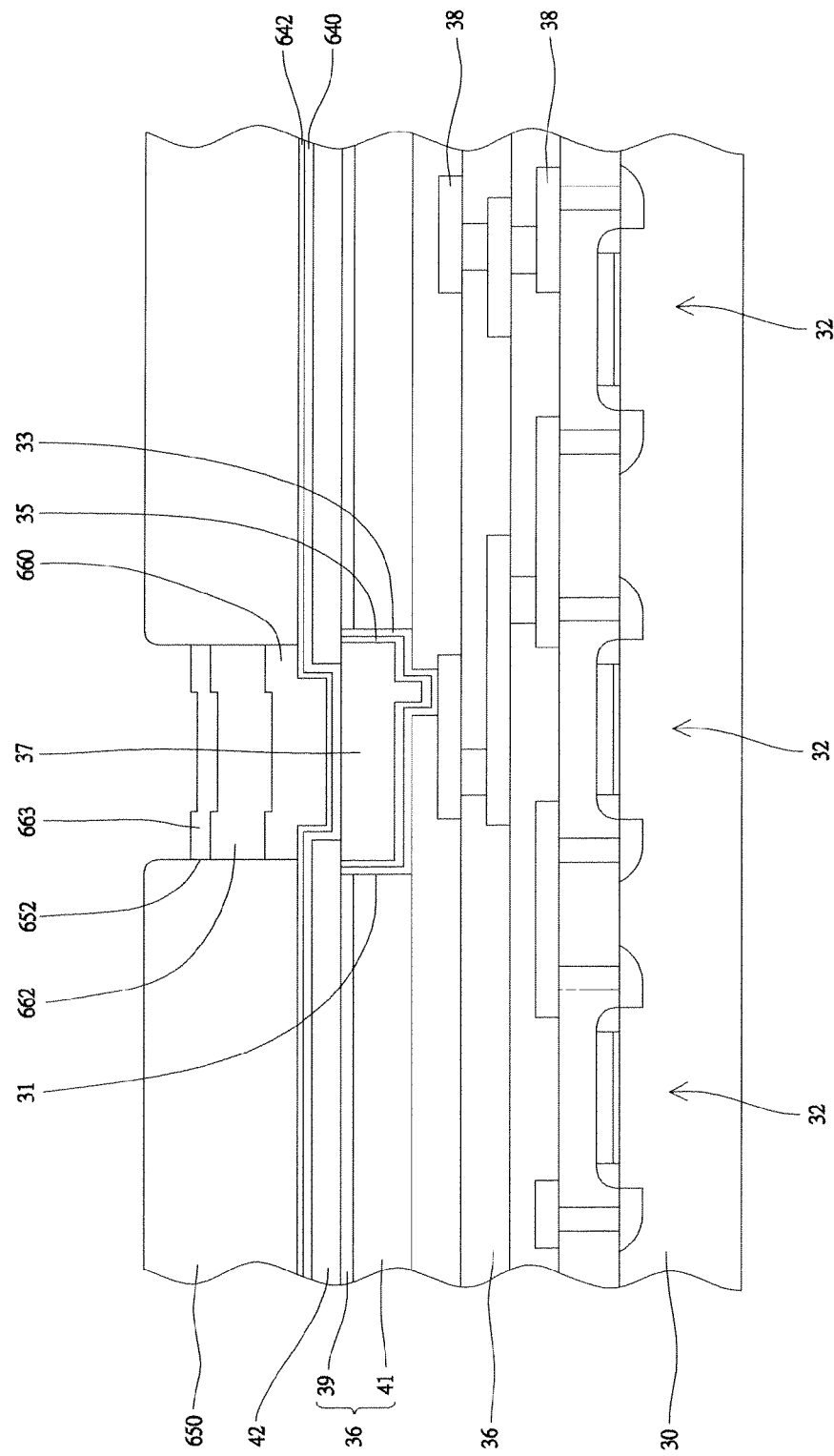

Next, referring to FIG. 41, a metal layer 663 of gold, copper, nickel, silver, palladium, platinum, rhodium, ruthenium, rhenium, a tin-silver alloy or a tin-lead alloy, having a thickness of between 0.01 and 5 microns, and preferably of between 0.01 and 2 microns or of between 1.6 and 5 microns, is electroless plated on the nickel layer 662 in the opening 652 in the photoresist layer 350.

Figure 42:
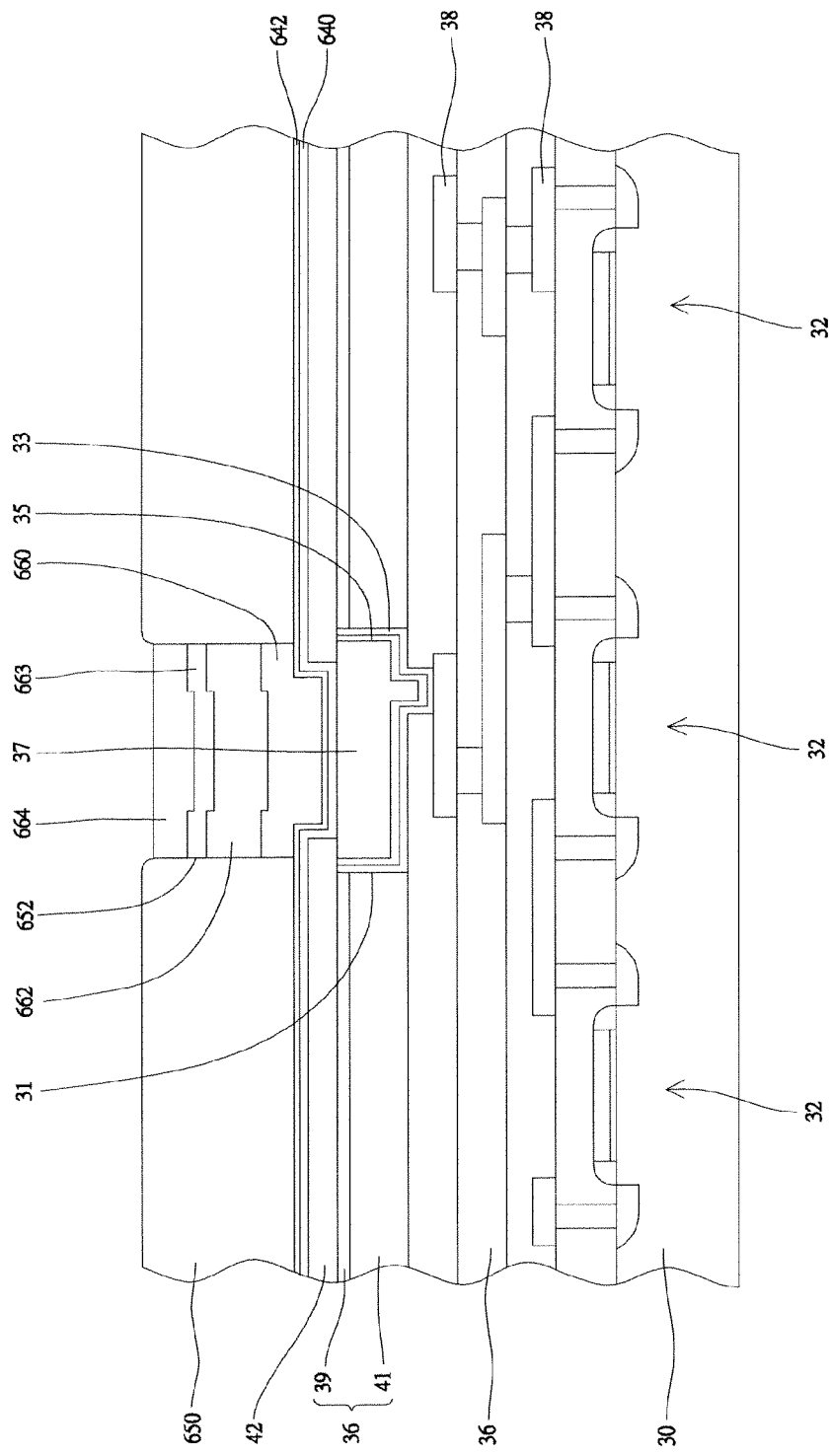

Next, referring to FIG. 42, a metal layer 664 can be deposited by electroplating a single layer of gold with a thickness of between 1 and 30 microns, and preferably between 3 and 20 microns, on the electroless-plated metal layer 663 preferably of gold in the opening 652 in the photoresist layer 650. Alternatively, the metal layer 664 can be deposited by electroplating a single layer of copper with a thickness of between 1 and 30 microns, and preferably 3 and 20 microns, on the electroless-plated metal layer 663 preferably of copper in the opening 652 in the photoresist layer 650. Alternatively, the metal layer 664 can be deposited by electroplating a single layer of silver with a thickness of between 1 and 30 microns, and preferably 3 and 20 microns, on the electroless-plated metal layer 663 preferably of silver in the opening 652 in the photoresist layer 650. Alternatively, the metal layer 664 can be deposited by electroplating a single layer of nickel with a thickness of between 1 and 30 microns, and preferably 3 and 20 microns, on the electroless-plated metal layer 663 preferably of nickel in the opening 652 in the photoresist layer 650. Alternatively, the metal layer 664 can be deposited by electroplating a single layer of palladium with a thickness of between 1 and 30 microns, and preferably 3 and 20 microns, on the electroless-plated metal layer 663 preferably of palladium in the opening 652 in the photoresist layer 650. Alternatively, the metal layer 664 can be deposited by electroplating a single layer of platinum with a thickness of between 1 and 30 microns, and preferably 3 and 20 microns, on the electroless-plated metal layer 663 preferably of platinum in the opening 652 in the photoresist layer 650. Alternatively, the metal layer 664 can be deposited by electroplating a single layer of rhodium with a thickness of between 1 and 30 microns, and preferably 3 and 20 microns, on the electroless-plated metal layer 663 preferably of rhodium in the opening 652 in the photoresist layer 650. Alternatively, the metal layer 664 can be deposited by electroplating a single layer of ruthenium with a thickness of between 1 and 30 microns, and preferably 3 and 20 microns, on the electroless-plated metal layer 663 preferably of ruthenium in the opening 652 in the photoresist layer 650. Alternatively, the metal layer 664 can be deposited by electroplating a single layer of rhenium with a thickness of between 1 and 30 microns, and preferably 3 and 20 microns, on the electroless-plated metal layer 663 preferably of rhenium in the opening 652 in the photoresist layer 650. Alternatively, the metal layer 664 can be deposited by electroplating a single layer of a tin-lead alloy with a thickness of between 10 and 500 microns, and preferably 30 and 150 microns, on the electroless-plated metal layer 663 preferably of nickel or tin-lead alloy in the opening 652 in the photoresist layer 650. Alternatively, the metal layer 664 can be deposited by electroplating a single layer of a tin-silver alloy with a thickness of between 10 and 500 microns, and preferably 30 and 150 microns, on the electroless-plated metal layer 663 preferably of nickel or tin-silver alloy in the opening 652 in the photoresist layer 650.

Figure 43:
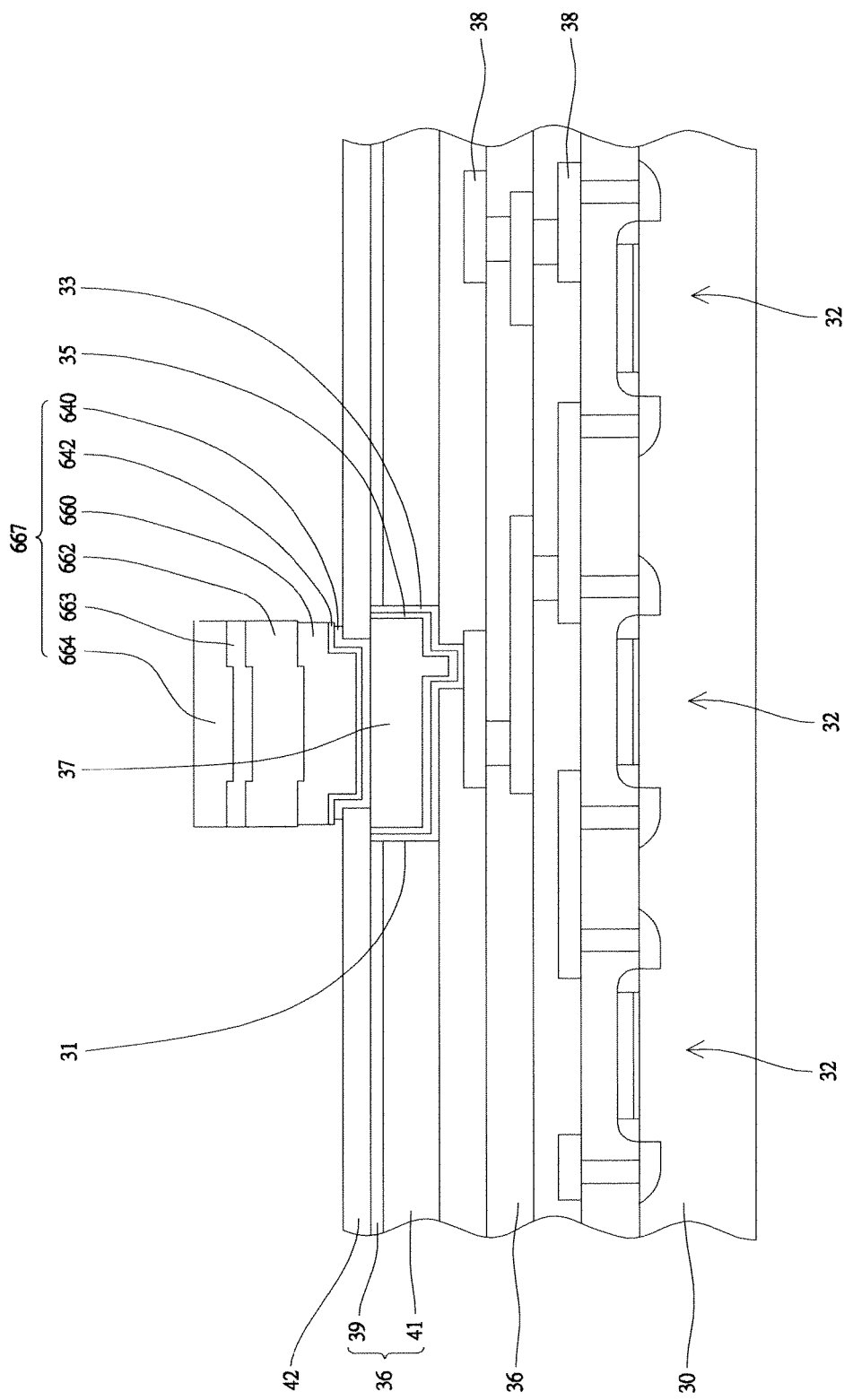

Next, referring to FIG. 43, the photoresist layer 650 is stripped. Next, the seed layer 642 not under the copper layer 660 is removed using a dry etching process or a wet etching process. Thereafter, the adhesion/barrier layer 640 not under the copper layer 660 is removed using a dry etching process or a wet etching process. If the adhesion/barrier layer 640 is a titanium tungsten alloy and removed by a wet etching process, the etchant for etching the adhesion/barrier layer 640 is hydrogen peroxide or hydrofluoric acid. If the adhesion/barrier layer 640 is titanium and removed by a wet etching process, the etchant for etching the adhesion/barrier layer 640 is hydrofluoric acid. Thereafter, a cutting process can be used to divide the semiconductor wafer having the above-mentioned metal pad or metal bump 667 formed thereover into multiple semiconductor chips. Thereafter, the semiconductor chips can be used for a packaging process, such as tape-automated-bonding (TAB) process, chip-on-glass (COG) process or chip-on-film (COF) process, as mentioned below.

When the metallization structure formed for the metal layers 640, 642, 660, 662, 663 and 664 is used as a metal bump 667, the metal bump 667 can be used to be TAB bonded thereto, as shown in FIGS. 10 and 43. The metal bump 667 can be bonded on a tin-containing layer 377, such as a tin-lead alloy or a tin-silver alloy, which is formed on the inner leads 372 before the metal bump 667 is connected to the tin-containing layer 377 on the inner leads 372. After the metal bump 667 is connected to the tin-containing layer 377 on the inner leads 372, a polymer layer 379, such as polyimide or benzo-cyclo-butene (BCB), is filled into the opening 374 in the tape 340 and covers the metal bump 667 and the inner leads 372.

Alternatively, the metal bump 667 can be applied to a chip-on-glass (COG) package, as shown in FIGS. 11 and 43. Before the metal bump 667 is connected to the circuitry component 380, an anisotropic conductive paste (ACP) or anisotropic conductive film (ACF) 386 having a polymer layer 385 and multiple metal particles 387 mixed with the polymer layer 385 is formed on the glass substrate 382 and the transparent conductive trace 384. Next, the metal bump 667 is pressed into the ACP or ACF 386 such that the bump 667 can be electrically connected to the transparent conductive trace 384 through the metal particles 387 in the ACP or ACF 386.

Alternatively, the metal bump 667 can be applied to a chip-on-film (COF) package, as shown in FIGS. 12 and 43. The metal bump 667 can be bonded on a tin-containing layer 398, such as a tin-lead alloy or a tin-silver alloy, which is formed on the metal trace 392 before the metal bump 667 is connected to the tin-containing layer 398 on the metal trace 392. After the metal bump 667 is connected to the tin-containing layer 398 on the metal trace 392, a polymer layer 399, such as polyimide or benzo-cyclo-butene (BCB), is filled into the gap between the semiconductor chip and the flexible circuit film 390 and covers the metal bump 667.

Alternatively, the metal bump 667 formed on the copper pad 37 can be used to be bond onto a printed circuit board, ceramic substrate or other semiconductor wafer or chip.

Figure 44:
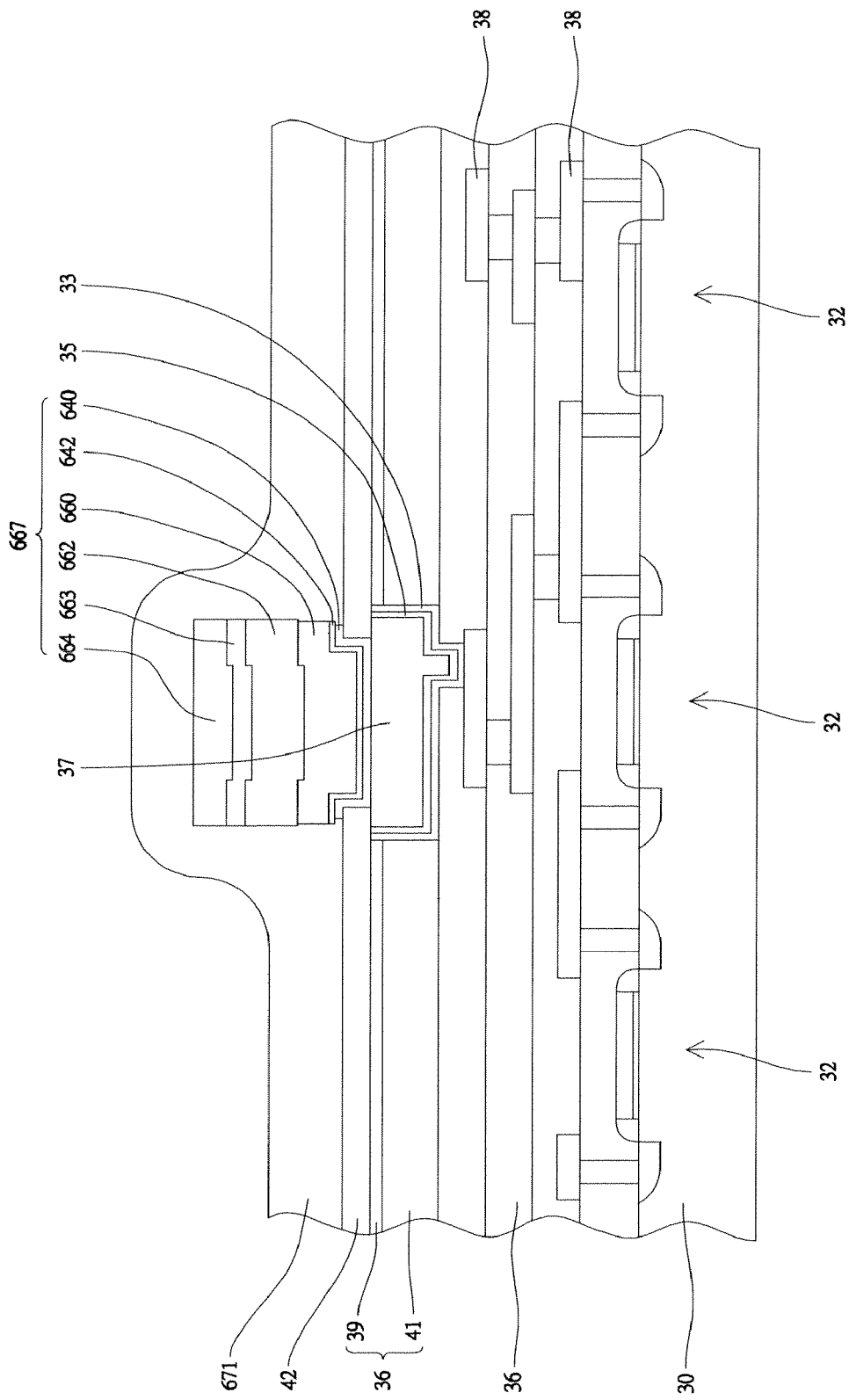
Figure 45:
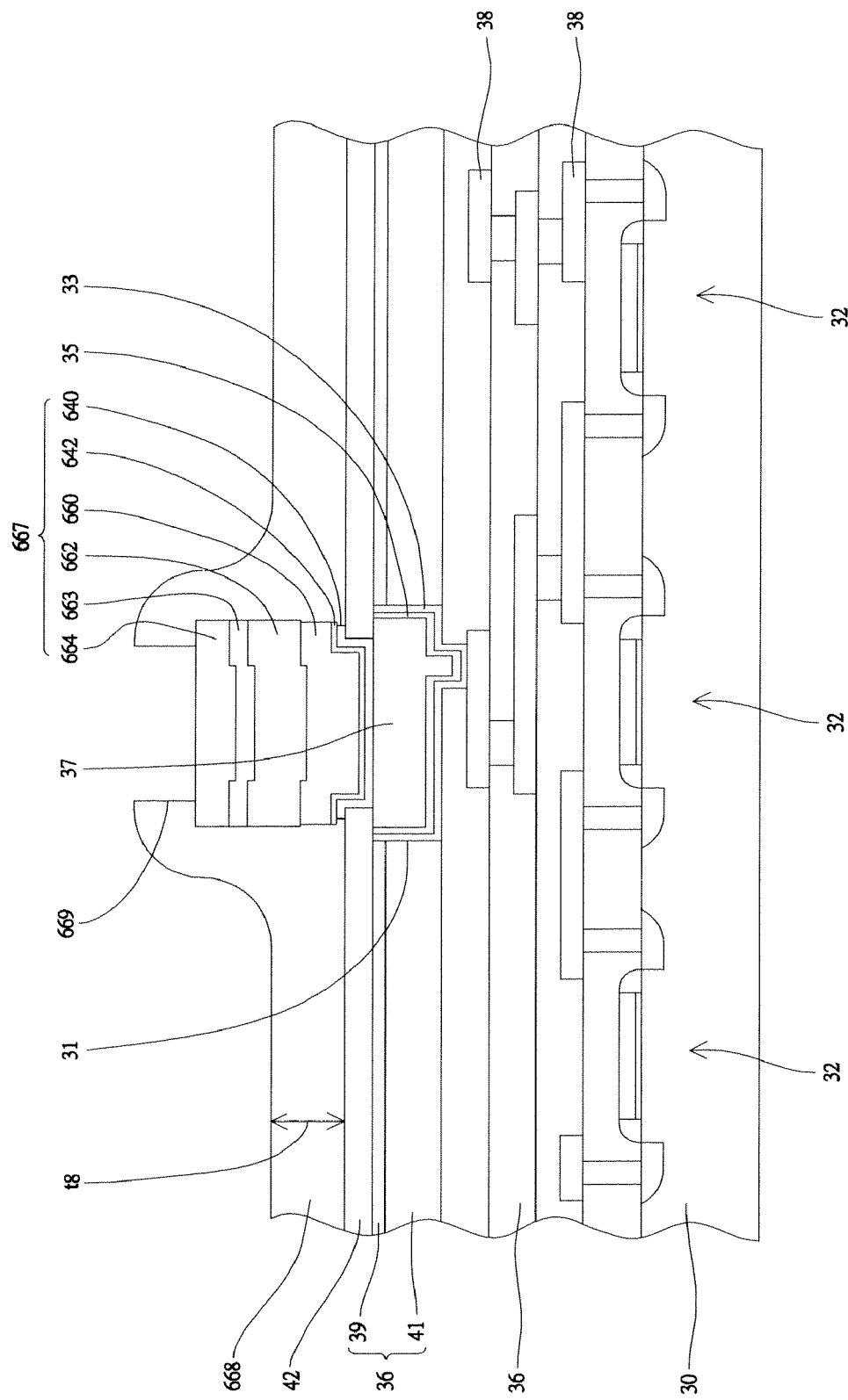

If the metallization structure formed for the metal layers 640, 642, 660, 662, 663 and 664 is used as a metal pad 667, a patterned polymer layer 668 can be optionally formed on the passivation layer 42 and on the peripheral region of the metal pad 667, as shown in FIGS. 44 and 45.

Referring to FIGS. 44-45, it is an optional process to form the patterned polymer layer 668. The patterned polymer layer 668 can be formed by spin coating a polymer layer 671 of polyimide, benzo-cyclo-butene (BCB), parylene-based material, epoxy-based material, or elastomer, with a thickness of between 2 and 50 microns, and preferably between 8 and 30 microns, on the metal pads 667 and on the passivation layer 42.

Next, if the spin-coated polymer layer 671 is photosensitive, a photolithography process including exposing and developing steps can be used to form an opening 669 in the spin-coated polymer layer 671, shown as the patterned polymer layer 668, exposing the metal layer 667. Next, the patterned polymer layer 668 is cured at the temperature of 300 and 450 degrees centigrade if the patterned polymer layer 668 is polyimide. The patterned polymer layer 668 after being cured may have a thickness t8 of between 2 and 50 microns, and preferably between 6 and 20 microns.

If the spin-coated polymer layer 671 is non-photosensitive, photolithography and etching processes are typically needed to pattern the spin-coated polymer layer 671.

Alternatively, the patterned polymer layer 668 can be formed by screen printing a patterned polymer layer of polyimide, benzocyclobutene (BCB), parylene-based material or epoxy-based material, with a thickness of between 5 and 50 microns on the metal pads 667 and on the passivation layer 42, and then curing the screen-printed polymer layer at the temperature of 300 and 450 degrees centigrade if the screen-printed polymer layer is polyimide. Alternatively, the patterned polymer layer 668 can be formed by laminating a patterned dry film of polyimide, benzocyclobutene (BCB), parylene-based material or epoxy, with a thickness of between 10 and 500 microns on the metal pads 667 and on the passivation layer 42.

Figure 46:
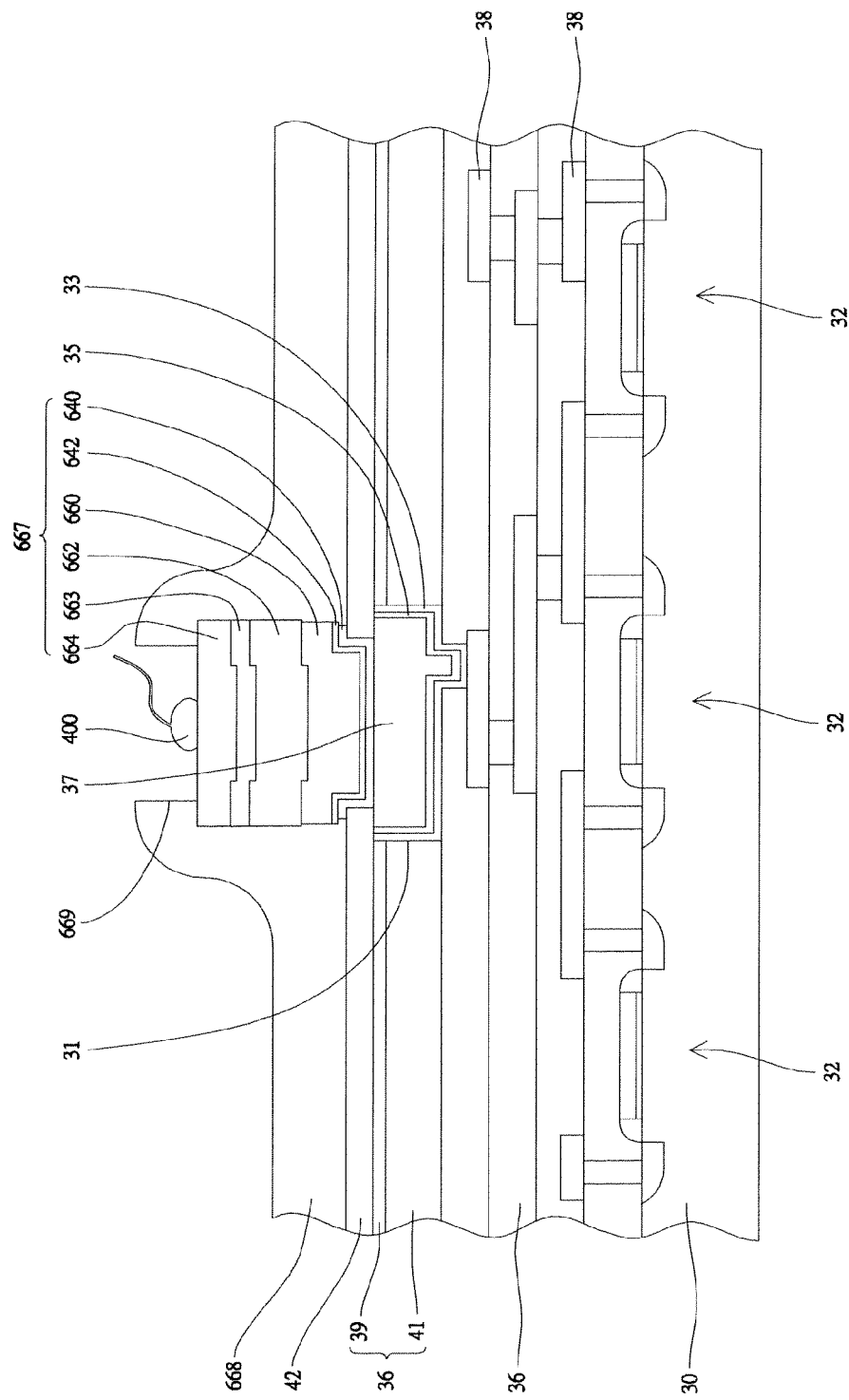

Next, referring to FIG. 46, the metal pad 667 can be used for being wirebonded thereto or having a gold bump or solder bump formed thereover. A gold wire 400 can be connected to the metal pad 667 exposed by the opening 669 in the polymer layer 668 using a wirebonding process. Alternatively, a gold bump or tin-containing bump, not shown, can be formed over the metal pad 667 exposed by the opening 669 in the polymer layer 668.

Alternatively, in order to prevent the copper pad 37 from being oxidized, a metal cap 700 can be formed on the copper pad 37 before forming the above-mentioned metal pad or metal bump 367, 467, 567, or 667 over the copper pad 37, as shown in FIGS. 47-55. The elements shown in FIGS. 47-55 having same reference numbers as those shown in FIGS. 1-46 indicate similar ones described above in FIGS. 1-46.

Figure 47:
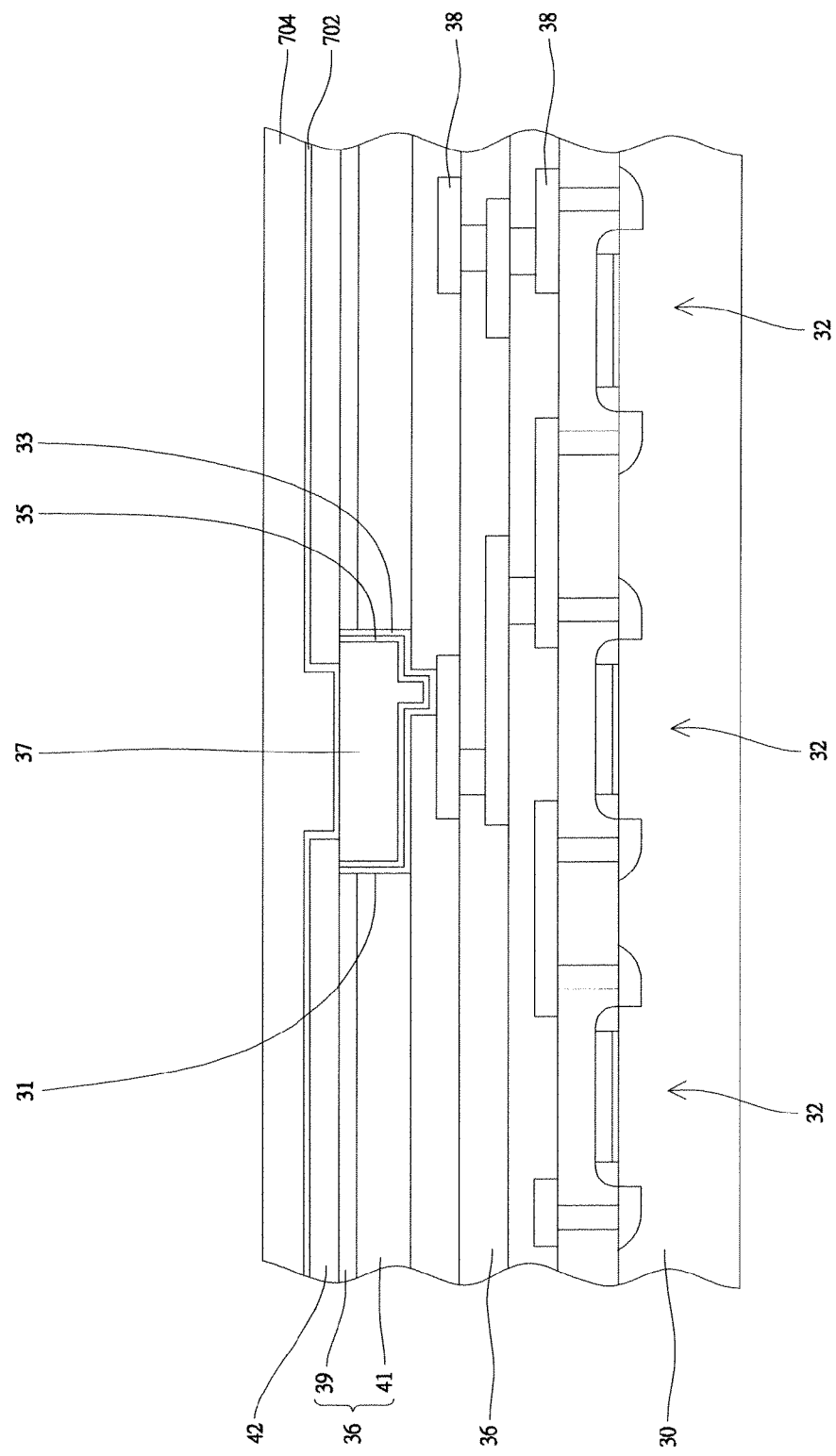
FIGS. 47-55 and 55A are cross-sectional views showing a process of forming a metal pad or metal bump over a metal cap on a copper pad according to a fifth embodiment.
Figure 48:
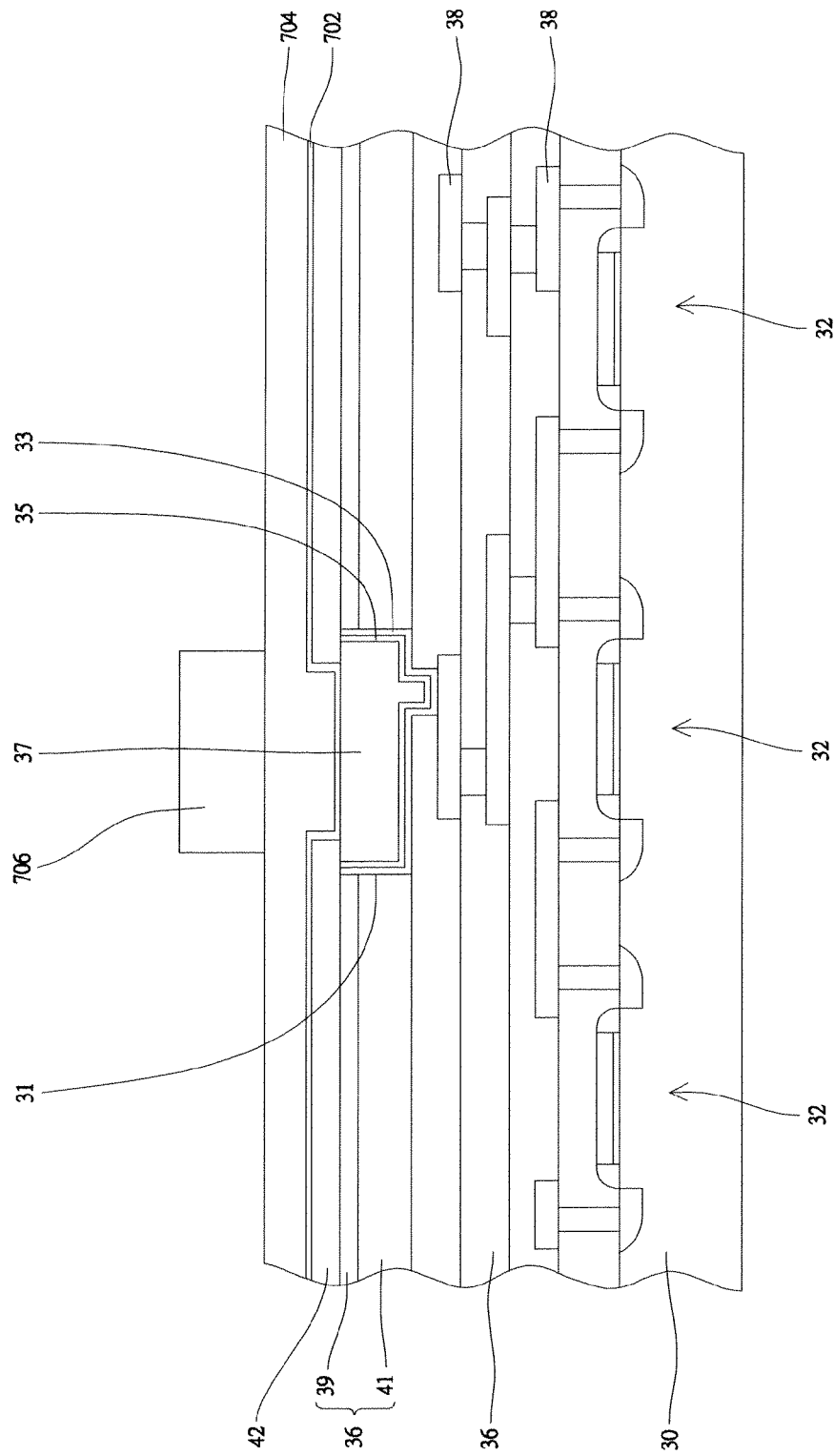
Figure 49:
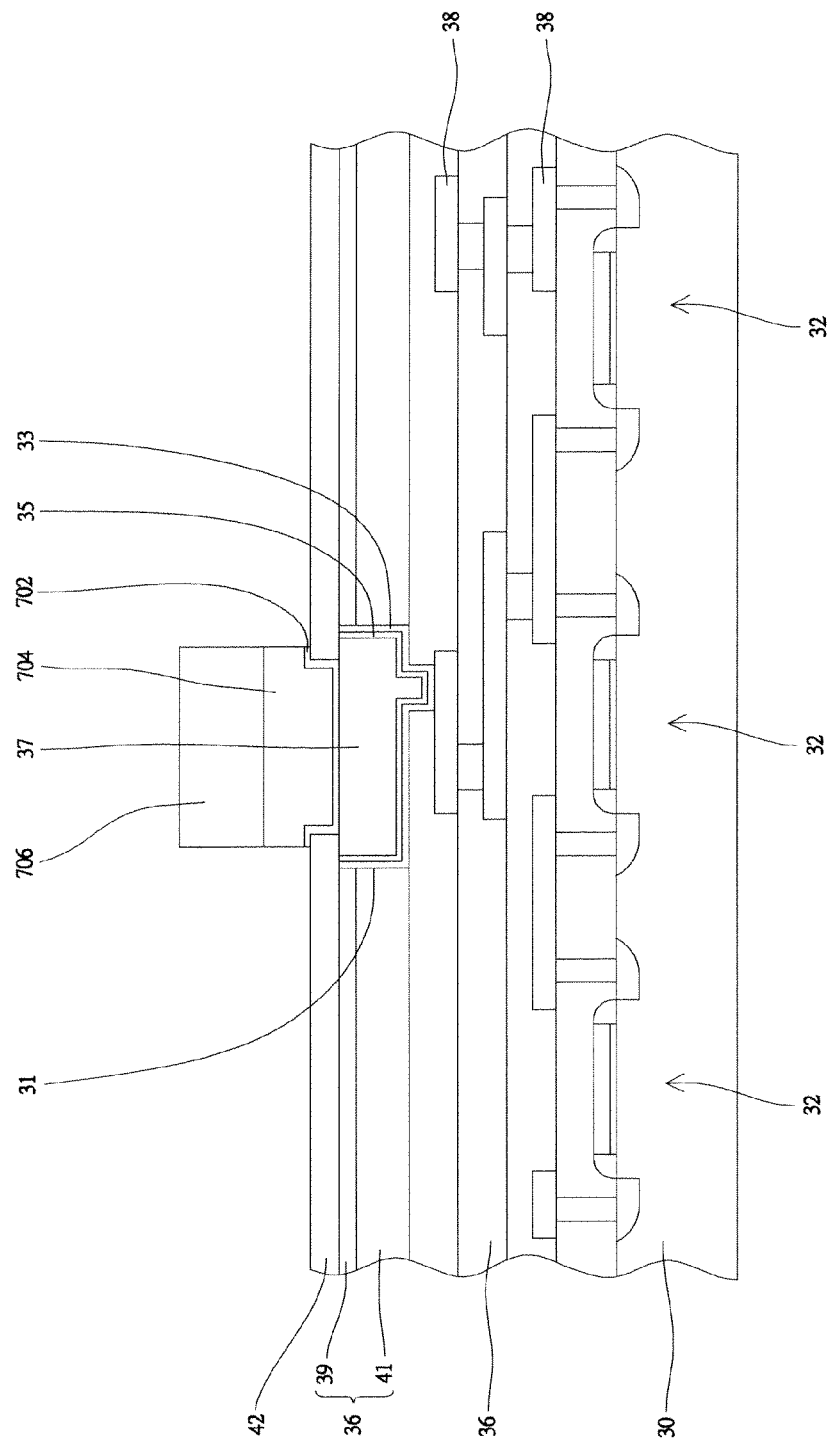
Figure 50:
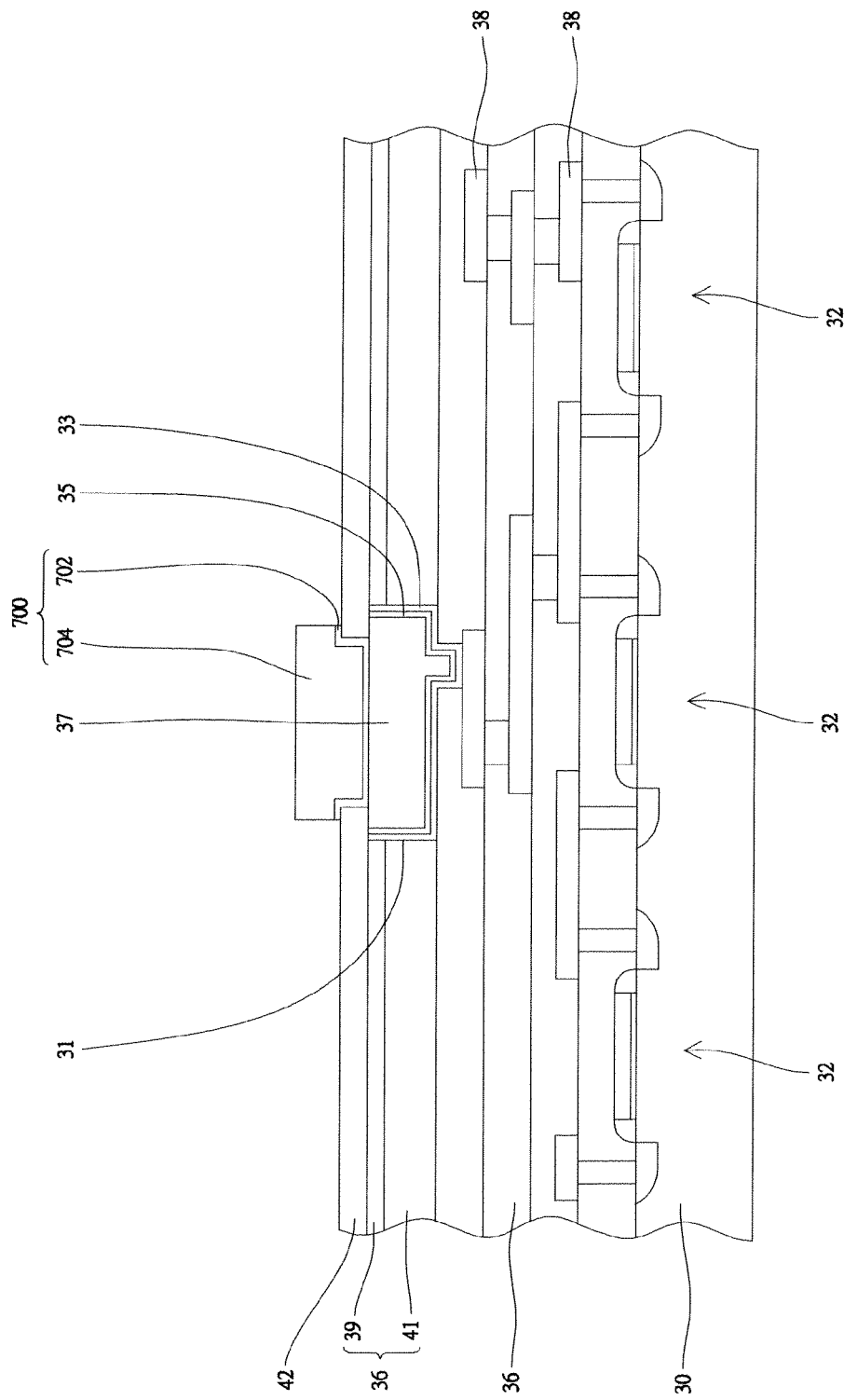

Referring to FIGS. 47-51, it is an optional process to form the metal cap 700. The metal cap 700 can be deposited by sputtering or evaporating an adhesion/barrier layer 702 of titanium, tungsten, cobalt, nickel, titanium nitride, a titanium-tungsten alloy, vanadium, chromium, copper, a chromium-copper alloy, tantalum, tantalum nitride, having a thickness of between 0.05 and 0.5 microns, on the copper pad 37 and on the passivation layer 42, as shown in FIG. 47, next sputtering or evaporating a metal layer 704 of aluminum, gold, silver, palladium, platinum, rhodium, ruthenium, rhenium, a tin-lead alloy or a tin-silver alloy, having a thickness of between 0.5 and 2 microns, on the adhesion/barrier layer 702, as shown in FIG. 47, next, forming a patterned photoresist layer 706 on the metal layer 704, wherein the patterned photoresist layer 706 covers the metal layer 704 over the copper pad 37, as shown in FIG. 48, next wet etching or dry etching the metal layer 704 not under the patterned photoresist layer 706, as shown in FIG. 49, next, wet etching or dry etching the adhesion/barrier layer 702 not under the patterned photoresist layer 706, as shown in FIG. 49, and next removing the patterned photoresist layer 706, as shown in FIG. 50.

Figure 51:
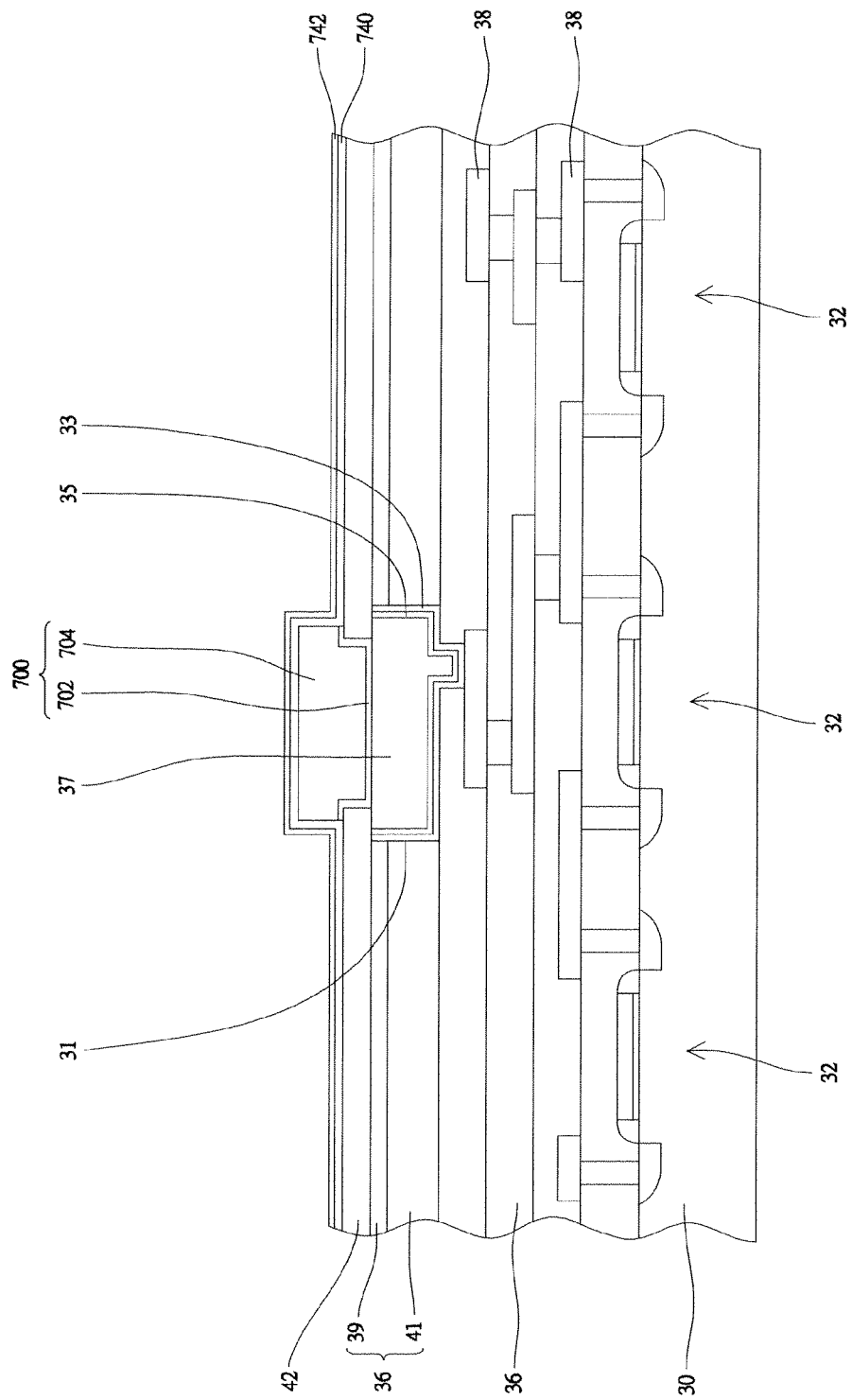

After forming the metal cap 700, a metal pad or metal bump can be formed on the metal cap 700. Referring to FIG. 51, an adhesion/barrier layer 740 may be formed as the step of forming the above-mentioned adhesion/barrier layer 340, 440, 540 or 640 on the passivation layer 42 and on the metal cap 700. Next, a seed layer 742 may be formed as the step of forming the above-mentioned seed layer 342, 442, 542 or 642 on the adhesion/barrier layer 340, 440, 540 or 640, respectively. If the adhesion/barrier layer 740 is copper, the step of forming the seed layer 742 of copper can be omitted.

Figure 52:
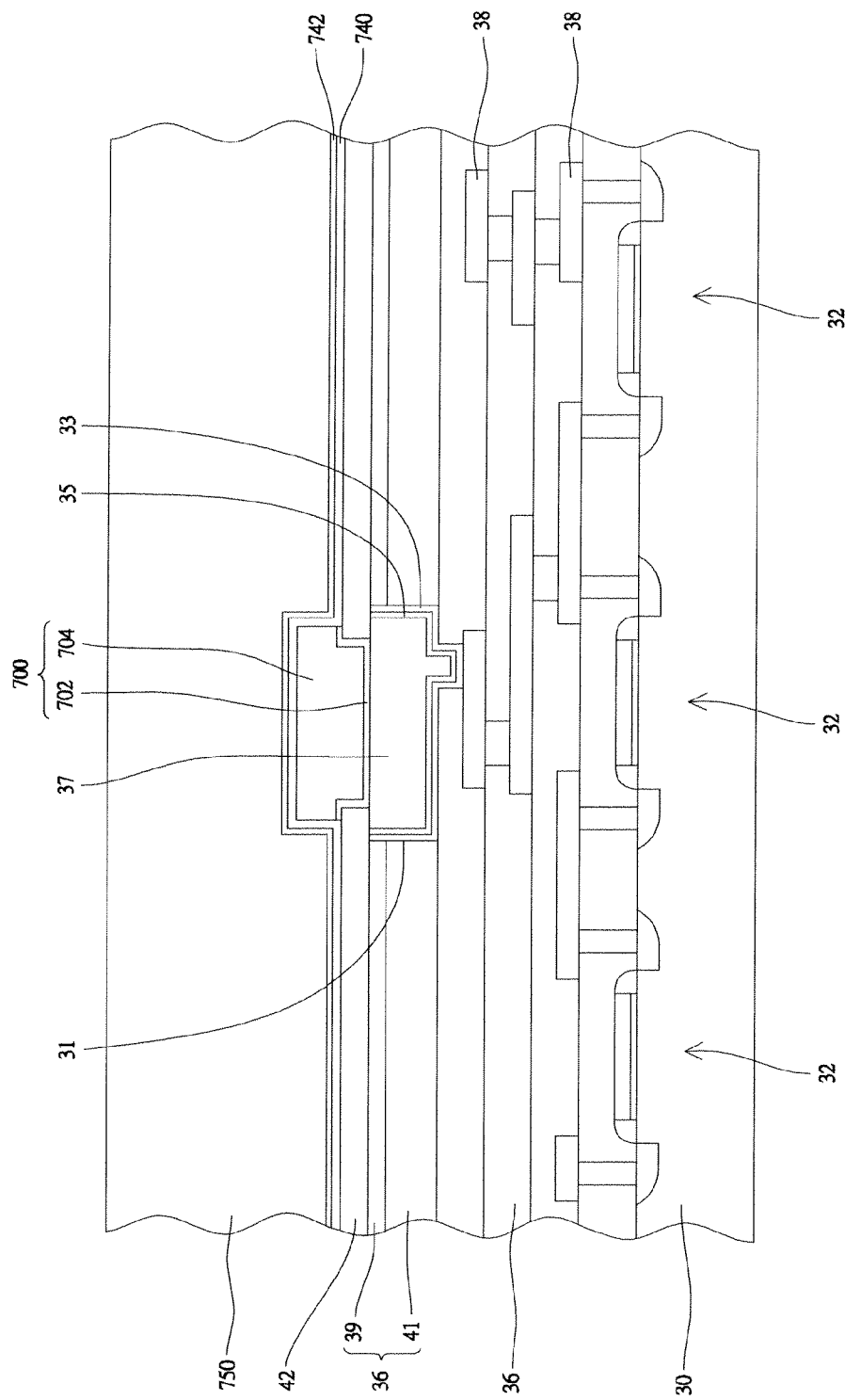

Next, referring to FIG. 52, a positive-type photoresist layer 750, such as napthoquinone diazide, photosensitive polyimide, photosensitive benzo-cyclo-butene (BCB), photosensitive parylene-based material, photosensitive epoxy-based material, with a thickness t9 of between 4 and 30 microns, is formed on the seed layer 742 using a spin coating process.

Figure 53:
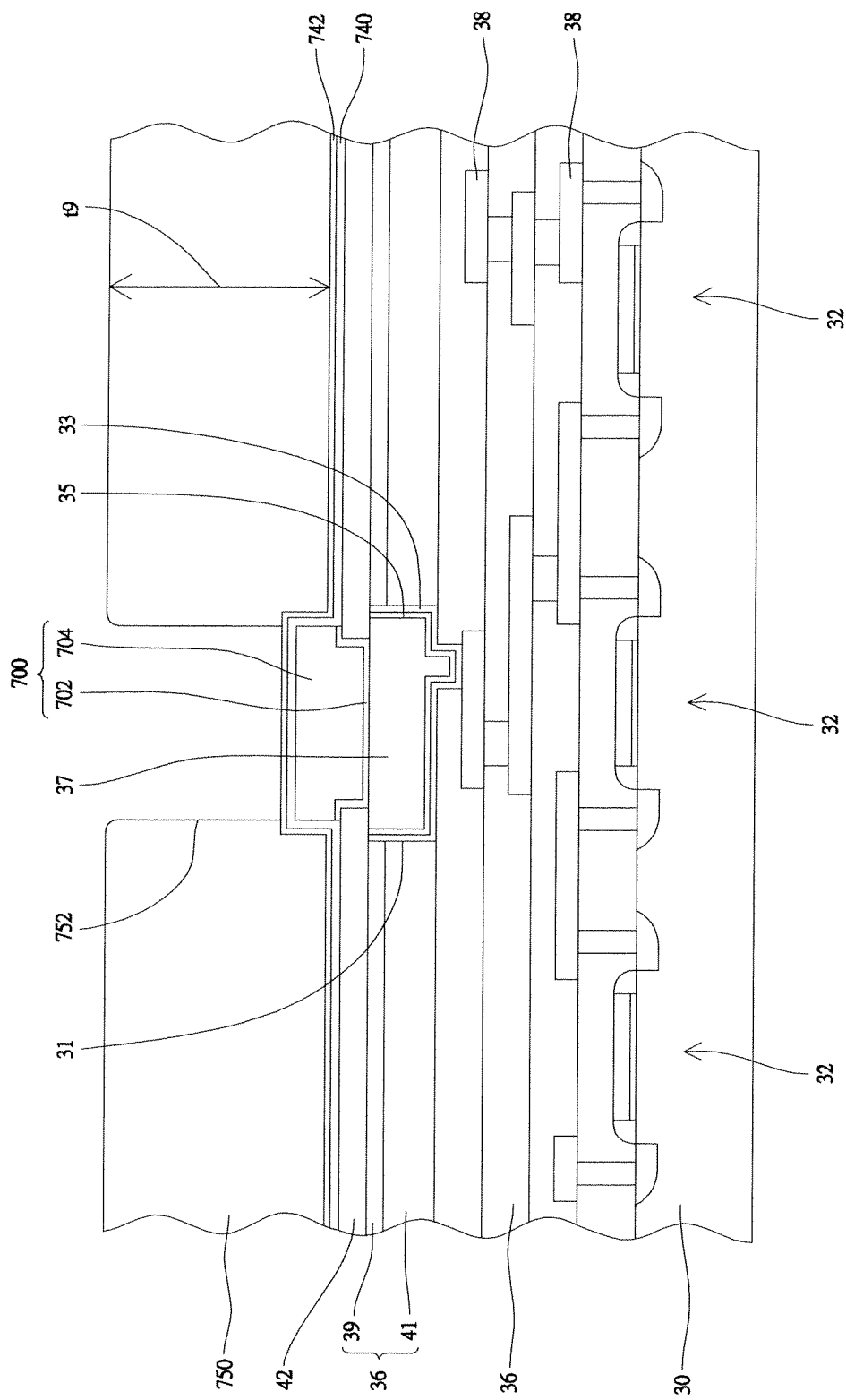

Next, referring to FIG. 53, a photolithography process including exposing and developing steps is used to pattern the photoresist layer 750 and to form an opening 752, with a bump pattern or pad pattern from a top view, in the photoresist layer 750 exposing the seed layer 742. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used.

Figure 54:
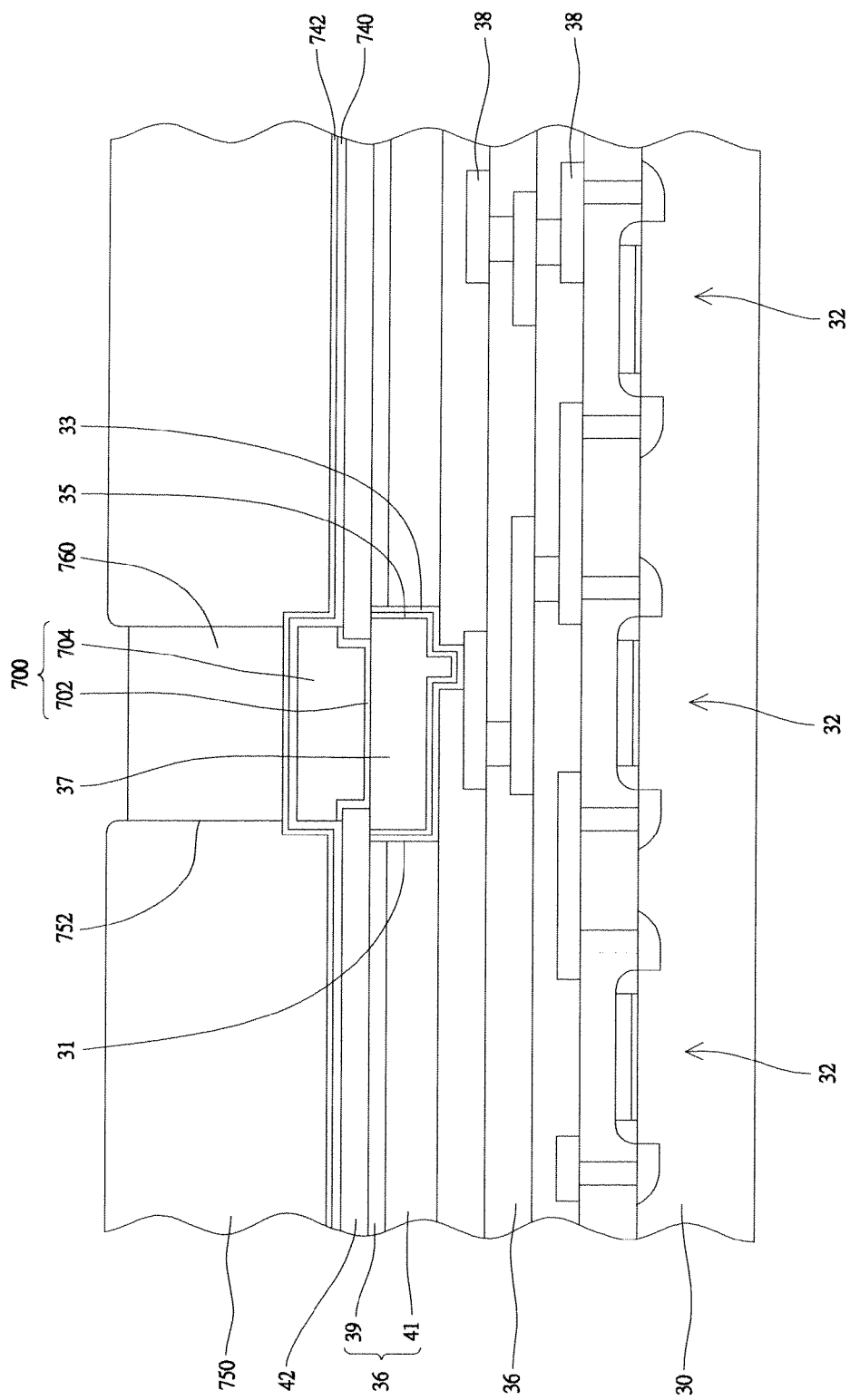

Next, referring to FIG. 54, a metal layer 760 deposited on the seed layer 742 exposed by the opening 752 in the photoresist layer 750 may be formed as the step of forming the above-mentioned metal layers 360, 362 and 364 on the seed layer 342 exposed by the opening 352 in the photoresist layer 350, as the step of forming the above-mentioned metal layer 464 on the seed layer 442 exposed by the opening 452 in the photoresist layer 450, as the step of forming the above-mentioned metal layers 560 and 564 on the seed layer 542 exposed by the opening 552 in the photoresist layer 550, or as the step of forming the above-mentioned metal layers 660, 662, 663 and 664 on the seed layer 642 exposed by the opening 652 in the photoresist layer 650.

Figure 55:
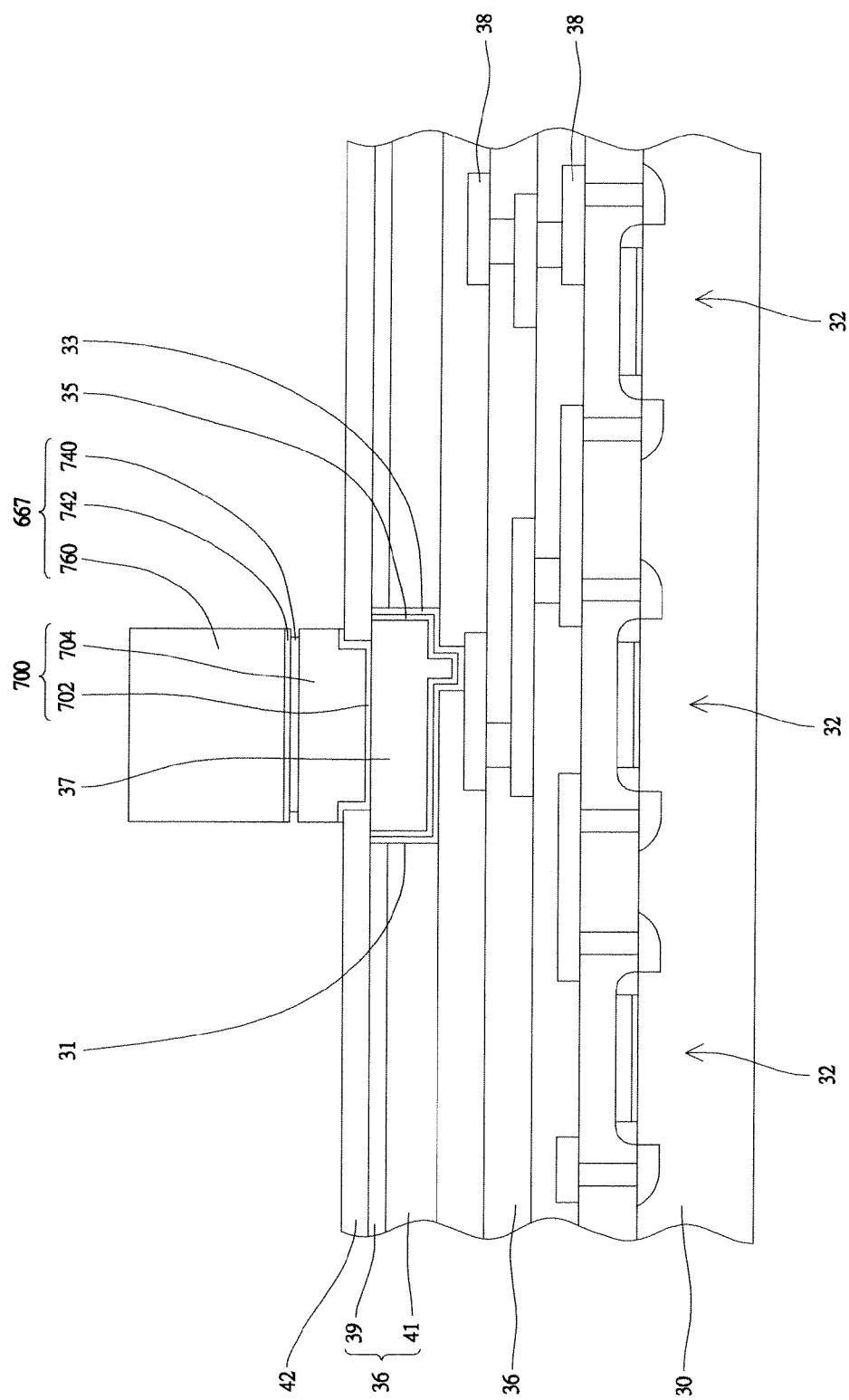

Next, referring to FIG. 55, the photoresist layer 750 is stripped. Next, the seed layer 742 not under the metal layer 760 is removed using a dry etching process or a wet etching process. If the seed layer 742 is gold and removed by a wet etching process, the etchant for etching the seed layer 742 is potassium iodide. Thereafter, the adhesion/barrier layer 740 not under the metal layer 760 is removed using a dry etching process or a wet etching process. If the adhesion/barrier layer 740 is a titanium tungsten alloy and removed by a wet etching process, the etchant for etching the adhesion/barrier layer 740 is hydrogen peroxide or hydrofluoric acid. If the adhesion/barrier layer 740 is titanium and removed by a wet etching process, the etchant for etching the adhesion/barrier layer 740 is hydrofluoric acid. Thereafter, a cutting process can be used to divide the semiconductor wafer having the above-mentioned metal pad or metal bump 767 formed thereover into multiple semiconductor chips. Thereafter, the semiconductor chips can be used for a packaging process, such as tape-automated-bonding (TAB) process, chip-on-glass (COG) process or chip-on-film (COF) process, as mentioned below.

Figure 55A:
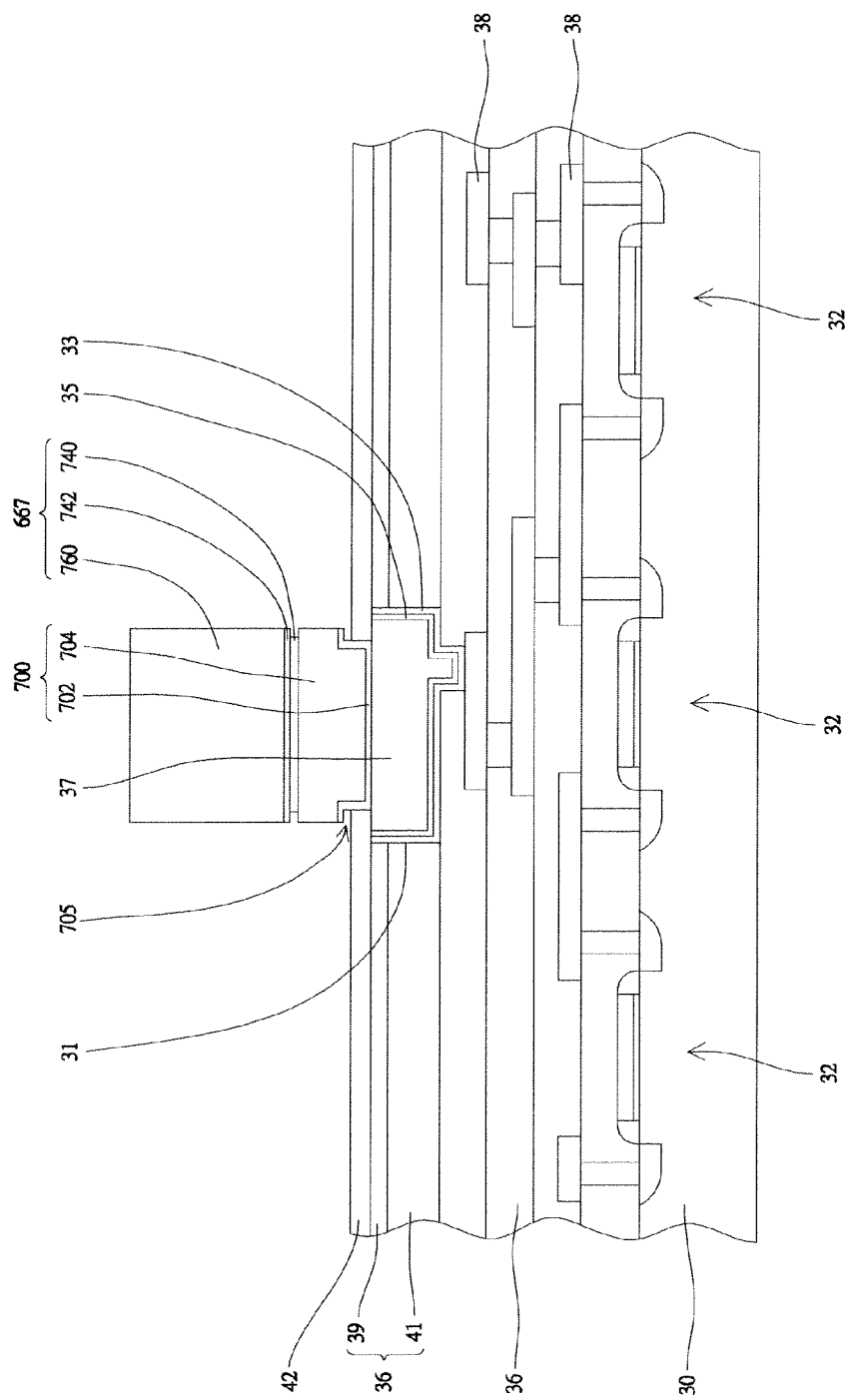

Referring to FIG. 55A, it is an optional process to etch the topmost layer, such as silicon-oxide layer, of the passivation layer 42. If the passivation layer 42 is deposited by forming a silicon oxy-nitride layer with a thickness of between 0.05 and 0.15 μm on the copper pad 42 and on the insulating layer 42 with a CVD method, next forming a first silicon oxide layer with a thickness of between 0.2 and 1.2 μm on the silicon oxy-nitride layer with a CVD method, next forming a silicon nitride layer with a thickness of between 0.2 and 1.2 μm on the first silicon oxide layer with a CVD method, and next forming a second silicon oxide layer with a thickness of between 0.2 and 1.2 μm on the silicon nitride layer with a CVD method, as above described in the eleventh method for forming the passivation layer 42, the second silicon oxide layer of the passivation layer 42 may be etched after forming the metal bump or metal pad 667. Thereby, the residuals remaining on the passivation layers during forming the metal bump or metal pad 667 can be removed. Therefore, the metal bridge issue can be resolved. After removing the second silicon oxide layer of the passivation layer 42, there exists a gap, having a height of between 0.2 and 1.2 microns, between the adhesion/barrier layer 702 and the nitride layer of the passivation layer 42

When the metallization structure formed for the metal layers 740, 742 and 760 is used as a metal bump 767, the metal bump 767 can be used to be TAB bonded thereto, as shown in FIGS. 10 and 55. The metal bump 767 can be bonded on a tin-containing layer 377, such as a tin-lead alloy or a tin-silver alloy, which is formed on the inner leads 372 before the metal bump 767 is connected to the tin-containing layer 377 on the inner leads 372. After the metal bump 767 is connected to the tin-containing layer 377 on the inner leads 372, a polymer layer 379, such as polyimide or benzo-cyclo-butene (BCB), is filled into the opening 374 in the tape 340 and covers the metal bump 767 and the inner leads 372.

Alternatively, the metal bump 767 can be applied to a chip-on-glass (COG) package, as shown in FIGS. 11 and 55. Before the metal bump 767 is connected to the circuitry component 380, an anisotropic conductive paste (ACP) or anisotropic conductive film (ACF) 386 having a polymer layer 385 and multiple metal particles 387 mixed with the polymer layer 385 is formed on the glass substrate 382 and the transparent conductive trace 384. Next, the metal bump 767 is pressed into the ACP or ACF 386 such that the bump 767 can be electrically connected to the transparent conductive trace 384 through the metal particles 387 in the ACP or ACF 386.

Alternatively, the metal bump 767 can be applied to a chip-on-film (COF) package, as shown in FIGS. 12 and 55. The metal bump 767 can be bonded on a tin-containing layer 398, such as a tin-lead alloy or a tin-silver alloy, which is formed on the metal trace 392 before the metal bump 767 is connected to the tin-containing layer 398 on the metal trace 392. After the metal bump 767 is connected to the tin-containing layer 398 on the metal trace 392, a polymer layer 399, such as polyimide or benzo-cyclo-butene (BCB), is filled into the gap between the semiconductor chip and the flexible circuit film 390 and covers the metal bump 767.

Alternatively, the metal bump 767 formed on the metal cap 700 can be used to be bond onto a printed circuit board, ceramic substrate or other semiconductor wafer or chip.

If the metallization structure formed for the metal layers 740, 742 and 760 is used as a metal pad 767, a patterned polymer layer (not shown) can be optionally formed on the passivation layer 42 and on the peripheral region of the metal pad 767. The metal pad 767 can be used for being wirebonded thereto or having a gold bump or solder bump formed thereover. A gold wire can be connected to the metal pad 767 using a wirebonding process. Alternatively, a gold bump or tin-containing bump, not shown, can be formed over the metal pad 767.

Alternatively, the above mentioned metallization structure can be used for forming a metal trace over a passivation layer 42. The elements shown in FIGS. 56-67 having same reference numbers as those shown in FIGS. 1-46 indicate similar ones described above in FIGS. 1-46.

Figure 56:
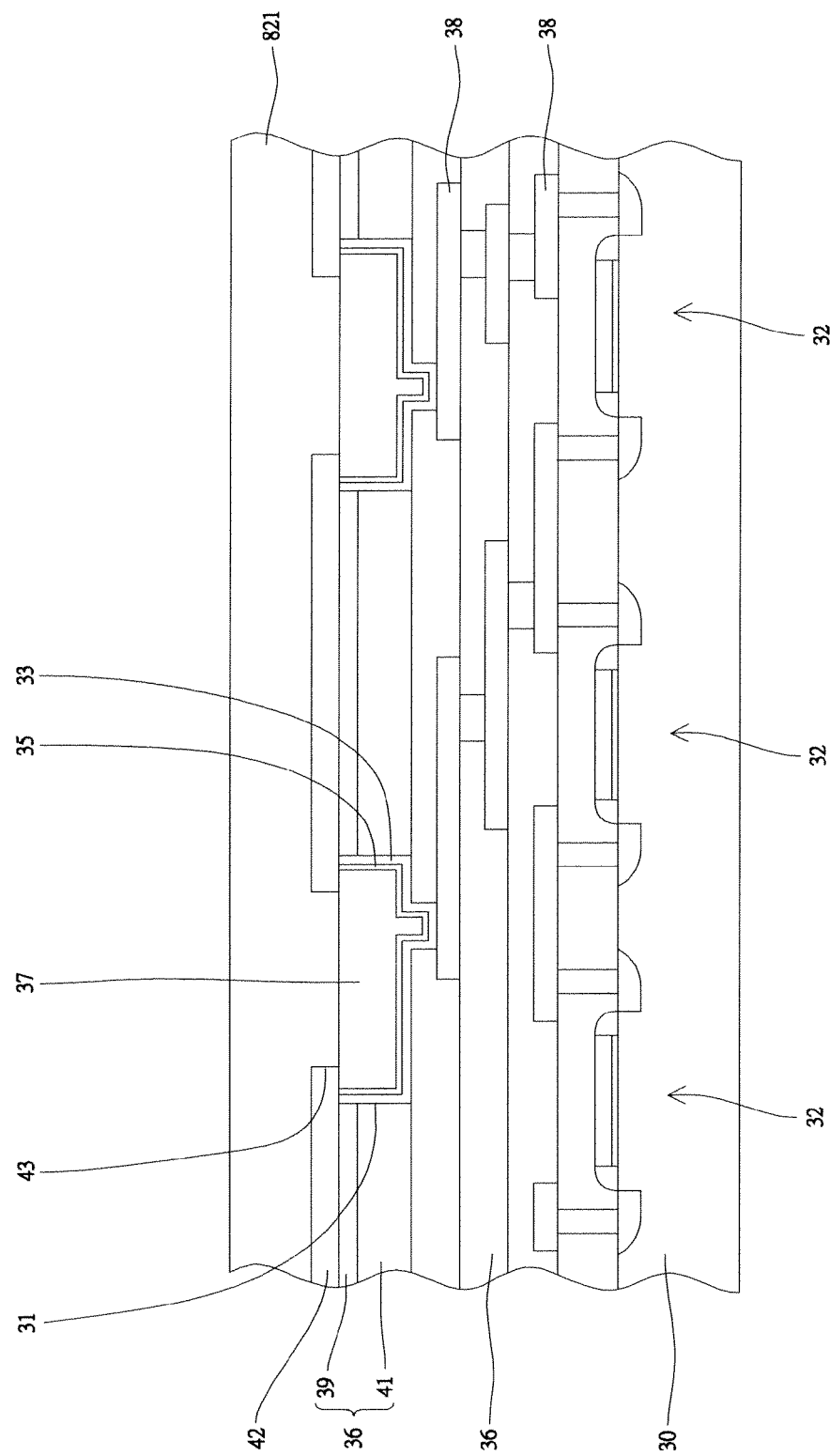
FIGS. 56-67 are cross-sectional views showing a process of forming a metal trace according to a sixth embodiment.
Figure 57:
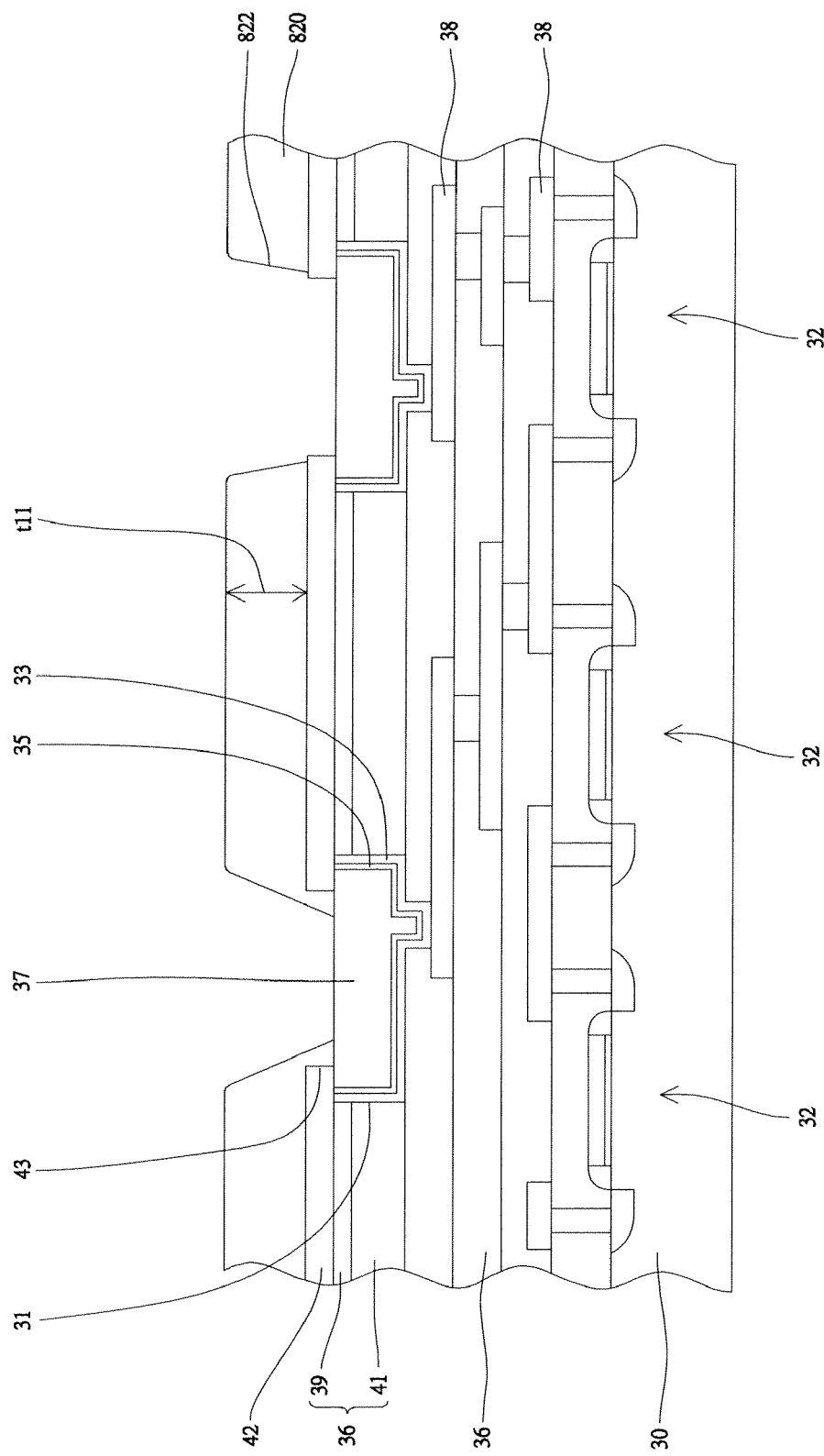

Referring to FIGS. 56-57, it is an optional process to form a patterned polymer layer 820 on the passivation layer 42. The patterned polymer layer 820 can be formed by spin coating a polymer layer 821 of polyimide, benzo-cyclo-butene (BCB), parylene-based material, epoxy-based material, or elastomer, with a thickness of between 2 and 50 microns, and preferably between 8 and 30 microns, on the passivation layer 42.

Next, if the spin-coated polymer layer 821 is photosensitive, a photolithography process including exposing and developing steps can be used to form openings 822 in the spin-coated polymer layer 821, shown as the patterned polymer layer 820 in FIG. 57. Next, the polymer layer 820 is cured at the temperature of 300 and 450 degrees centigrade if the spin-coated first polymer layer is polyimide. The patterned polymer layer 820 after being cured may have a thickness t11 of between 2 and 50 microns, and preferably between 6 and 20 microns. The openings 822 in the polymer layer 820 expose the copper pads 37. The copper pads 37 have a region exposed by the opening in the passivation, possibly being covered with the polymer layer 820, shown as the left copper pad 37, or not being covered with the polymer layer 820, shown as the right copper pad 37.

If the spin-coated polymer layer 821 is non-photosensitive, photolithography and etching processes are typically needed to pattern the spin-coated polymer layer 821.

Alternatively, the patterned polymer layer 820 can be formed by screen printing a patterned polymer layer of polyimide, benzocyclobutene (BCB), parylene-based material or epoxy-based material, with a thickness of between 5 and 50 microns on the passivation layer 42, and then curing the screen-printed polymer layer at the temperature of 300 and 450 degrees centigrade if the screen-printed polymer layer is polyimide. Alternatively, the patterned first polymer layer 820 can be formed by laminating a patterned dry film of polyimide, benzocyclobutene (BCB), parylene-based material or epoxy, with a thickness of between 10 and 500 microns on the passivation layer 42.

If the patterned polymer layer 820 is not thick enough, another patterned polymer layer (not shown) can be formed on the patterned polymer layer 820.

Figure 58:
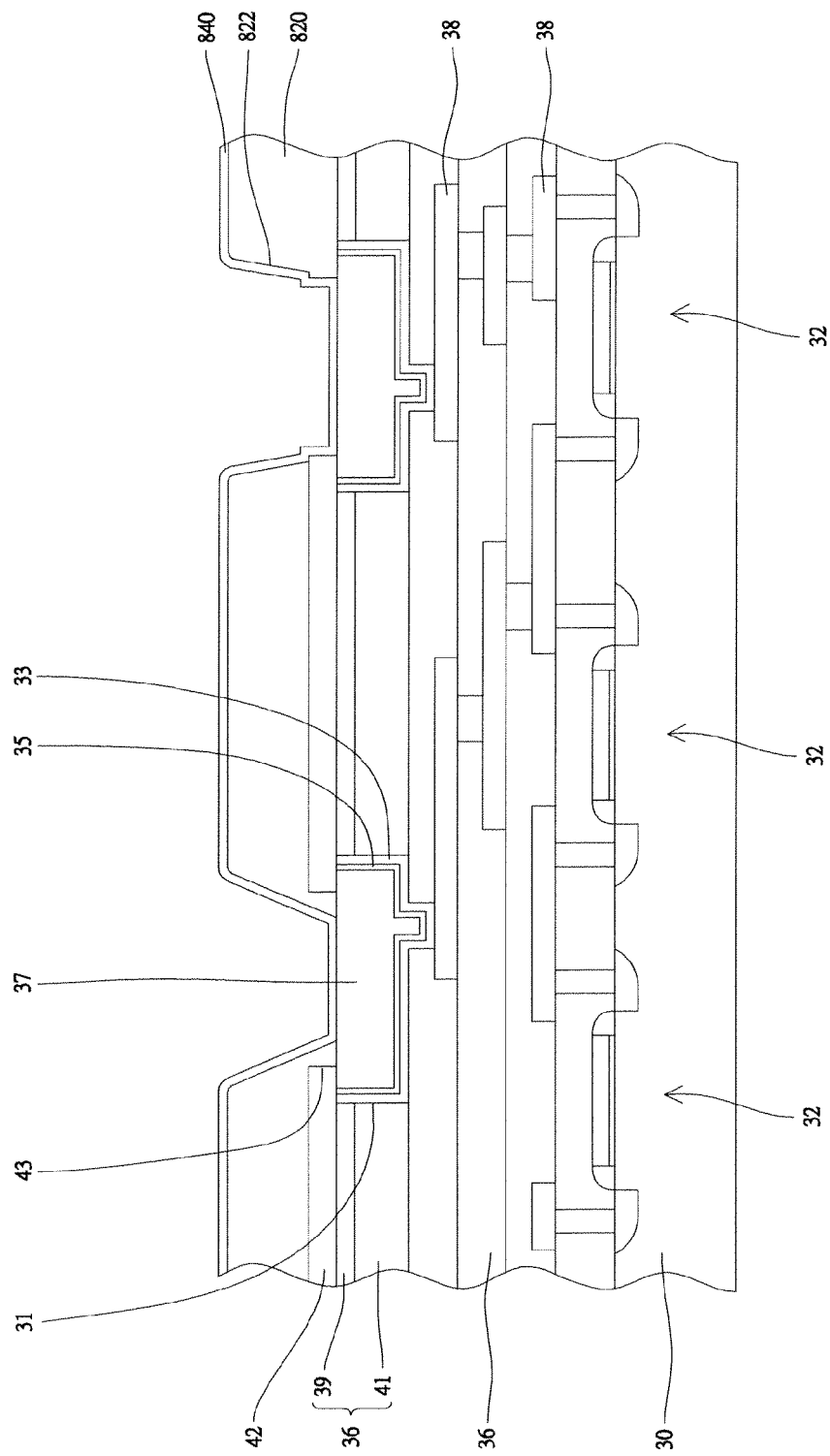
Figure 59:
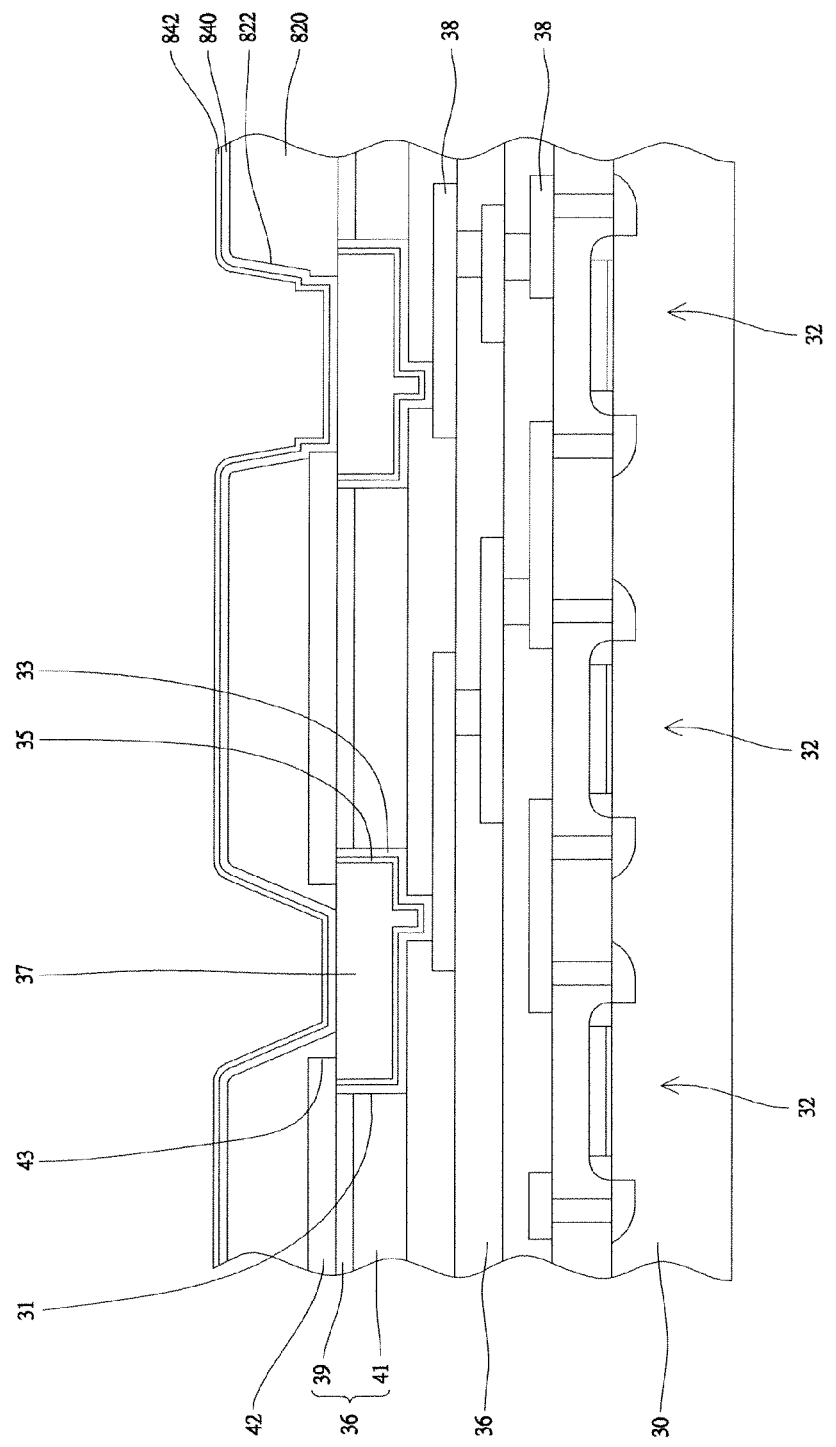

After forming the patterned polymer layer 820, referring to FIG. 58, an adhesion/barrier layer 840 may be formed as the step of forming the above-mentioned adhesion/barrier layer 340, 440, 540 or 640 on the patterned polymer layer 820 and on the copper pad 37. Next, referring to FIG. 59, a seed layer 742 may be formed as the step of forming the above-mentioned seed layer 342, 442, 542 or 642 on the adhesion/barrier layer 340, 440, 540 or 640, respectively. If the adhesion/barrier layer 840 is copper, the step of forming the seed layer 842 of copper can be omitted.

Figure 60:
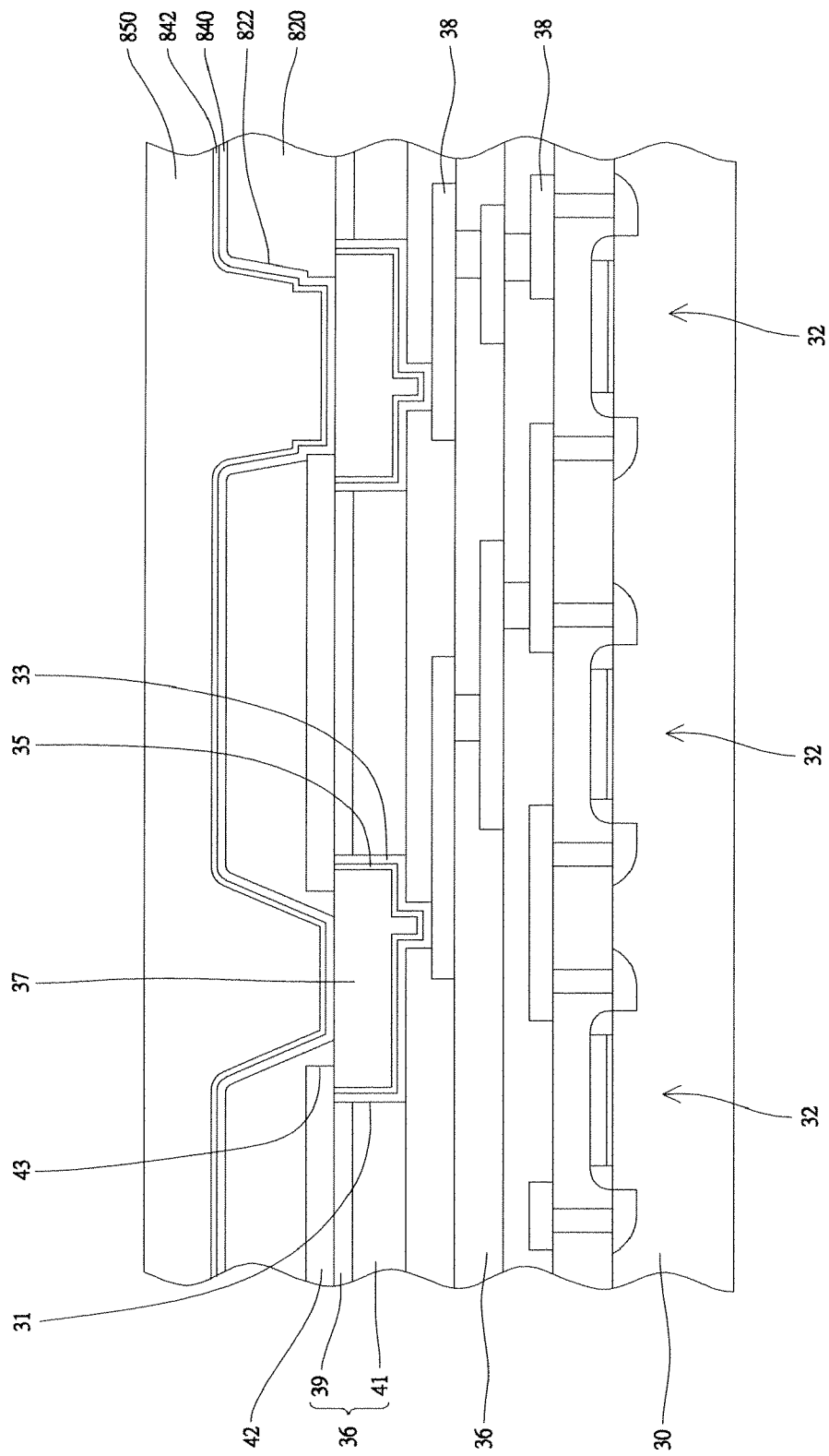

Next, referring to FIG. 60, a positive-type photoresist layer 850, such as napthoquinone diazide, photosensitive polyimide, photosensitive benzo-cyclo-butene (BCB), photosensitive parylene-based material, photosensitive epoxy-based material, with a thickness t12 of between 4 and 30 microns, is formed on the seed layer 842 using a spin coating process.

Figure 61:
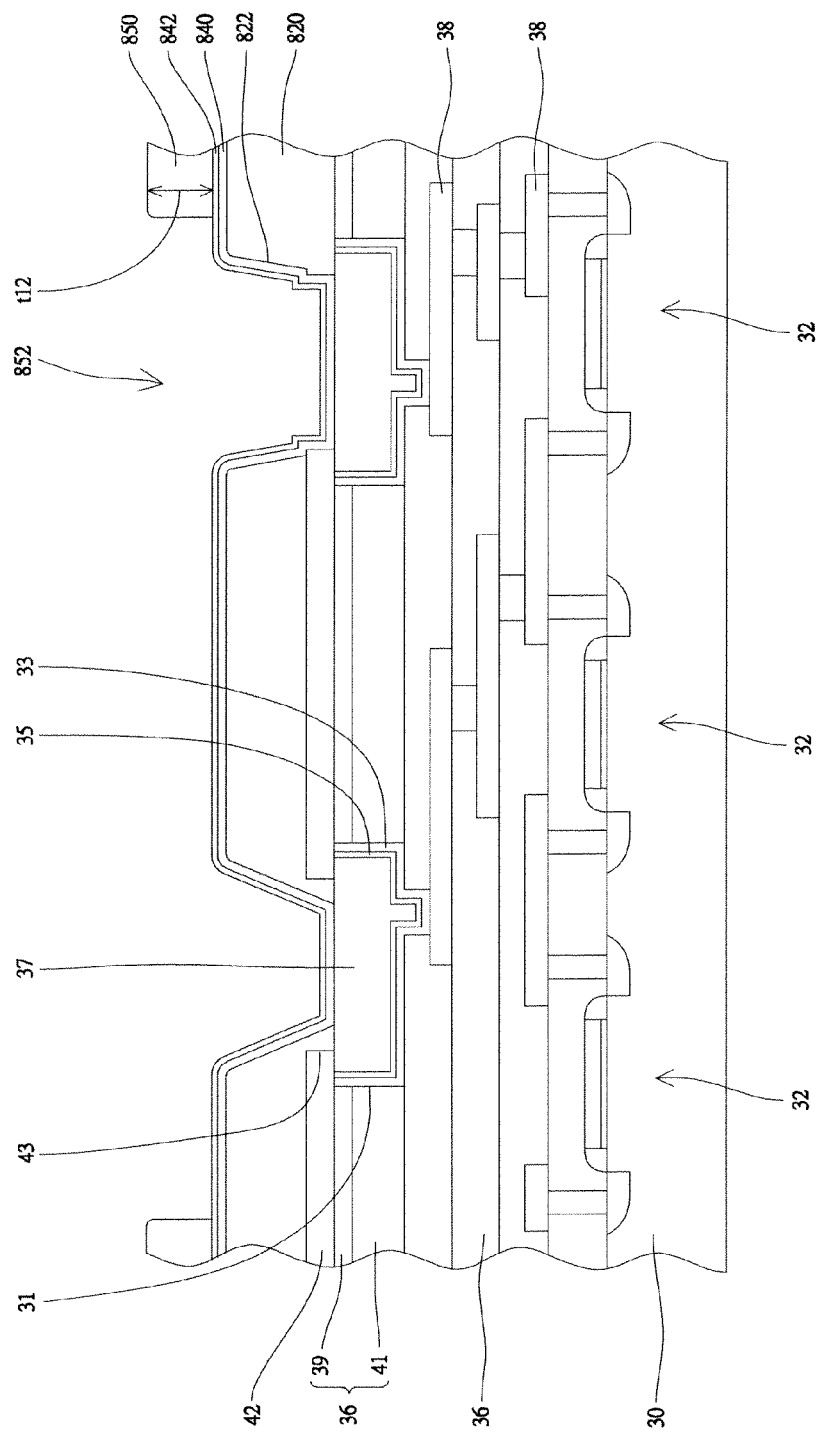

Next, referring to FIG. 61, a photolithography process including exposing and developing steps is used to pattern the photoresist layer 850 and to form an opening 852, with a bump pattern or pad pattern from a top view, in the photoresist layer 850 exposing the seed layer 842. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used.

Figure 62:
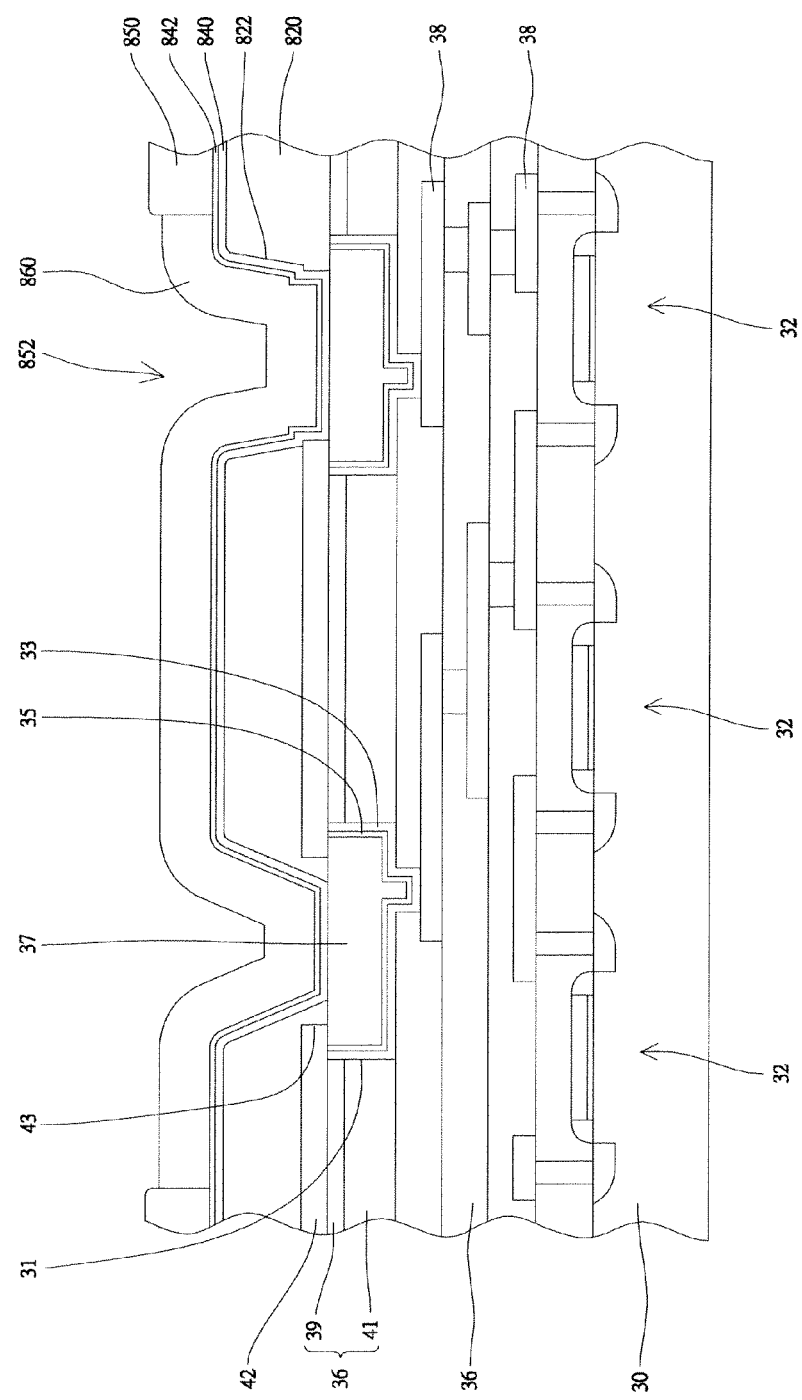

Next, referring to FIG. 62, a metal layer 860 deposited on the seed layer 842 exposed by the opening 852 in the photoresist layer 850 may be formed as the step of forming the above-mentioned metal layers 360, 362 and 364 on the seed layer 342 exposed by the opening 352 in the photoresist layer 350, as the step of forming the above-mentioned metal layer 464 on the seed layer 442 exposed by the opening 452 in the photoresist layer 450, as the step of forming the above-mentioned metal layers 560 and 564 on the seed layer 542 exposed by the opening 552 in the photoresist layer 550, or as the step of forming the above-mentioned metal layers 660, 662, 663 and 664 on the seed layer 642 exposed by the opening 652 in the photoresist layer 650.

Figure 63:
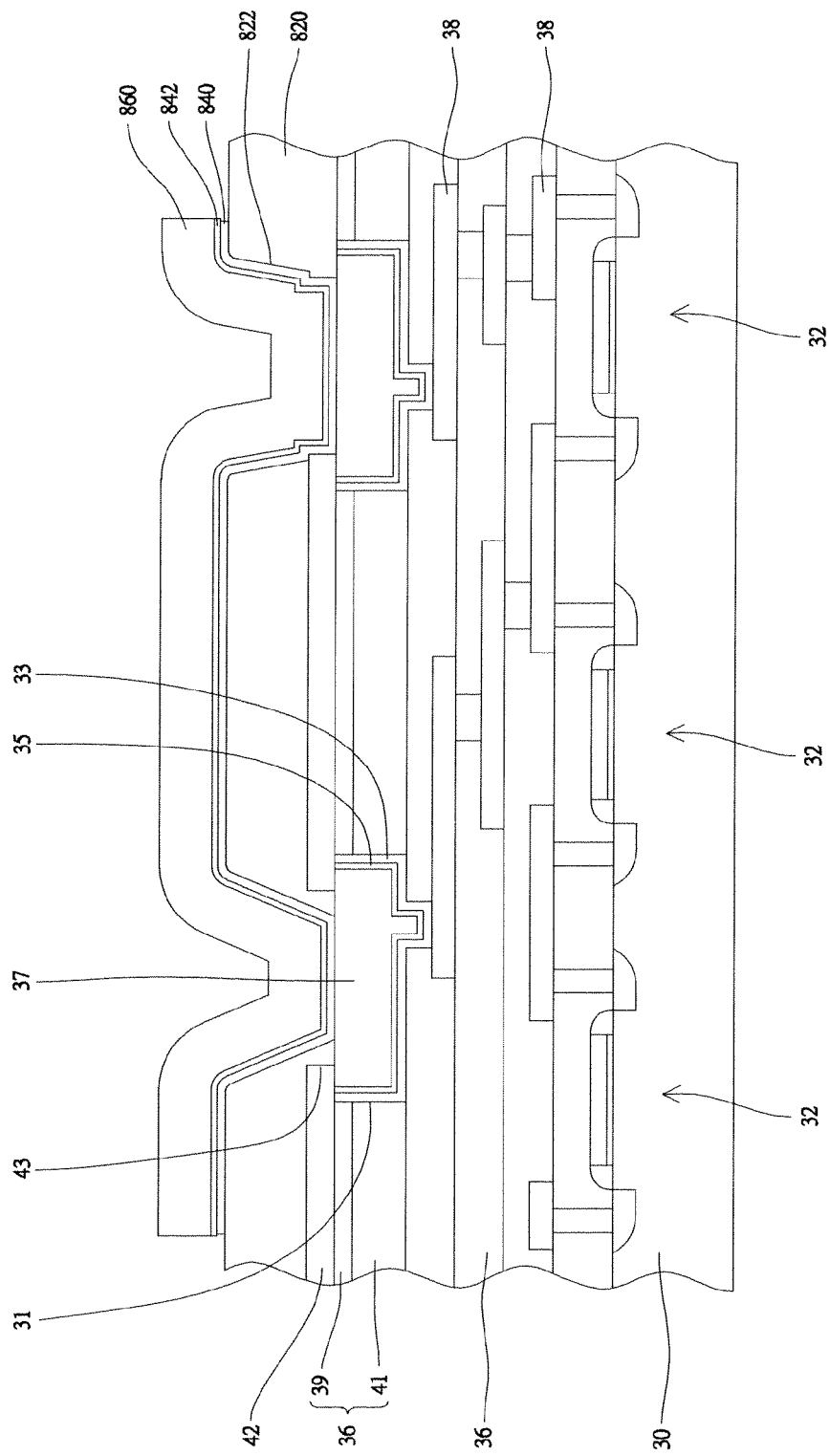

Next, referring to FIG. 63, the photoresist layer 850 is stripped. Next, the seed layer 842 not under the metal layer 860 is removed using a dry etching process or a wet etching process. If the seed layer 842 is gold and removed by a wet etching process, the etchant for etching the seed layer 842 is potassium iodide. Thereafter, the adhesion/barrier layer 840 not under the metal layer 860 is removed using a dry etching process or a wet etching process. If the adhesion/barrier layer 840 is a titanium tungsten alloy and removed by a wet etching process, the etchant for etching the adhesion/barrier layer 840 is hydrogen peroxide or hydrofluoric acid. If the adhesion/barrier layer 840 is titanium and removed by a wet etching process, the etchant for etching the adhesion/barrier layer 840 is hydrofluoric acid.

Figure 64:
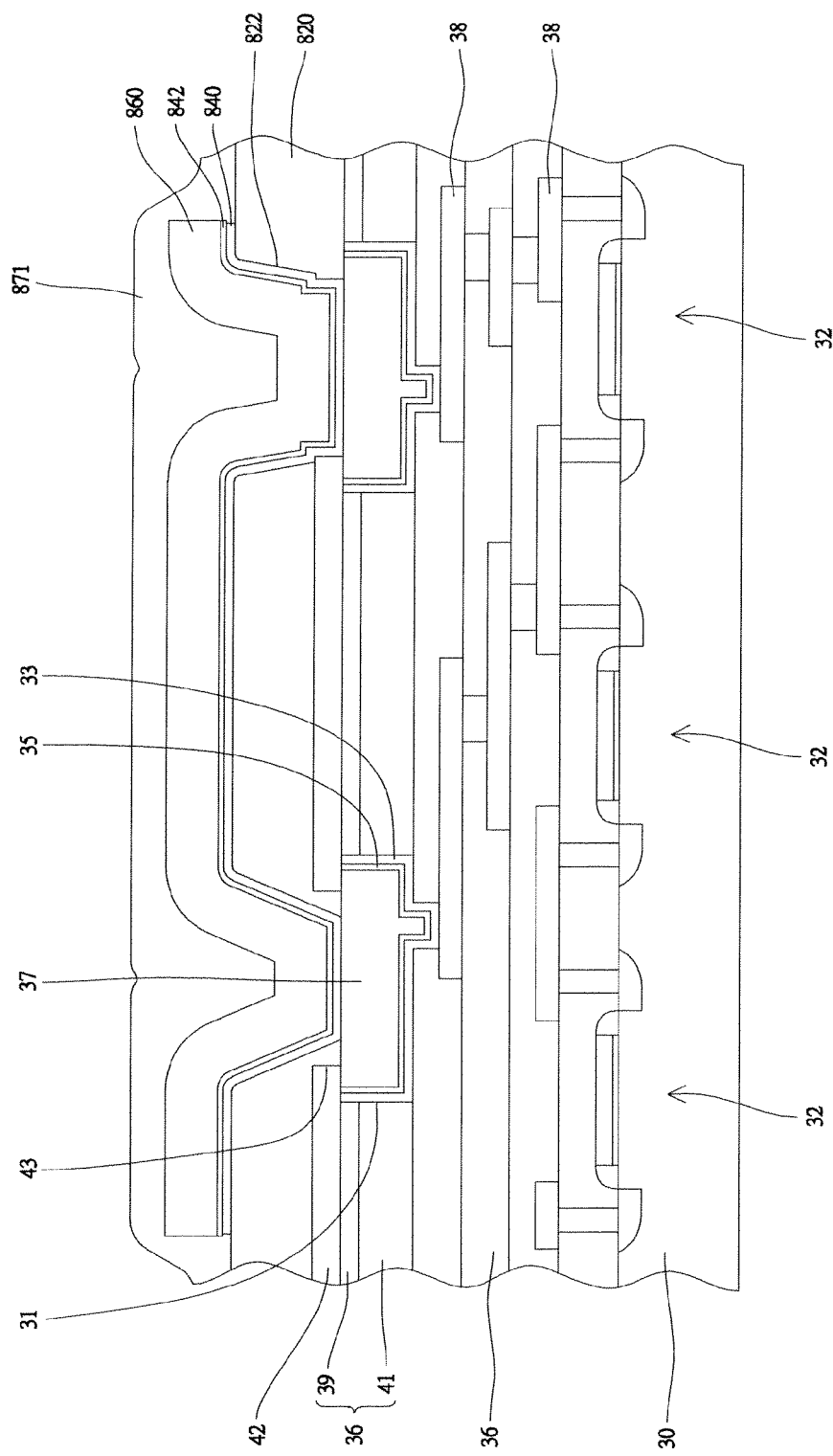
Figure 65:
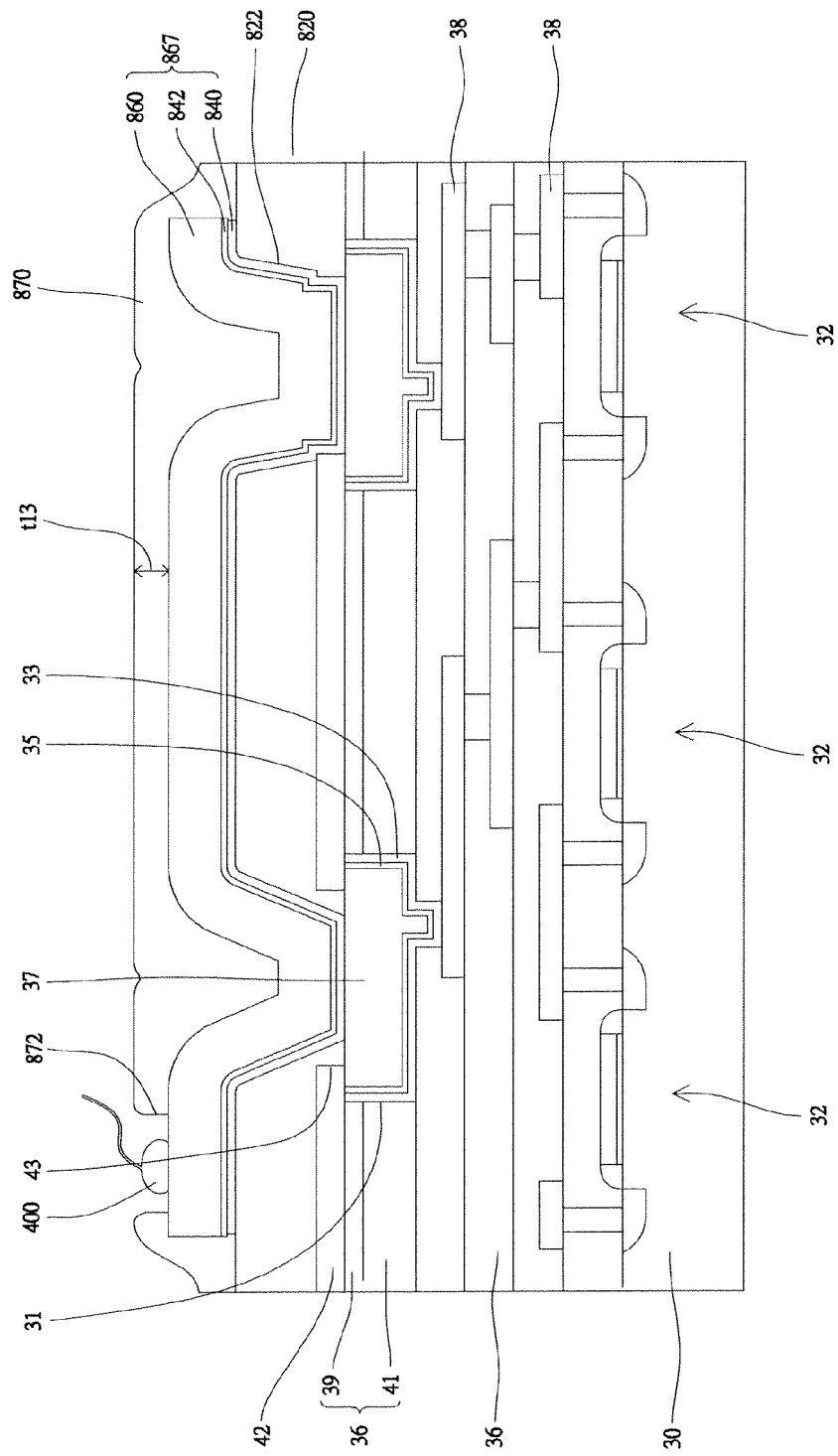

Referring to FIGS. 64-65, it is an optional process to form a patterned polymer layer 870 on the metal layer 860 and on the patterned polymer layer 820. The patterned polymer layer 870 can be formed by spin coating a polymer layer 871 of polyimide, benzo-cyclo-butene (BCB), parylene-based material, epoxy-based material, or elastomer, with a thickness of between 2 and 50 microns, and preferably between 8 and 30 microns, on the passivation layer 42.

Next, if the spin-coated polymer layer 871 is photosensitive, a photolithography process including exposing and developing steps can be used to form openings 872 in the spin-coated polymer layer 871, shown as the patterned polymer layer 870 in FIG. 65. Next, the polymer layer 870 is cured at the temperature of 300 and 450 degrees centigrade if the spin-coated first polymer layer is polyimide. The patterned polymer layer 870 after being cured may have a thickness t13 of between 2 and 50 microns, and preferably between 6 and 20 microns. The openings 872 in the polymer layer 870 expose the copper pads 37.

If the spin-coated polymer layer 871 is non-photosensitive, photolithography and etching processes are typically needed to pattern the spin-coated polymer layer 871.

Alternatively, the patterned polymer layer 870 can be formed by screen printing a patterned polymer layer of polyimide, benzocyclobutene (BCB), parylene-based material or epoxy-based material, with a thickness of between 5 and 50 microns on the passivation layer 42, and then curing the screen-printed polymer layer at the temperature of 300 and 450 degrees centigrade if the screen-printed polymer layer is polyimide. Alternatively, the patterned first polymer layer 870 can be formed by laminating a patterned dry film of polyimide, benzocyclobutene (BCB), parylene-based material or epoxy, with a thickness of between 10 and 500 microns on the passivation layer 42.

If the patterned polymer layer 870 is not thick enough, another patterned polymer layer (not shown) can be formed on the patterned polymer layer 870.

A gold wire 400 formed by a wirebonding process can be connected to the metal layer 860 exposed by the opening 872 in the polymer layer 870. Alternatively, a solder bump or gold bump may be formed on the metal layer 860 exposed by the opening 872 in the polymer layer 870.

The metal trace 867 formed of the metal layers 840, 841 and 860 may connect multiple separate copper pads 37 exposed by the opening in the passivation layer 42, as shown in FIG. 65.

Figure 66:
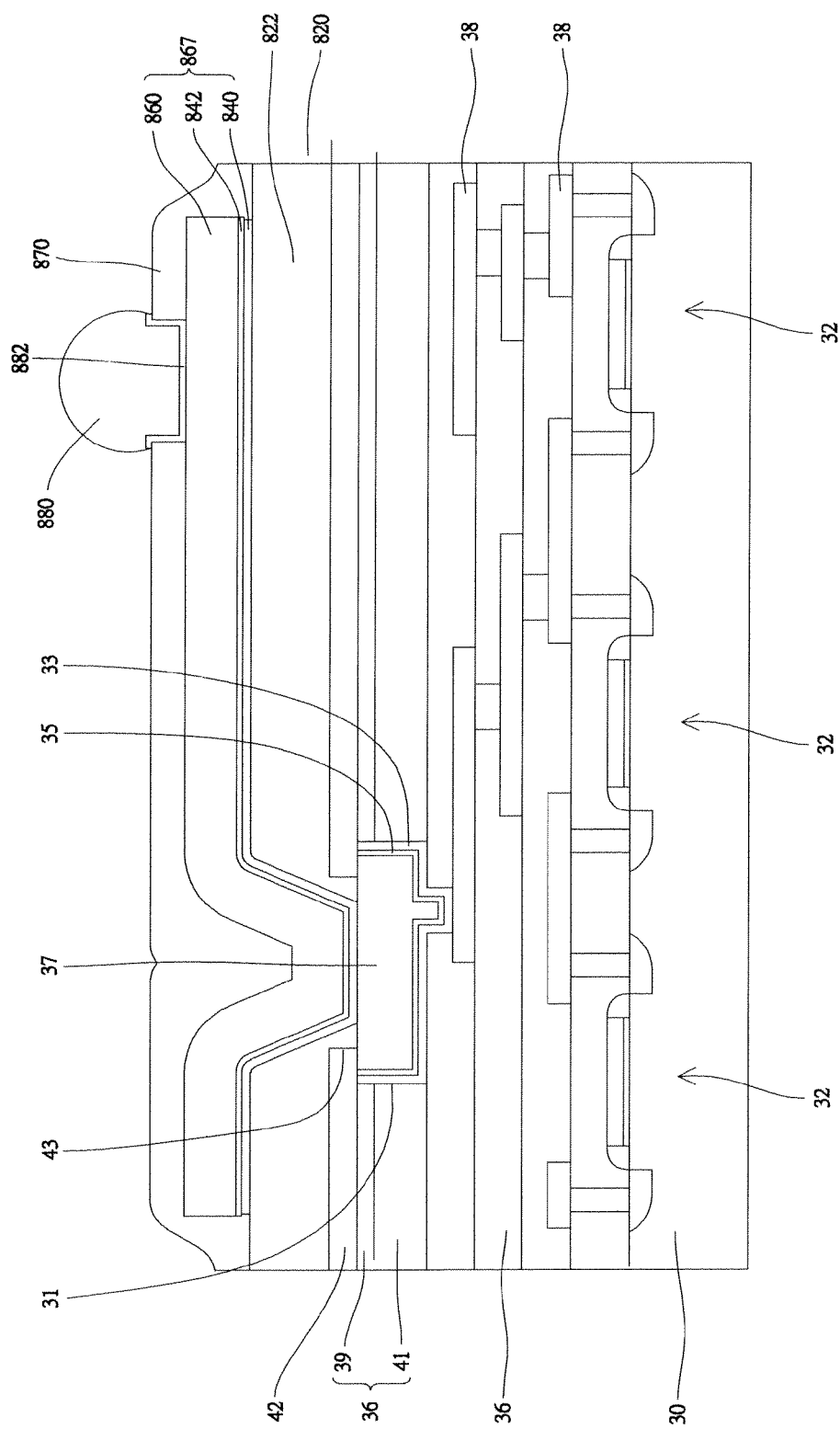

Alternatively, referring to FIG. 66, the metal trace 867 may be used as a redistribution trace. A solder bump 880 can be formed on the metal trace exposed by the opening 872 in the polymer layer 870. A under-bump-metal (UBM) layer 882, such as titanium, chromium, a titanium-tungsten alloy, nickel, vanadium, copper, is between the solder bump 880 and the metal trace 867. The metal trace connecting only one copper pad 37 and the solder bump 880.

Figure 67:
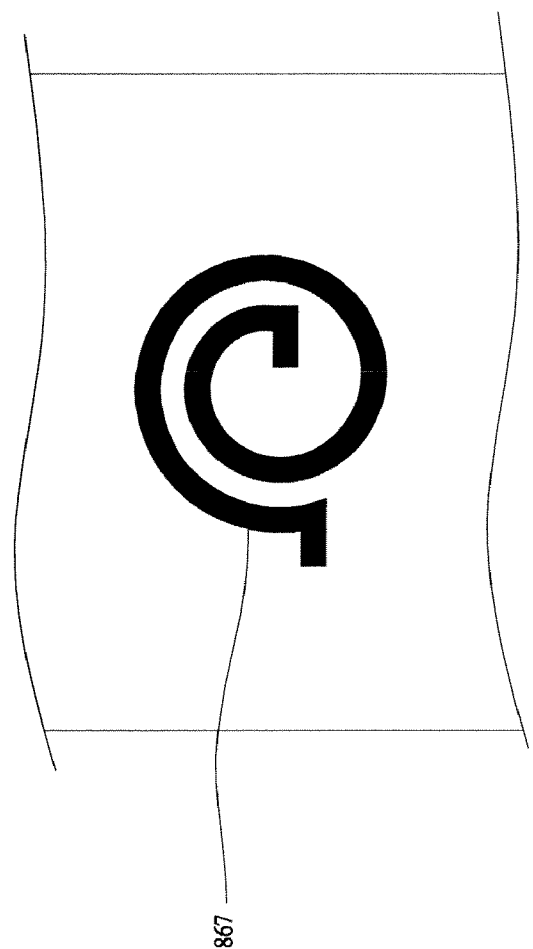

Alternative, the metal trace 867 may have a coil pattern, used as a part of transformer or an inductor, from a top view, as shown in FIG. 67.

Alternatively, two kinds of metal bumps or metal pads can be formed over the passivation layer 42 or copper pad 37, as shown in FIGS. 68-77. The elements shown in FIGS. 68-77 having same reference numbers as those shown in FIGS. 1-15 indicate similar ones described above in FIGS. 1-15.

Figure 68:
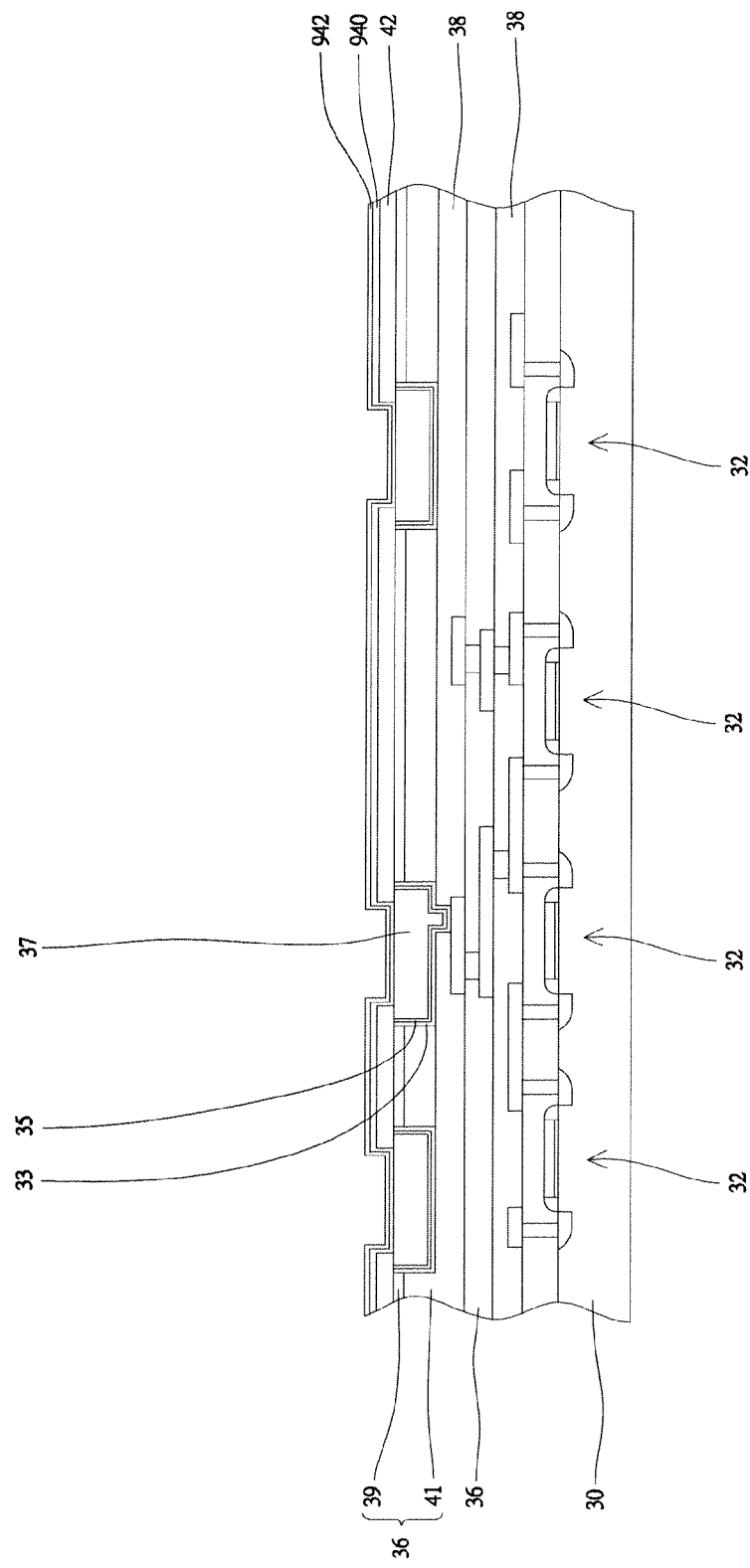
FIGS. 68-77 are cross-sectional views showing a process of forming a metal trace and metal bumps or pads according to a seventh embodiment.

Referring to FIG. 68, an adhesion/barrier layer 940 is formed by sputtering, evaporating, electroless plating or electroplating a metal layer of titanium, tungsten, cobalt, nickel, titanium nitride, a titanium-tungsten alloy, chromium, copper, a chromium-copper alloy, tantalum, or tantalum nitride, with a thickness of between 1000 and 6000 angstroms, on the passivation layer 42 and on the copper pad 37.

Next, referring to FIG. 68, a seed layer 942 may be formed by sputtering, evaporating, electroless plating or electroplating a metal layer of copper, with a thickness of between 500 and 3000 angstroms on the adhesion/barrier layer 940. If the adhesion/barrier layer 940 is copper, the step of forming the seed layer 942 of copper can be omitted.

Figure 69:
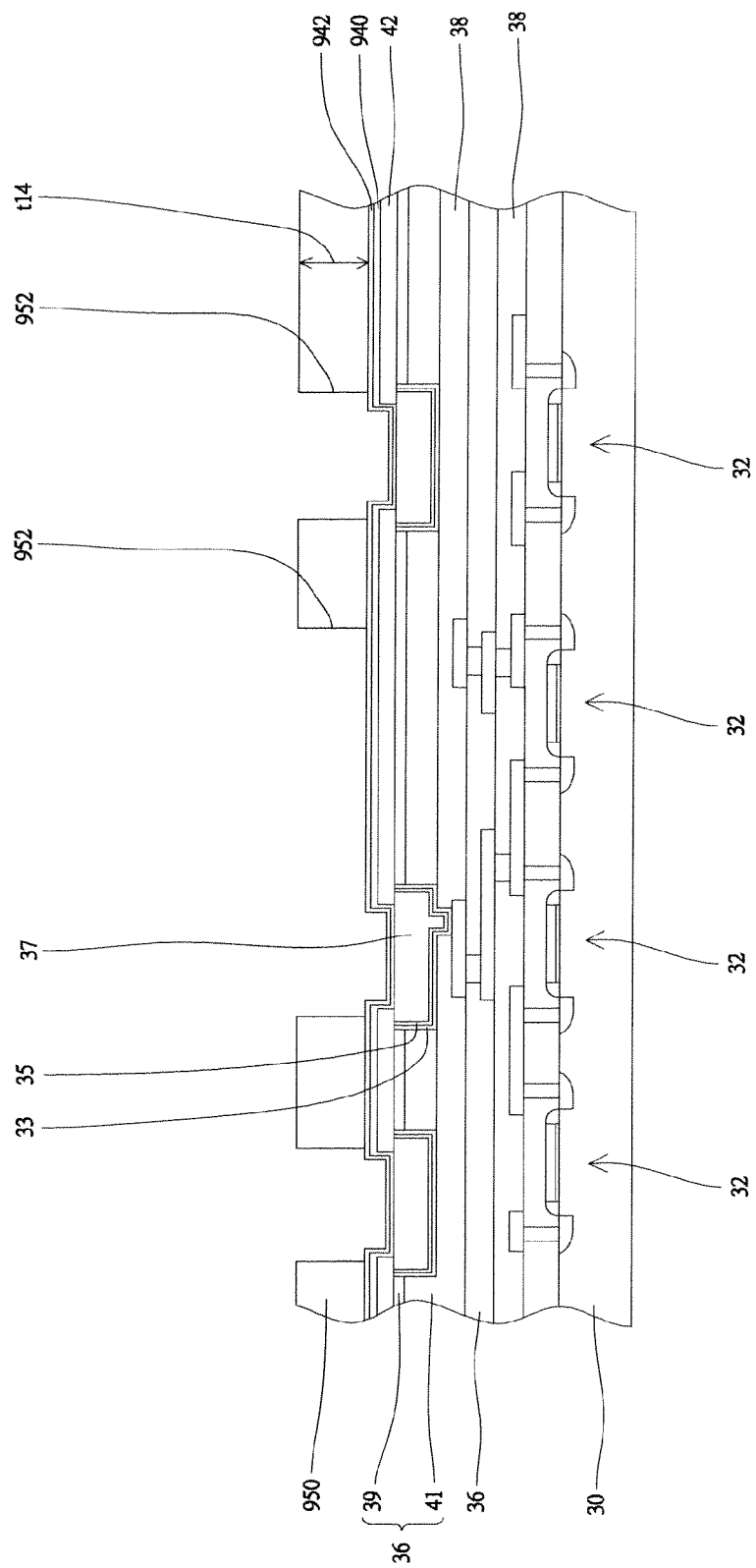

Next, referring to FIG. 69, a positive-type photoresist layer 950, such as napthoquinone diazide, photosensitive polyimide, photosensitive benzo-cyclo-butene (BCB), photosensitive parylene-based material, photosensitive epoxy-based material, with a thickness t14 of between 4 and 30 microns, is formed on the seed layer 942 using a spin coating process.

Next, referring to FIG. 69, a photolithography process including exposing and developing steps is used to pattern the photoresist layer 950 and to form multiple openings 952, with a bump pattern, pad pattern, trace pattern, or coil pattern from a top view, in the photoresist layer 950 exposing the seed layer 942. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used.

Figure 70:
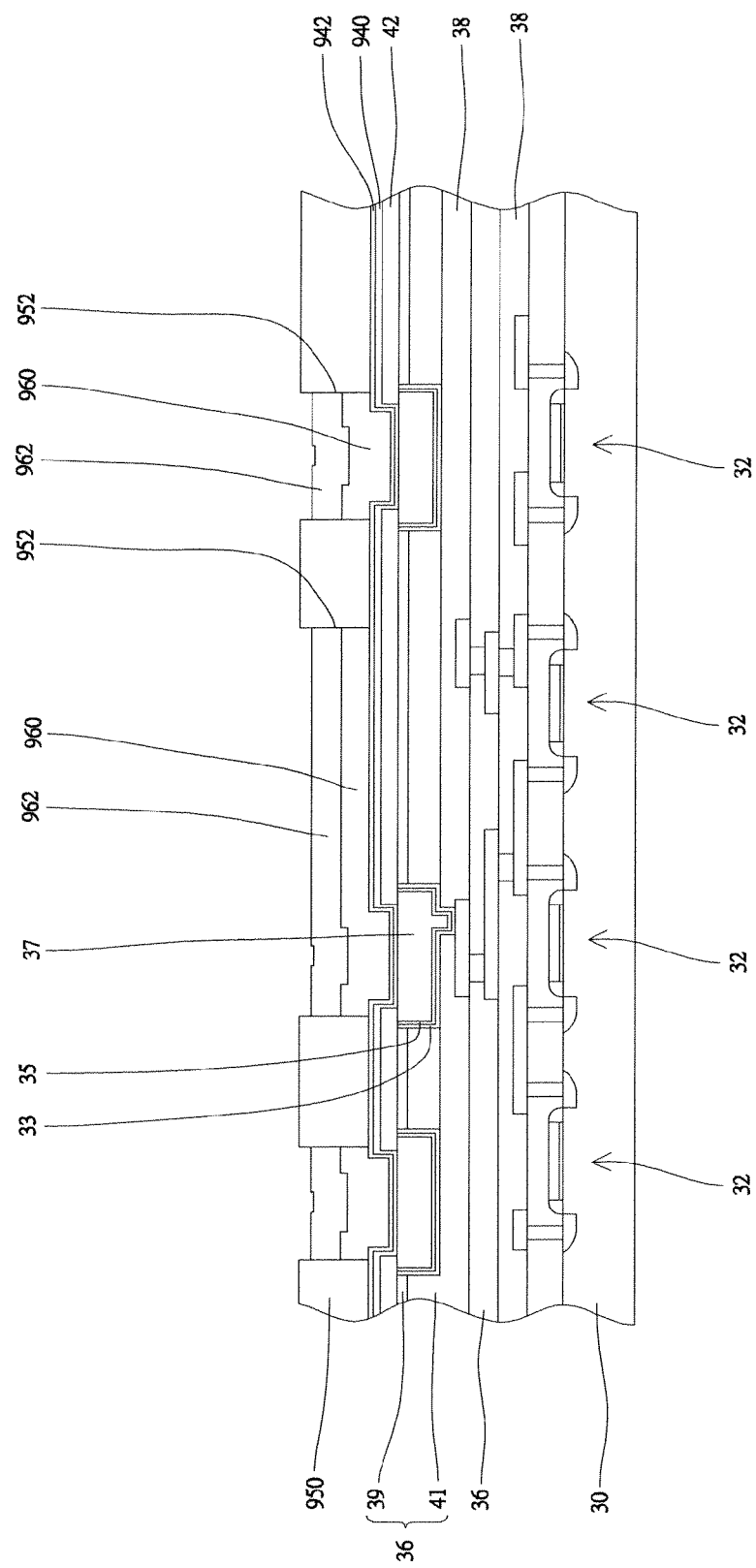

Next, referring to FIG. 70, a copper layer 960 having a thickness of between 0.1 and 10 microns is electroplated or electroless plated on the seed layer 942 exposed by the openings 952 in the photoresist layer 950.

Next, referring to FIG. 70, a nickel layer 962 having a thickness of between 0.1 and 10 microns is electroplated or electroless plated on the copper layer 960 in the openings 952 in the photoresist layer 950.

Figure 71:
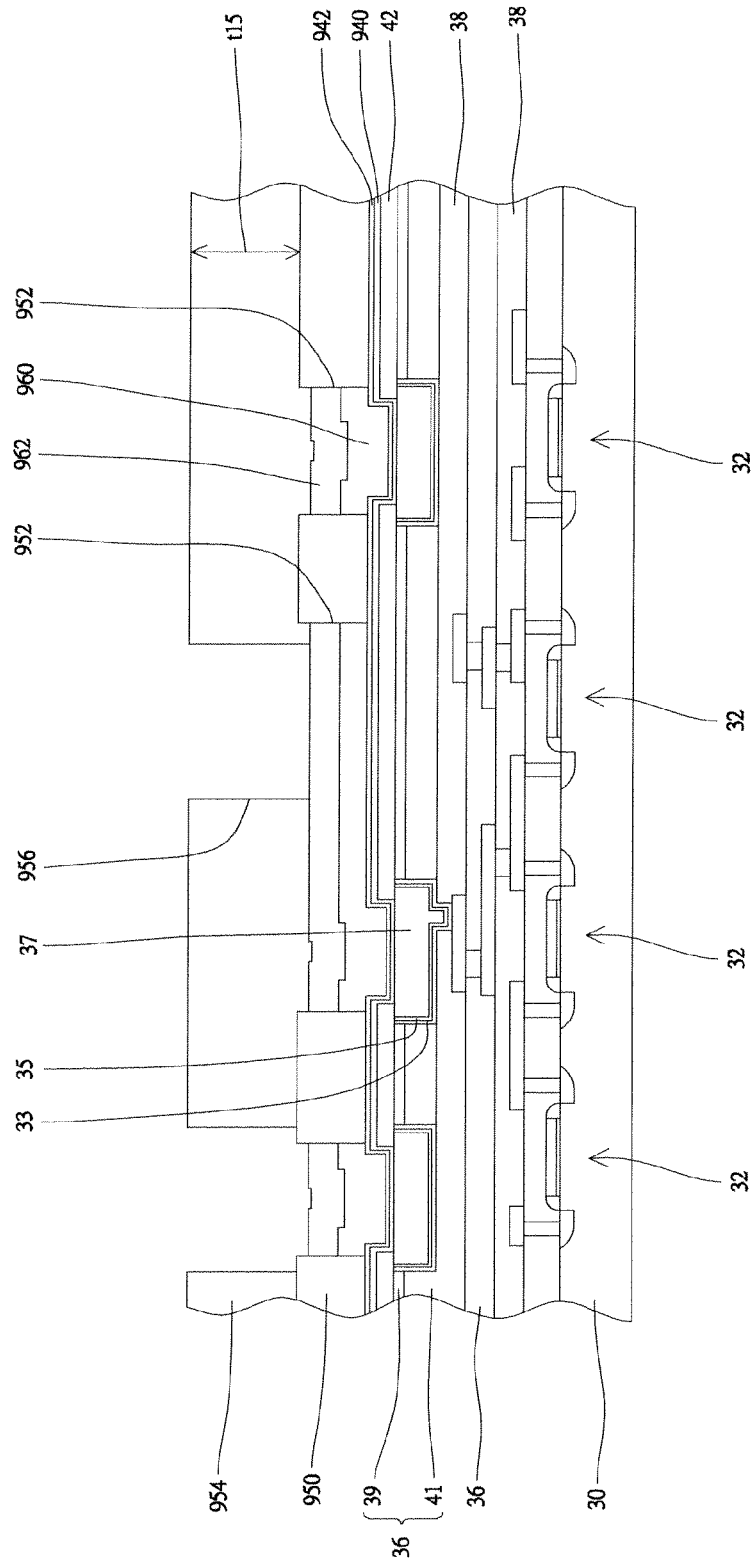

Next, referring to FIG. 71, a positive-type photoresist layer 954, such as napthoquinone diazide, photosensitive polyimide, photosensitive benzo-cyclo-butene (BCB), photosensitive parylene-based material, photosensitive epoxy-based material, with a thickness t15 of between 4 and 200 microns, is formed on the photoresist layer 950 and on the nickel layer 962 using a spin coating process.

Next, referring to FIG. 71, a photolithography process including exposing and developing steps is used to pattern the photoresist layer 954 and to form multiple openings 956, with a bump pattern or pad pattern from a top view, in the photoresist layer 954 exposing the nickel layer 962. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used.

Figure 72:
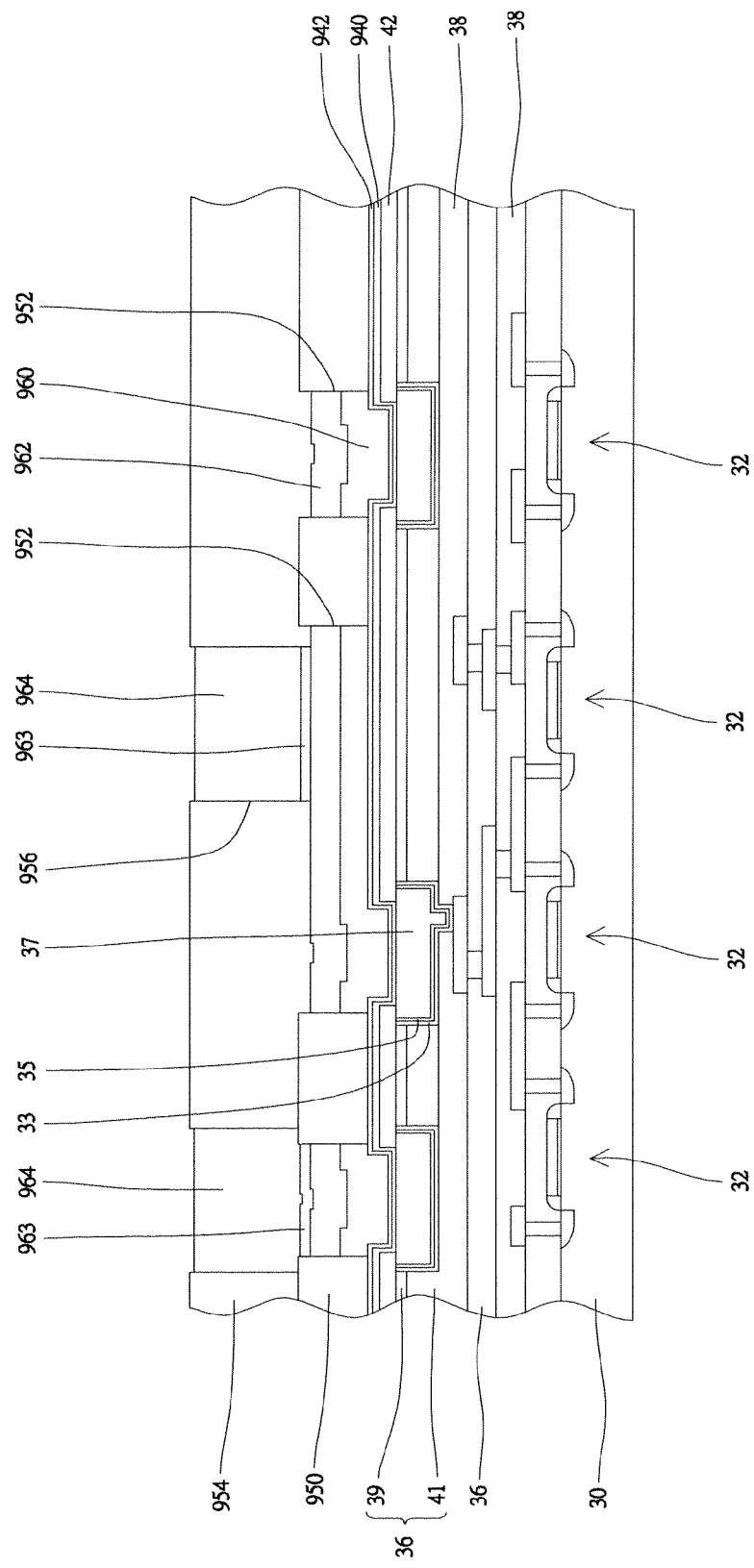

Next, referring to FIG. 72, a metal layer 963 of gold, copper, nickel, silver, palladium, platinum, rhodium, ruthenium, rhenium, a tin-silver alloy or a tin-lead alloy, having a thickness of between 0.01 and 5 microns, and preferably of between 0.01 and 2 microns or of between 1.6 and 5 microns, is electroless plated on the nickel layer 962 exposed by the openings 956 in the photoresist layer 964 and in the openings 952 in the photoresist layer 950.

Next, referring to FIG. 72, a metal layer 964 can be deposited by electroplating a single layer of gold with a thickness of between 1 and 30 microns, and preferably between 3 and 20 microns, on the electroless-plated metal layer 963 preferably of gold in the openings 952 in the photoresist layer 950 or in the openings 956 in the photoresist layer 954. Alternatively, the metal layer 964 can be deposited by electroplating a single layer of copper with a thickness of between 1 and 30 microns, and preferably 3 and 20 microns, on the electroless-plated metal layer 963 preferably of copper in the openings 952 in the photoresist layer 950 or in the openings 956 in the photoresist layer 954. Alternatively, the metal layer 964 can be deposited by electroplating a single layer of silver with a thickness of between 1 and 30 microns, and preferably 3 and 20 microns, on the electroless-plated metal layer 963 preferably of silver in the openings 952 in the photoresist layer 950 or in the openings 956 in the photoresist layer 954. Alternatively, the metal layer 964 can be deposited by electroplating a single layer of nickel with a thickness of between 1 and 30 microns, and preferably 3 and 20 microns, on the electroless-plated metal layer 963 preferably of nickel in the openings 952 in the photoresist layer 950 or in the openings 956 in the photoresist layer 954. Alternatively, the metal layer 964 can be deposited by electroplating a single layer of palladium with a thickness of between 1 and 30 microns, and preferably 3 and 20 microns, on the electroless-plated metal layer 963 preferably of palladium in the openings 952 in the photoresist layer 950 or in the openings 956 in the photoresist layer 954. Alternatively, the metal layer 964 can be deposited by electroplating a single layer of platinum with a thickness of between 1 and 30 microns, and preferably 3 and 20 microns, on the electroless-plated metal layer 963 preferably of platinum in the openings 952 in the photoresist layer 950 or in the openings 956 in the photoresist layer 954. Alternatively, the metal layer 964 can be deposited by electroplating a single layer of rhodium with a thickness of between 1 and 30 microns, and preferably 3 and 20 microns, on the electroless-plated metal layer 963 preferably of rhodium in the openings 952 in the photoresist layer 950 or in the openings 956 in the photoresist layer 954. Alternatively, the metal layer 964 can be deposited by electroplating a single layer of ruthenium with a thickness of between 1 and 30 microns, and preferably 3 and 20 microns, on the electroless-plated metal layer 963 preferably of ruthenium in the openings 952 in the photoresist layer 950 or in the openings 956 in the photoresist layer 954. Alternatively, the metal layer 964 can be deposited by electroplating a single layer of rhenium with a thickness of between 1 and 30 microns, and preferably 3 and 20 microns, on the electroless-plated metal layer 963 preferably of rhenium in the openings 952 in the photoresist layer 950 or in the openings 956 in the photoresist layer 954. Alternatively, the metal layer 964 can be deposited by electroplating a single layer of a tin-lead alloy with a thickness of between 10 and 500 microns, and preferably 30 and 150 microns, on the electroless-plated metal layer 963 preferably of nickel or tin-lead alloy in the openings 952 in the photoresist layer 950 or in the openings 956 in the photoresist layer 954. Alternatively, the metal layer 964 can be deposited by electroplating a single layer of a tin-silver alloy with a thickness of between 10 and 500 microns, and preferably 30 and 150 microns, on the electroless-plated metal layer 963 preferably of nickel or tin-silver alloy in the openings 952 in the photoresist layer 950 or in the opening 956 in the photoresist layer 954.

Figure 73:
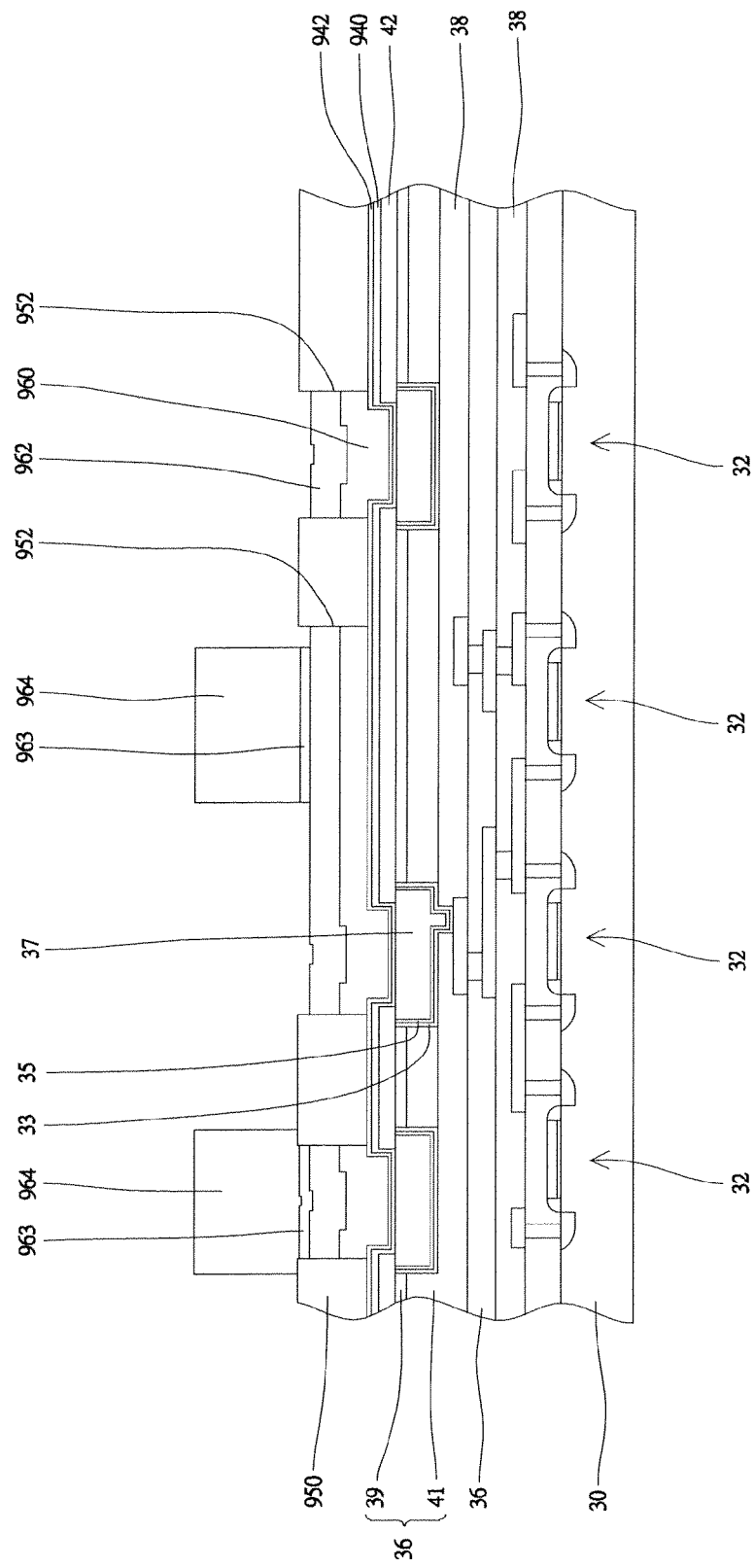

Next, referring to FIG. 73, the photoresist layer 954 is stripped.

Figure 74:
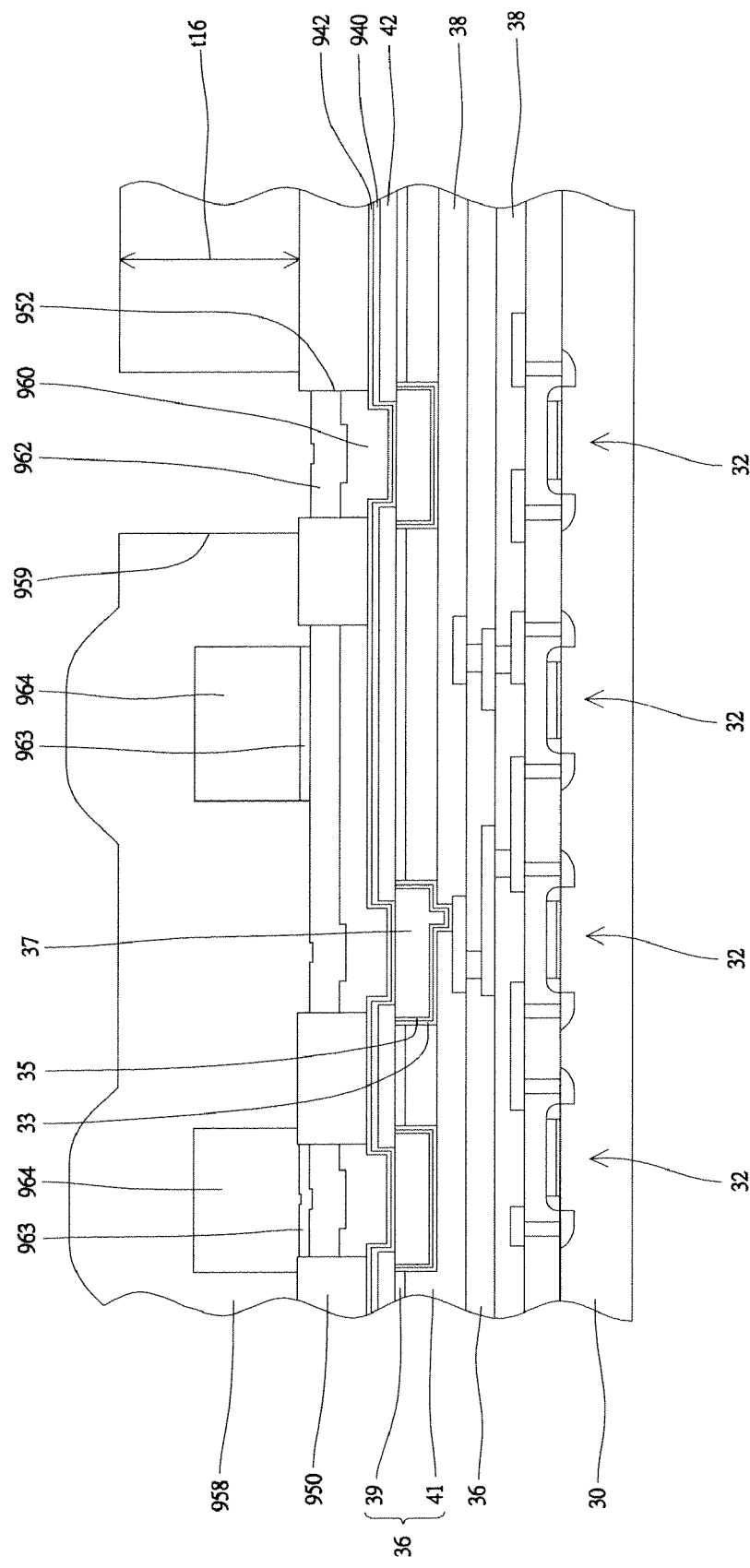

Next, referring to FIG. 74, a positive-type photoresist layer 958, such as napthoquinone diazide, photosensitive polyimide, photosensitive benzo-cyclo-butene (BCB), photosensitive parylene-based material, photosensitive epoxy-based material, with a thickness t16 of between 4 and 200 microns, is formed on the photoresist layer 950, on the nickel layer 962 and on the metal layer 964 using a spin coating process.

Next, referring to FIG. 74, a photolithography process including exposing and developing steps is used to pattern the photoresist layer 958 and to form an opening 959, with a bump pattern or pad pattern from a top view, in the photoresist layer 958 exposing the nickel layer 962. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used.

Figure 75:
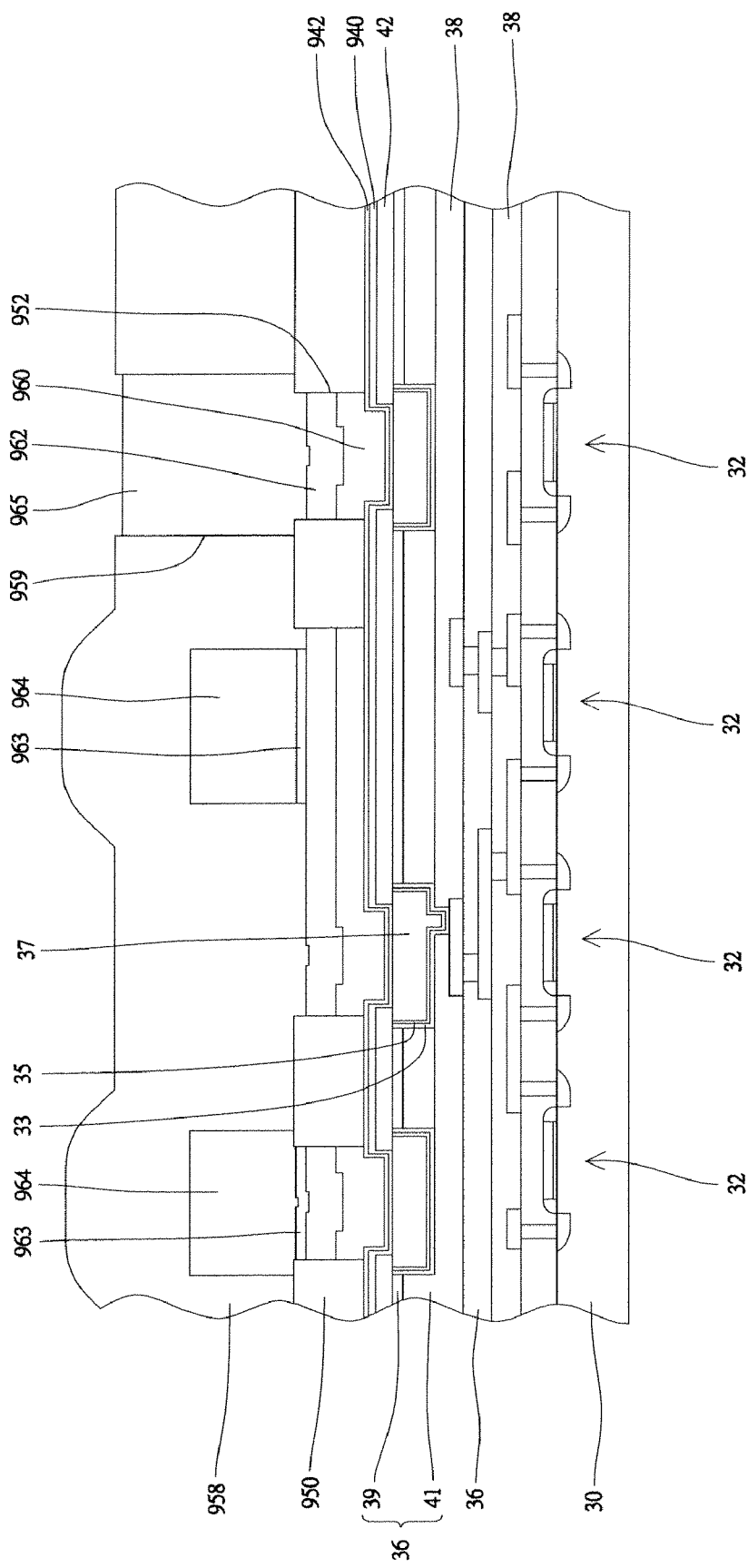

Next, referring to FIG. 75, a metal layer 965 of gold, copper, nickel, silver, palladium, platinum, rhodium, ruthenium, or rhenium, having a thickness of between 0.1 and 30 microns, and preferably of between 1.6 and 20 microns or of between 2 and 30 microns, is electroplated or electroless plated on the nickel layer 962 exposed by the opening 959 in the photoresist layer 958 and in the opening 952 in the photoresist layer 950. Alternatively, the metal layer 965 can be deposited by electroplating or electroless plating a tin-containing layer, such as tin-lead alloy or tin-silver alloy, having a thickness of between 10 and 500 microns on the nickel layer 962 exposed by the opening 959 in the photoresist layer 958 and in the opening 952 in the photoresist layer 950.

Figure 76:
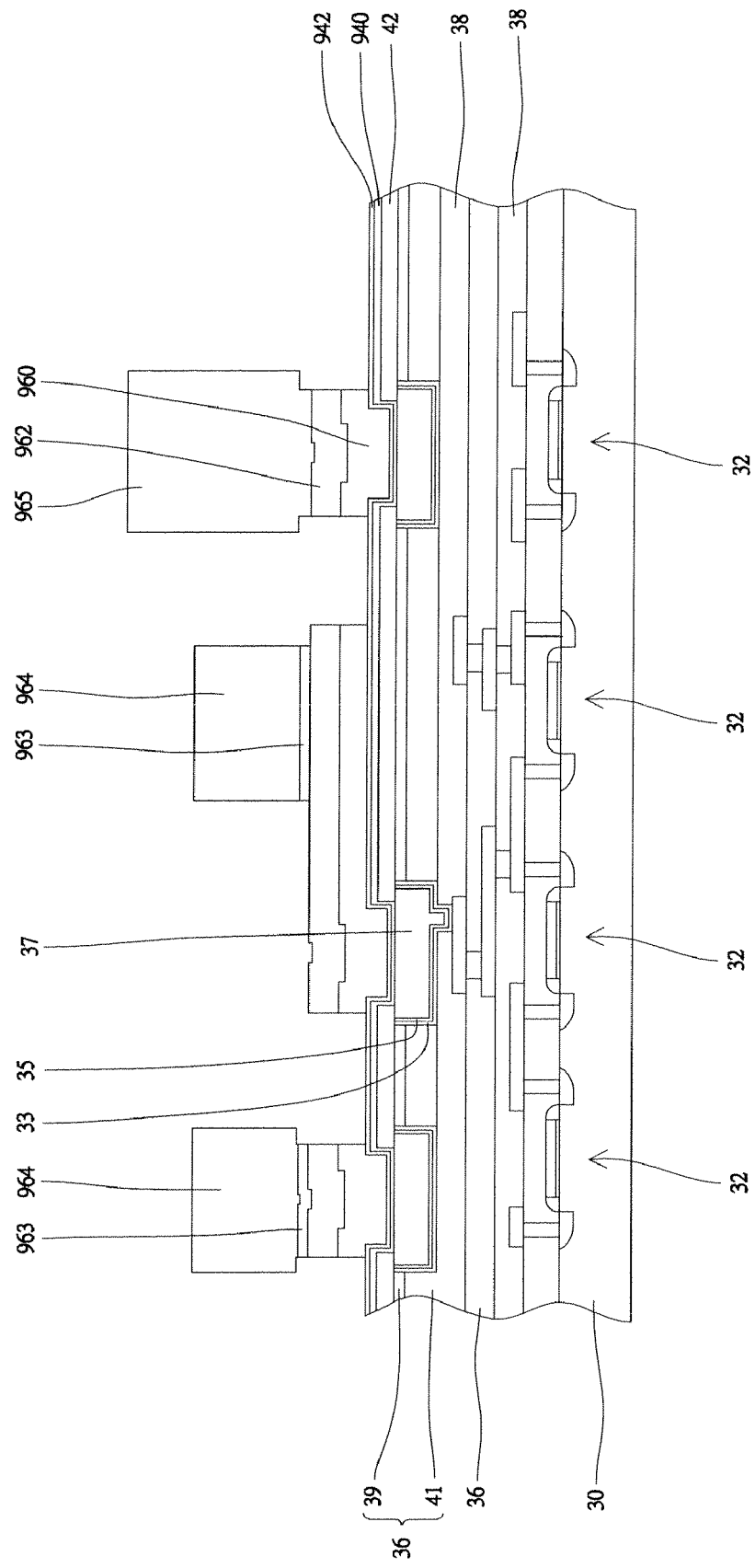

Next, referring to FIG. 76, the photoresist layer 958 is stripped. Next, the photoresist layer 950 is stripped.

Figure 77:
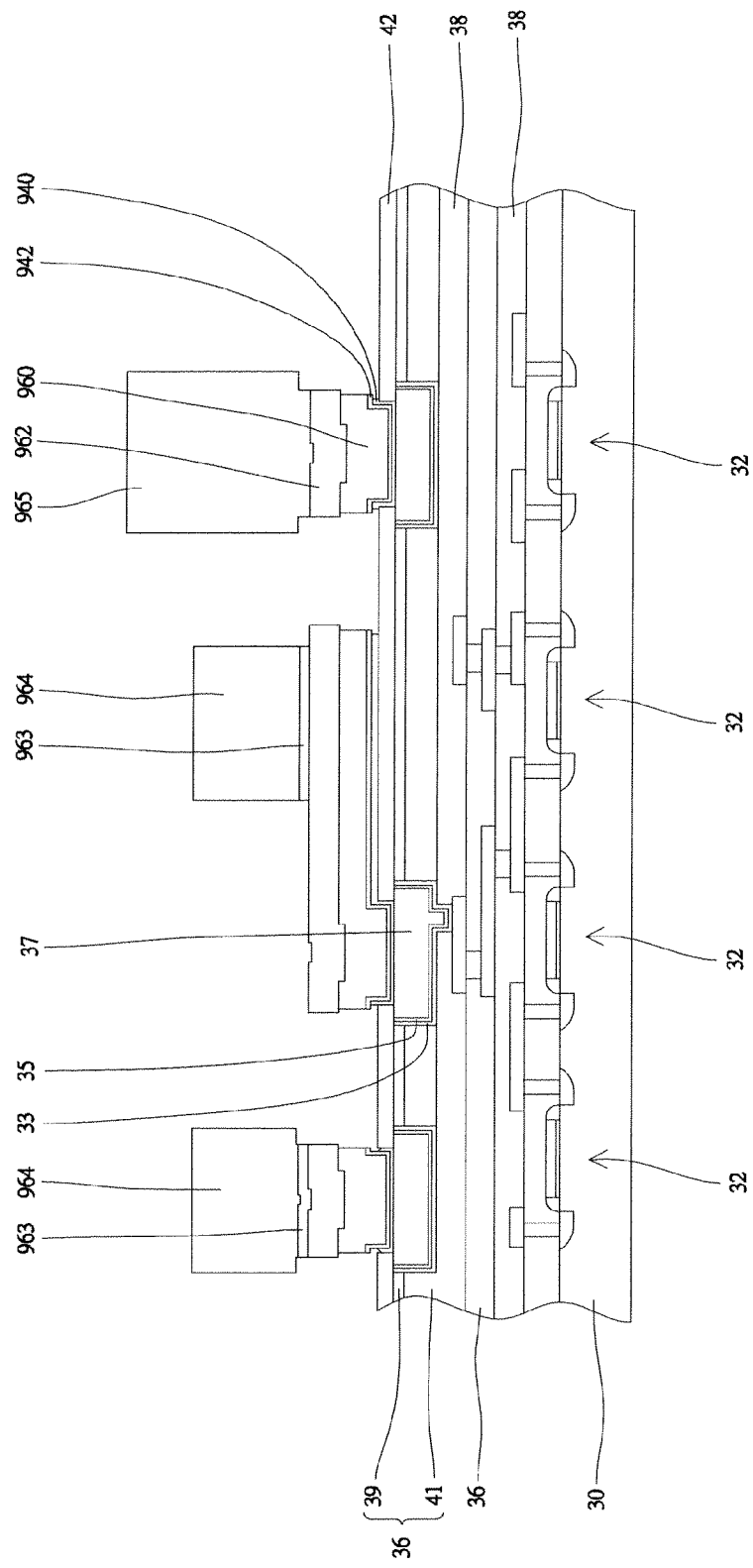

Next, referring to FIG. 77, the seed layer 942 not under the copper layer 960 is removed using a dry etching process or a wet etching process. Thereafter, the adhesion/barrier layer 940 not under the copper layer 960 is removed using a dry etching process or a wet etching process. If the adhesion/barrier layer 940 is a titanium tungsten alloy and removed by a wet etching process, the etchant for etching the adhesion/barrier layer 940 is hydrogen peroxide or hydrofluoric acid. If the adhesion/barrier layer 940 is titanium and removed by a wet etching process, the etchant for etching the adhesion/barrier layer 940 is hydrofluoric acid. Thereafter, a cutting process can be used to divide the semiconductor wafer having the above-mentioned metal pad or metal bump 365 or 964 formed thereover into multiple semiconductor chips. Thereafter, the semiconductor chips can be used for a packaging process, such as tape-automated-bonding (TAB) process, chip-on-glass (COG) process or chip-on-film (COF) process, as mentioned below.

When the metallization structure 964 or 965 is used as a metal bump, the metal bump 964 or 965 can be used to be TAB bonded thereto, as shown in FIGS. 10 and 77. The metal bump 964 or 965 can be bonded on a tin-containing layer 377, such as a tin-lead alloy or a tin-silver alloy, which is formed on the inner leads 372 before the metal bump 964 or 965 is connected to the tin-containing layer 377 on the inner leads 372. The outer leads can be connected to an external circuitry component, such as a printed circuit board (PCB). After the metal bump 964 or 965 is connected to the tin-containing layer 377 on the inner leads 372, a polymer layer 379, such as polyimide or benzo-cyclo-butene (BCB), is filled into the opening 374 in the tape 340 and covers the metal bump 964 or 965 and the inner leads 372.

Alternatively, the metal bump 964 or 965 can be applied to a chip-on-glass (COG) package, as shown in FIGS. 11 and 77. Before the metal bump 964 or 965 is connected to the circuitry component 380, an anisotropic conductive paste (ACP) or anisotropic conductive film (ACF) 386 having a polymer layer 385 and multiple metal particles 387 mixed with the polymer layer 385 is formed on the glass substrate 382 and the transparent conductive trace 384. Next, the metal bump 964 or 965 is pressed into the ACP or ACF 386 such that the bump 964 or 965 can be electrically connected to the transparent conductive trace 384 through the metal particles 387 in the ACP or ACF 386.

Alternatively, the metal bump 964 or 965 can be applied to a chip-on-film (COF) package, as shown in FIGS. 12 and 77. The metal bump 964 or 965 can be bonded on a tin-containing layer 398, such as a tin-lead alloy or a tin-silver alloy, which is formed on the metal trace 392 before the metal bump 964 or 965 is connected to the tin-containing layer 398 on the metal trace 392. After the metal bump 964 or 965 is connected to the tin-containing layer 398 on the metal trace 392, a polymer layer 399, such as polyimide or benzo-cyclo-butene (BCB), is filled into the gap between the semiconductor chip and the flexible circuit film 390 and covers the metal bump 964 or 965.

Alternatively, the metal bump 964 or 965 formed on the copper pad 37 can be used to be bond onto a printed circuit board, ceramic substrate or other semiconductor wafer or chip.

Alternatively, the metallization structure 964 or 965 can be used as a metal pad used for being wirebonded thereto. A gold wire can be connected to the metal pad 964 or 965 using a wirebonding process.

Alternatively, in order to prevent the copper pad 37 from being oxidized, a metal cap 1000 can be formed on the copper pad 37 before forming the passivation layer 42 and the above-mentioned metal pad or metal bump 367, 467, 567, or 667 over the copper pad 37, as shown in FIGS. 78-90. The elements shown in FIGS. 78-90 having same reference numbers as those shown in FIGS. 1-46 indicate similar ones described above in FIGS. 1-46.

Figure 78:
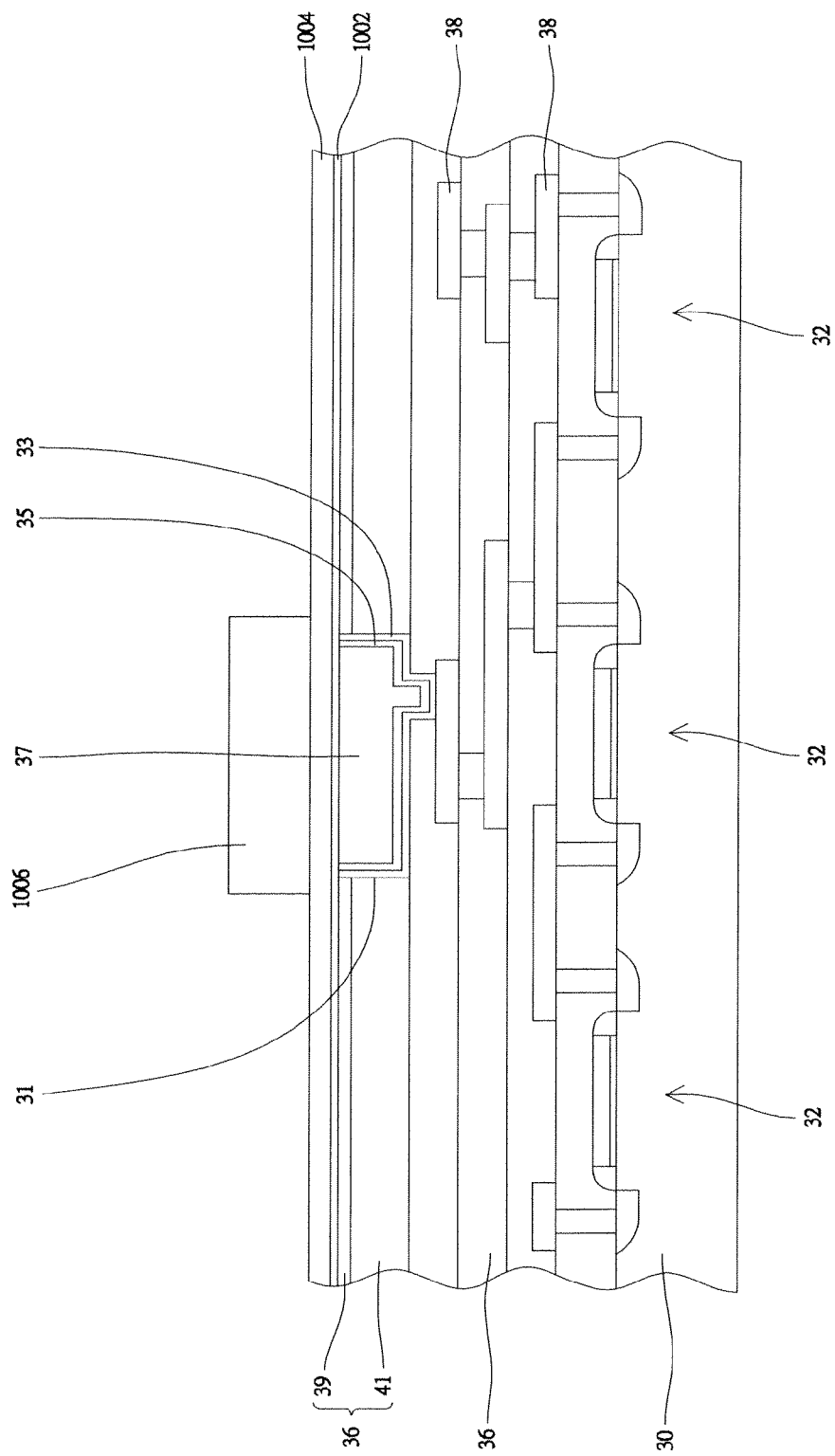
FIGS. 78-90 are cross-sectional views showing a process of forming a metal pad or metal bump over a metal cap on a copper pad according to an eighth embodiment.
Figure 79:
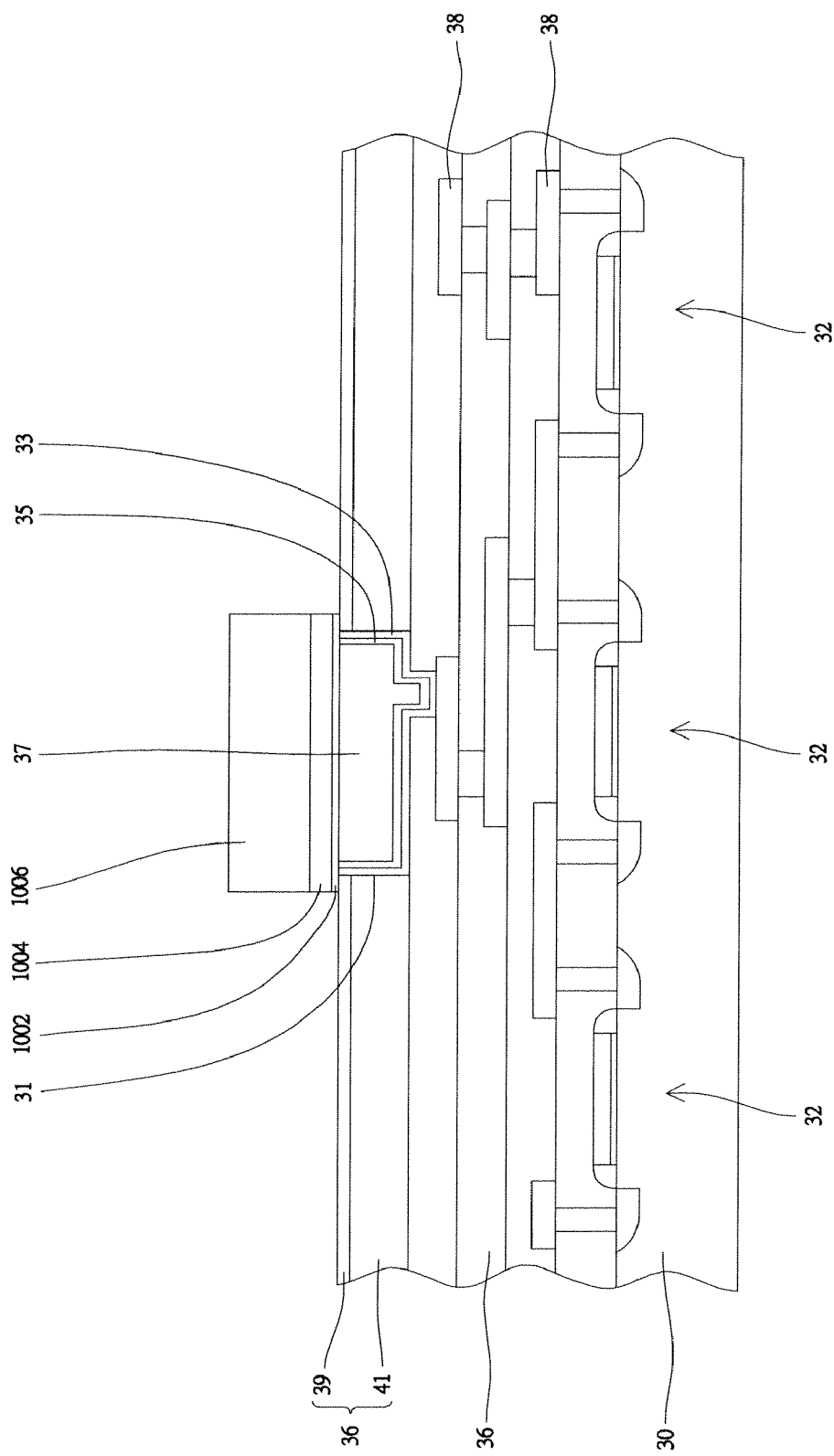
Figure 80:
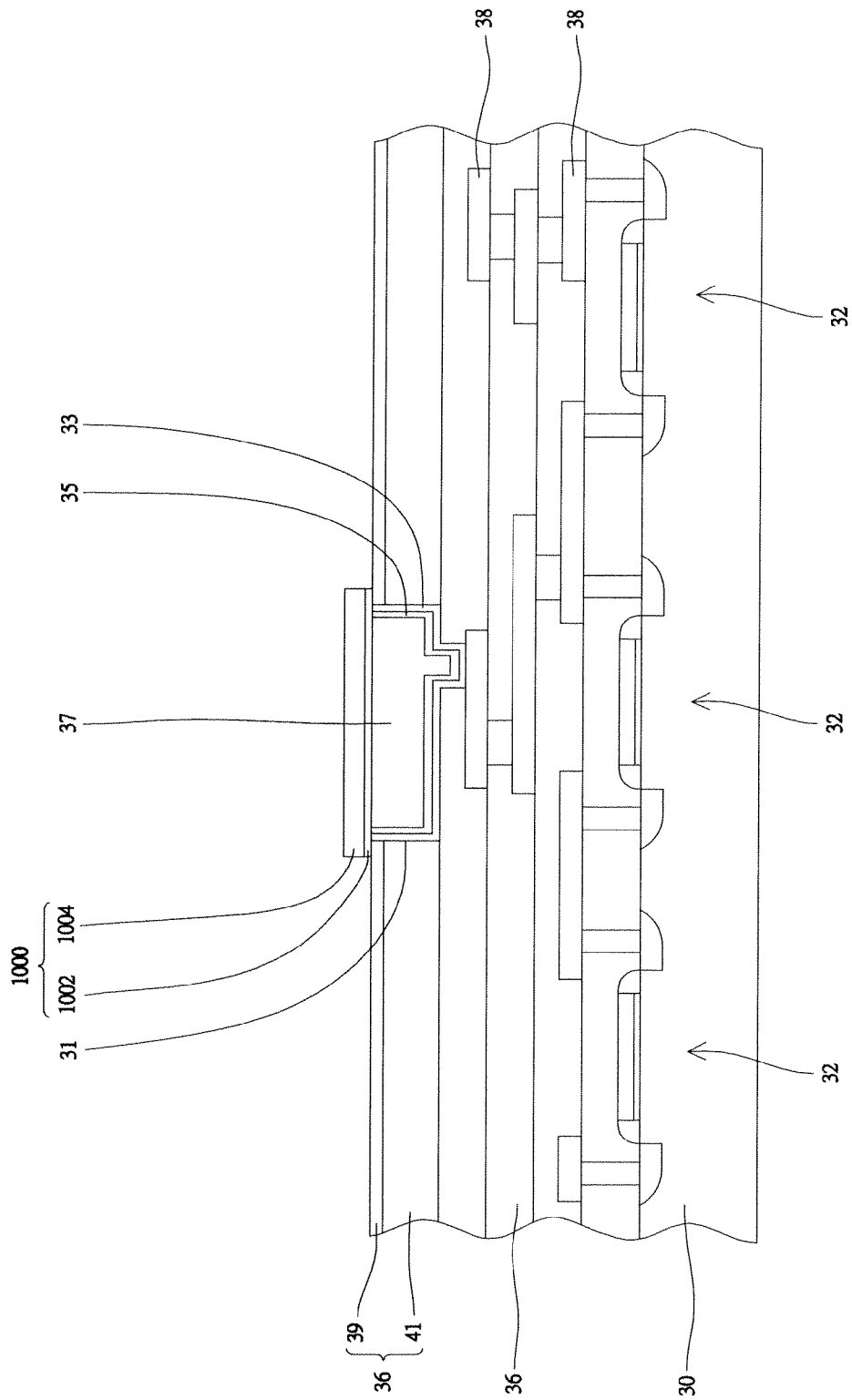

Referring to FIGS. 78-80, it is an optional process to form the metal cap 1000. The metal cap 1000 can be deposited by sputtering or evaporating an adhesion/barrier layer 1002 of titanium, tungsten, cobalt, nickel, titanium nitride, a titanium-tungsten alloy, vanadium, chromium, copper, a chromium-copper alloy, tantalum, tantalum nitride, having a thickness of between 0.05 and 0.5 microns, on the copper pad 37 and on the insulating layer 39, as shown in FIG. 78, next sputtering or evaporating a metal layer 1004 of aluminum, gold, silver, palladium, platinum, rhodium, ruthenium, rhenium, a tin-lead alloy or a tin-silver alloy, having a thickness of between 0.5 and 2 microns, on the adhesion/barrier layer 1002, as shown in FIG. 78, next, forming a patterned photoresist layer 1006 on the metal layer 1004, wherein the patterned photoresist layer 1006 covers the metal layer 1004 over the copper pad 37, as shown in FIG. 78, next wet etching or dry etching the metal layer 1004 not under the patterned photoresist layer 1006, as shown in FIG. 79, next, wet etching or dry etching the adhesion/barrier 1 layer 1002 not under the patterned photoresist layer 1006, as shown in FIG. 79, and next removing the patterned photoresist layer 1006, as shown in FIG. 80. Preferably, the metal layer 1004 is sputtered aluminum.

Figure 81:
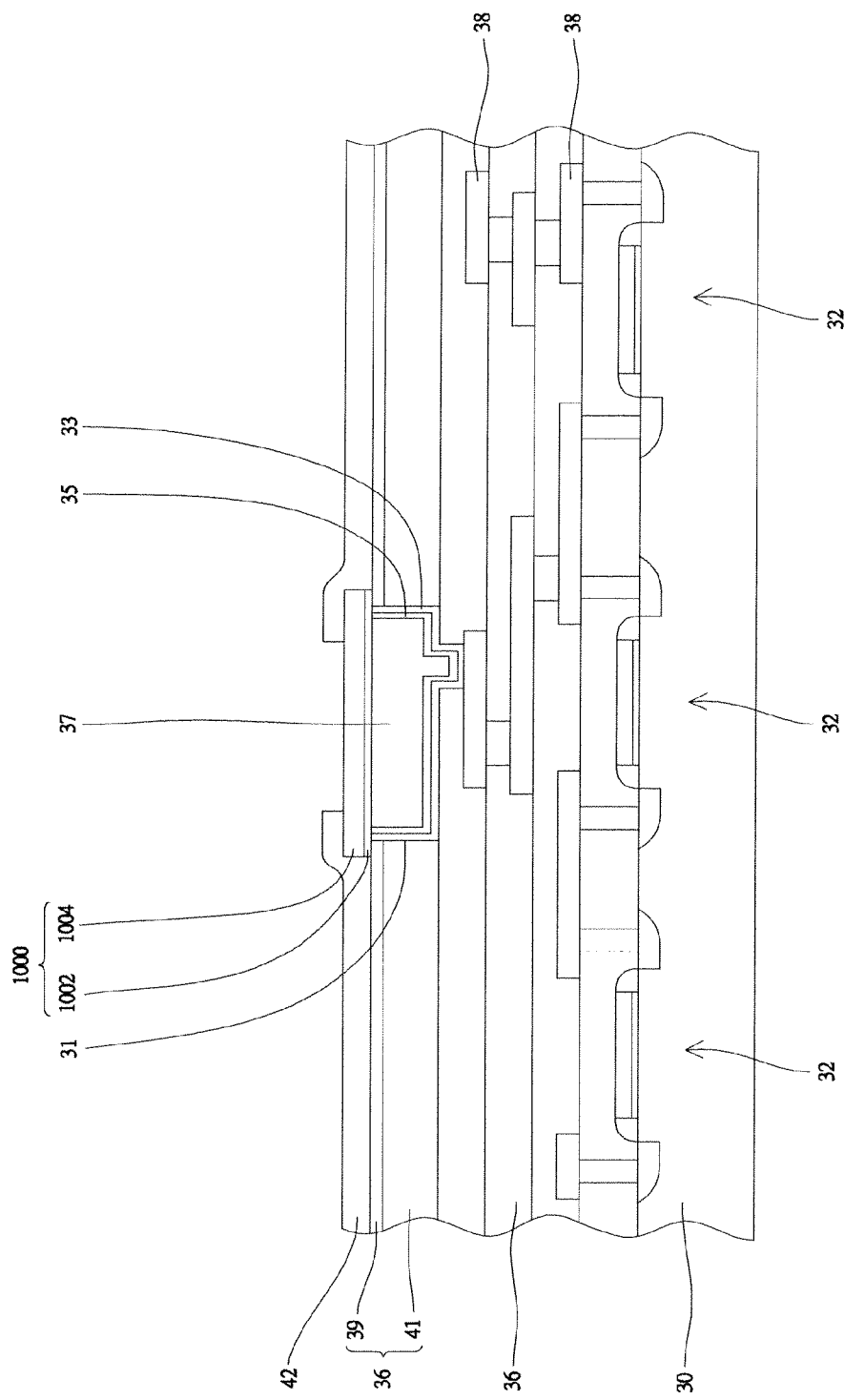

After forming the metal cap 1000, the above-mentioned passivation layer 42 can be formed on the insulating layer 39 and on the peripheral region of the metal cap 1000. An opening in the passivation layer exposes the metal cap 1000, as shown in FIG. 81.

Figure 82:
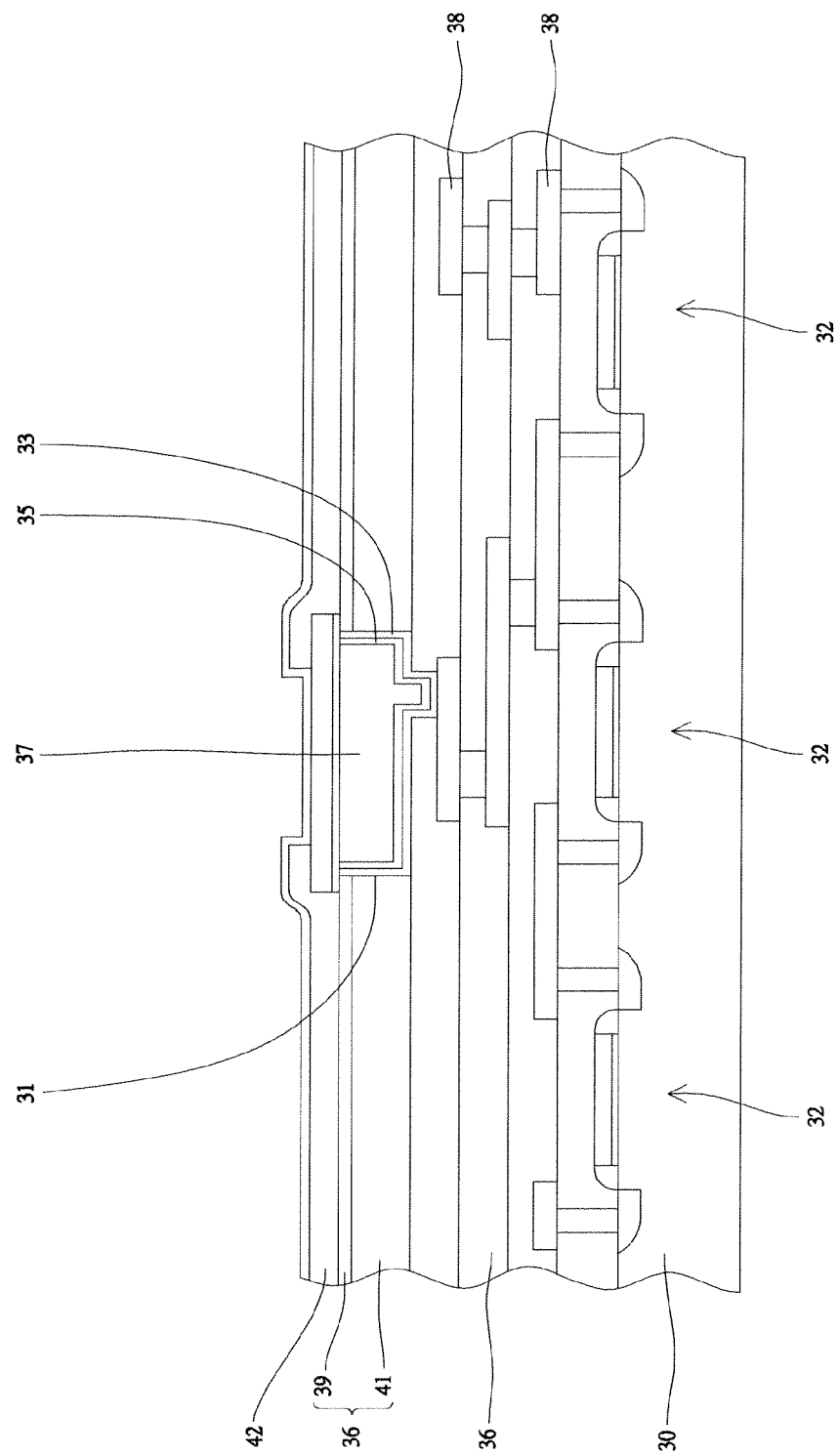
Figure 83:
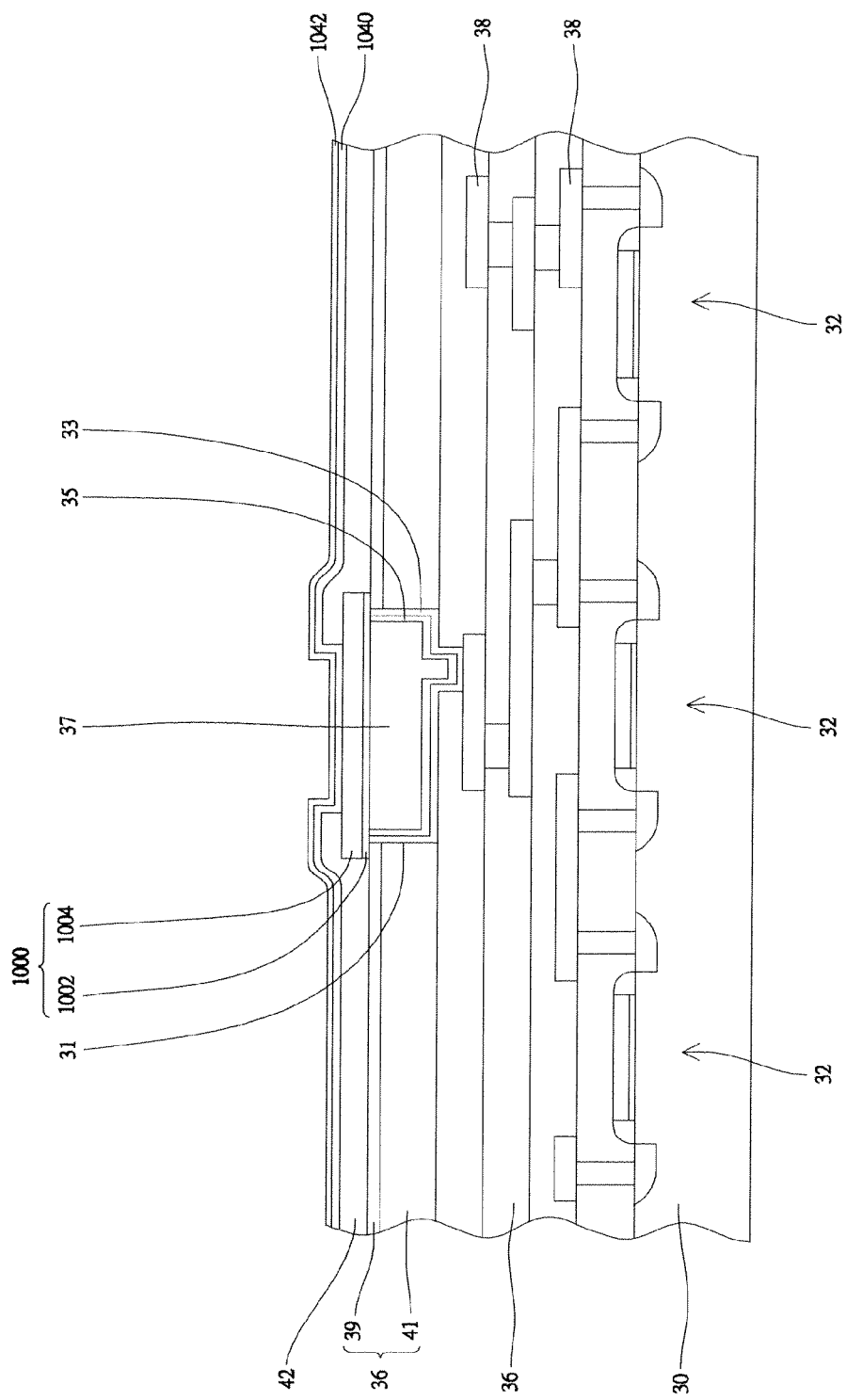

Next, a metal pad or metal bump can be formed on the metal cap 1000. Referring to FIG. 82, an adhesion/barrier layer 1040 may be formed as the step of forming the above-mentioned adhesion/barrier layer 340, 440, 540 or 640 on the passivation layer 42 and on the metal cap 1000. Next, referring to FIG. 83, a seed layer 1042 may be formed as the step of forming the above-mentioned seed layer 342, 442, 542 or 642 on the adhesion/barrier layer 340, 440, 540 or 640, respectively. If the adhesion/barrier layer 1040 is copper, the step of forming the seed layer 1042 of copper can be omitted.

Figure 84:
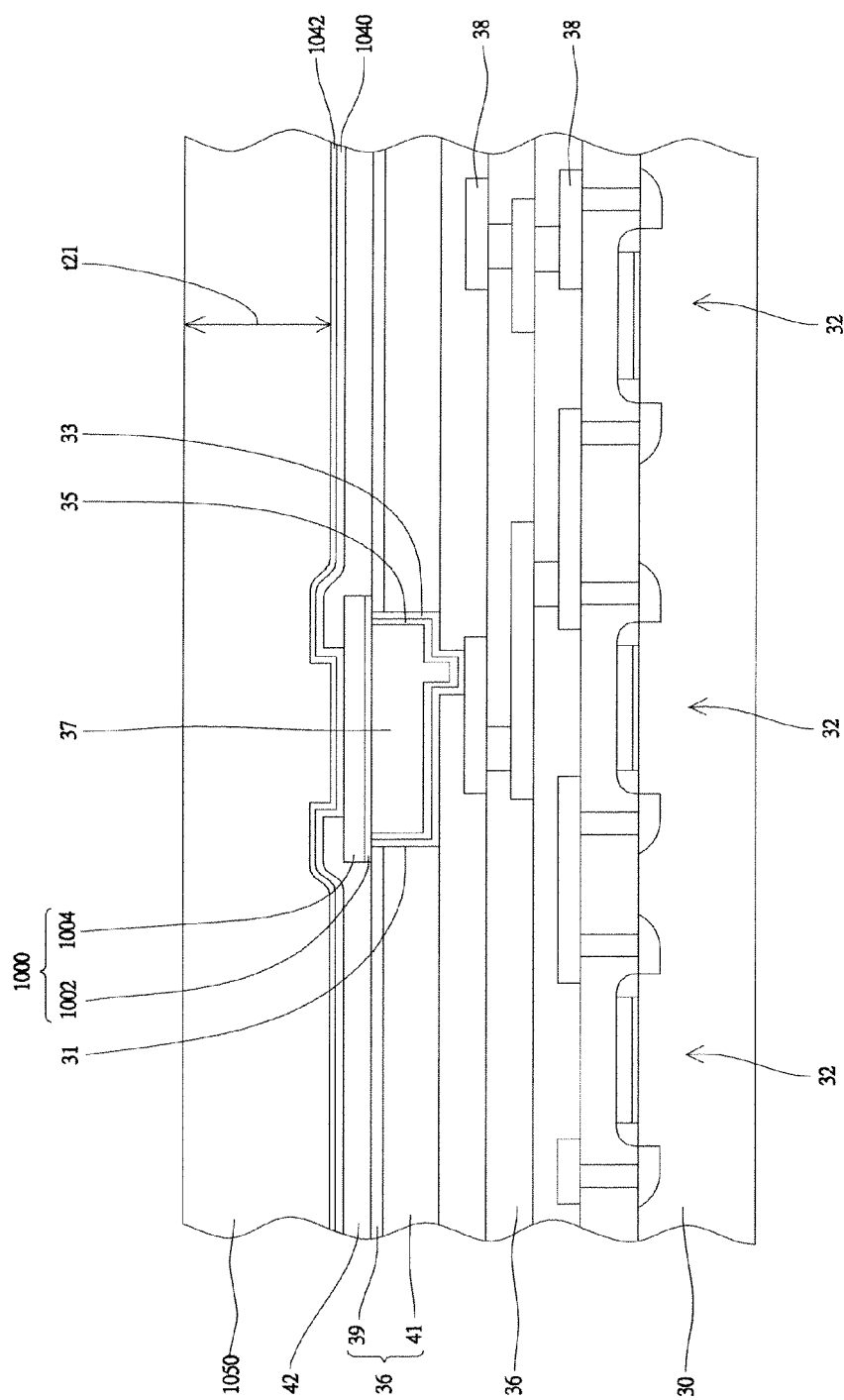

Next, referring to FIG. 84, a positive-type photoresist layer 1050, such as napthoquinone diazide, photosensitive polyimide, photosensitive benzo-cyclo-butene (BCB), photosensitive parylene-based material, photosensitive epoxy-based material, with a thickness t21 of between 4 and 30 microns, is formed on the seed layer 1042 using a spin coating process.

Figure 85:
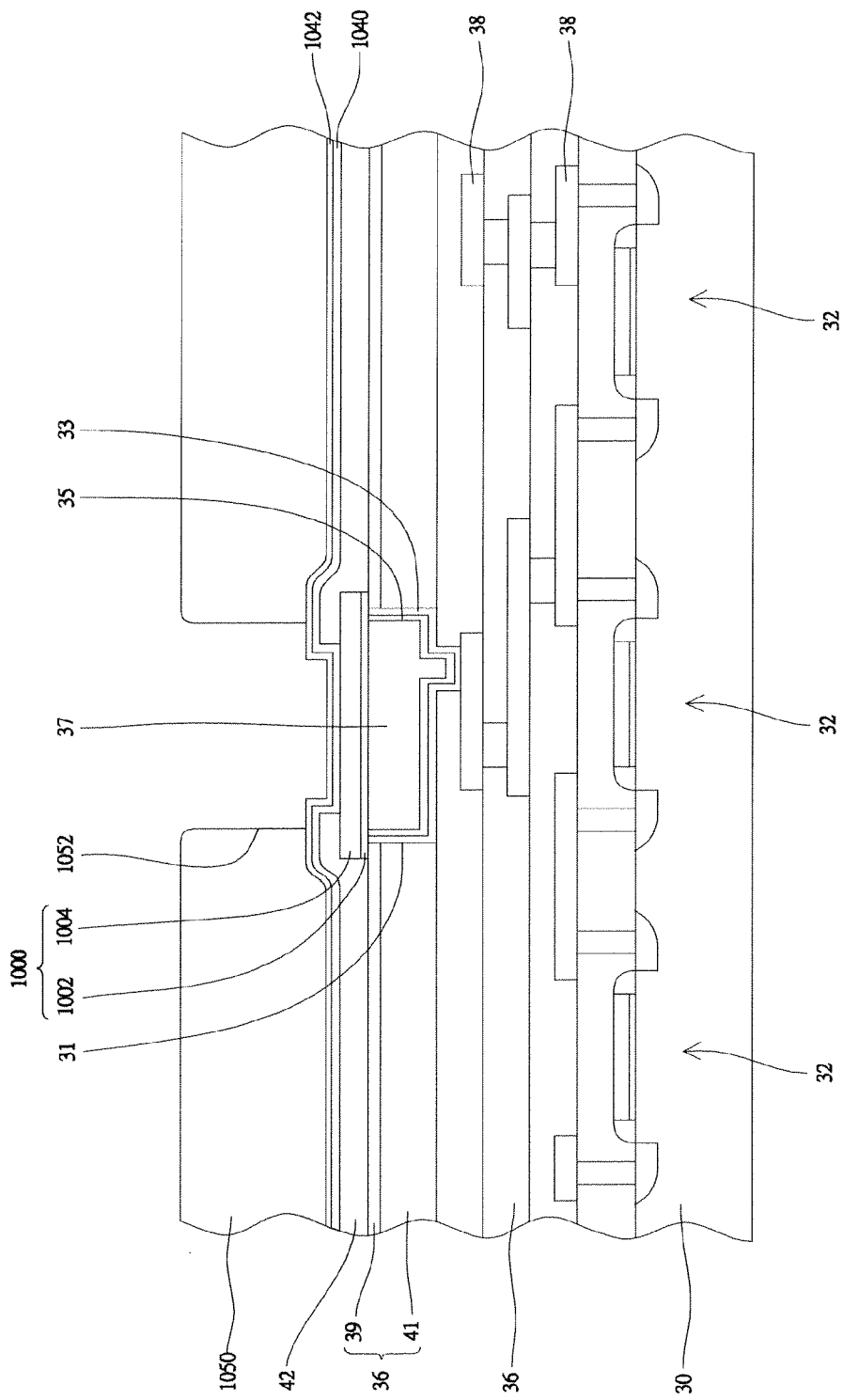

Next, referring to FIG. 85, a photolithography process including exposing and developing steps is used to pattern the photoresist layer 1050 and to form an opening 1052, with a bump pattern or pad pattern from a top view, in the photoresist layer 1050 exposing the seed layer 1042. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used.

Figure 86:
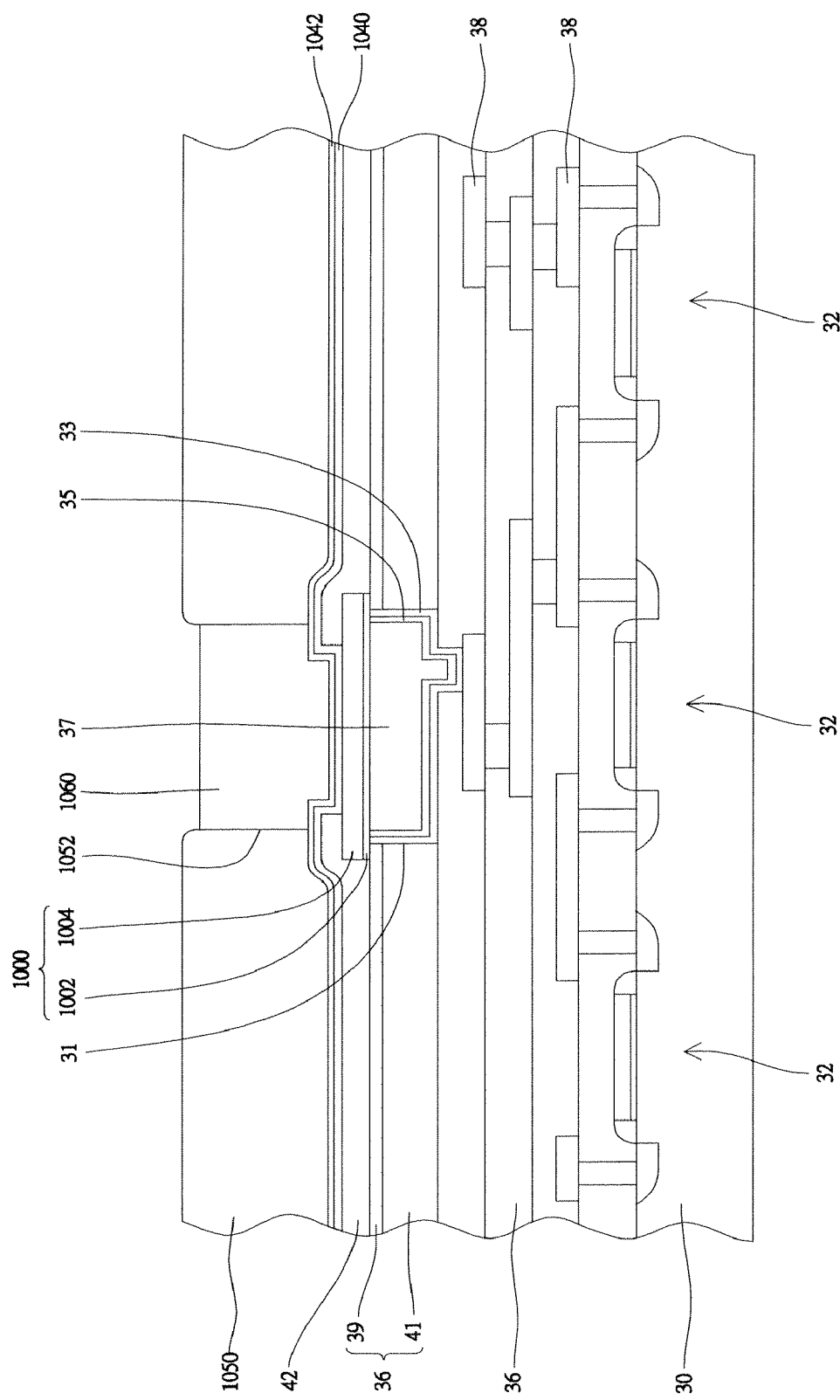

Next, referring to FIG. 86, a metal layer 1060 deposited on the seed layer 1042 exposed by the opening 1052 in the photoresist layer 1050 may be formed as the step of forming the above-mentioned metal layers 360, 362 and 364 on the seed layer 342 exposed by the opening 352 in the photoresist layer 350, as the step of forming the above-mentioned metal layer 464 on the seed layer 442 exposed by the opening 452 in the photoresist layer 450, as the step of forming the above-mentioned metal layers 560 and 564 on the seed layer 542 exposed by the opening 552 in the photoresist layer 550, or as the step of forming the above-mentioned metal layers 660, 662, 663 and 664 on the seed layer 642 exposed by the opening 652 in the photoresist layer 650.

Figure 87:
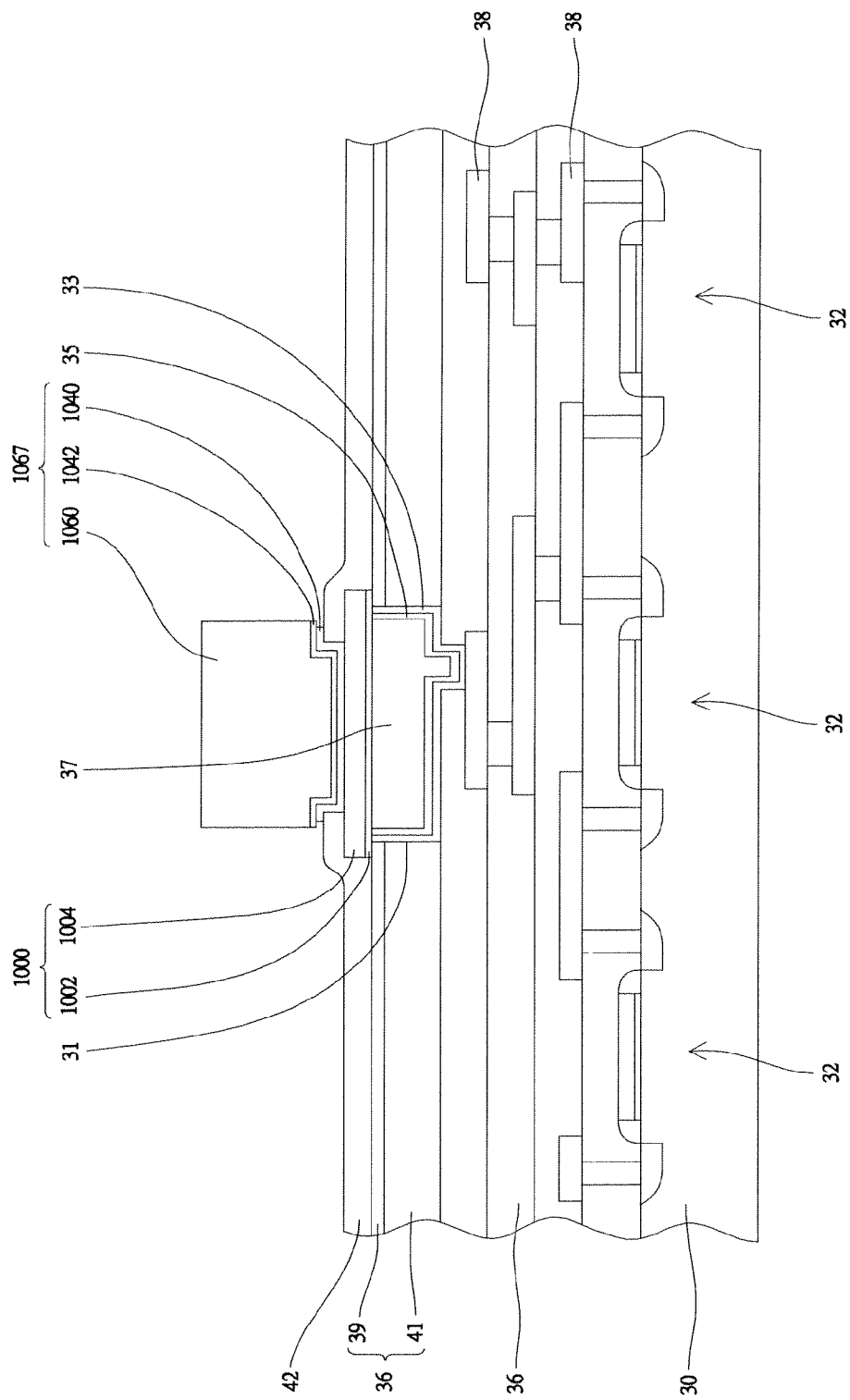

Next, referring to FIG. 87, the photoresist layer 1050 is stripped. Next, the seed layer 1042 not under the metal layer 1060 is removed using a dry etching process or a wet etching process. If the seed layer 1042 is gold and removed by a wet etching process, the etchant for etching the seed layer 1042 is potassium iodide. Thereafter, the adhesion/barrier layer 740 not under the metal layer 1060 is removed using a dry etching process or a wet etching process. If the adhesion/barrier layer 1040 is a titanium tungsten alloy and removed by a wet etching process, the etchant for etching the adhesion/barrier layer 1040 is hydrogen peroxide or hydrofluoric acid. If the adhesion/barrier layer 1040 is titanium and removed by a wet etching process, the etchant for etching the adhesion/barrier layer 1040 is hydrofluoric acid. Thereafter, a cutting process can be used to divide the semiconductor wafer having the above-mentioned metal pad or metal bump 1067 formed thereover into multiple semiconductor chips. Thereafter, the semiconductor chips can be used for a packaging process, such as tape-automated-bonding (TAB) process, chip-on-glass (COG) process or chip-on-film (COF) process, as mentioned below.

When the metallization structure formed for the metal layers 1040, 1042 and 1060 is used as a metal bump 1067, the metal bump 1067 can be used to be TAB bonded thereto, as shown in FIGS. 10 and 87. The metal bump 1067 can be bonded on a tin-containing layer 377, such as a tin-lead alloy or a tin-silver alloy, which is formed on the inner leads 372 before the metal bump 1067 is connected to the tin-containing layer 377 on the inner leads 372. After the metal bump 1067 is connected to the tin-containing layer 377 on the inner leads 372, a polymer layer 379, such as polyimide or benzo-cyclo-butene (BCB), is filled into the opening 374 in the tape 340 and covers the metal bump 1067 and the inner leads 372.

Alternatively, the metal bump 1067 can be applied to a chip-on-glass (COG) package, as shown in FIGS. 11 and 87. Before the metal bump 1067 is connected to the circuitry component 380, an anisotropic conductive paste (ACP) or anisotropic conductive film (ACF) 386 having a polymer layer 385 and multiple metal particles 387 mixed with the polymer layer 385 is formed on the glass substrate 382 and the transparent conductive trace 384. Next, the metal bump 1067 is pressed into the ACP or ACF 386 such that the bump 1067 can be electrically connected to the transparent conductive trace 384 through the metal particles 387 in the ACP or ACF 386.

Alternatively, the metal bump 1067 can be applied to a chip-on-film (COF) package, as shown in FIGS. 12 and 87. The metal bump 1067 can be bonded on a tin-containing layer 398, such as a tin-lead alloy or a tin-silver alloy, which is formed on the metal trace 392 before the metal bump 1067 is connected to the tin-containing layer 398 on the metal trace 392. After the metal bump 1067 is connected to the tin-containing layer 398 on the metal trace 392, a polymer layer 399, such as polyimide or benzo-cyclo-butene (BCB), is filled into the gap between the semiconductor chip and the flexible circuit film 390 and covers the metal bump 1067.

Alternatively, the metal bump 1067 formed on the metal cap 1000 can be used to be bond onto a printed circuit board, ceramic substrate or other semiconductor wafer or chip.

Figure 88:
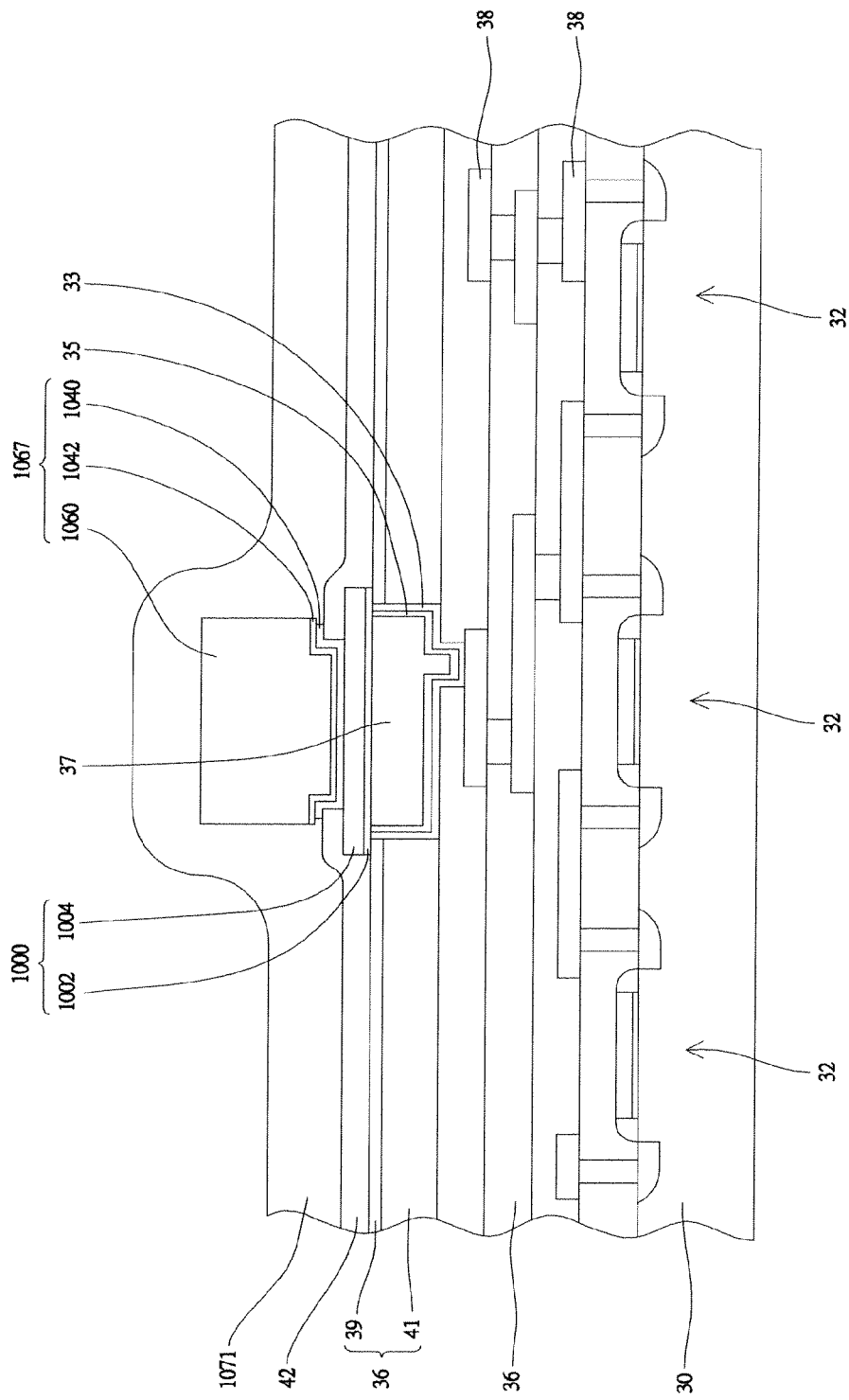
Figure 89:
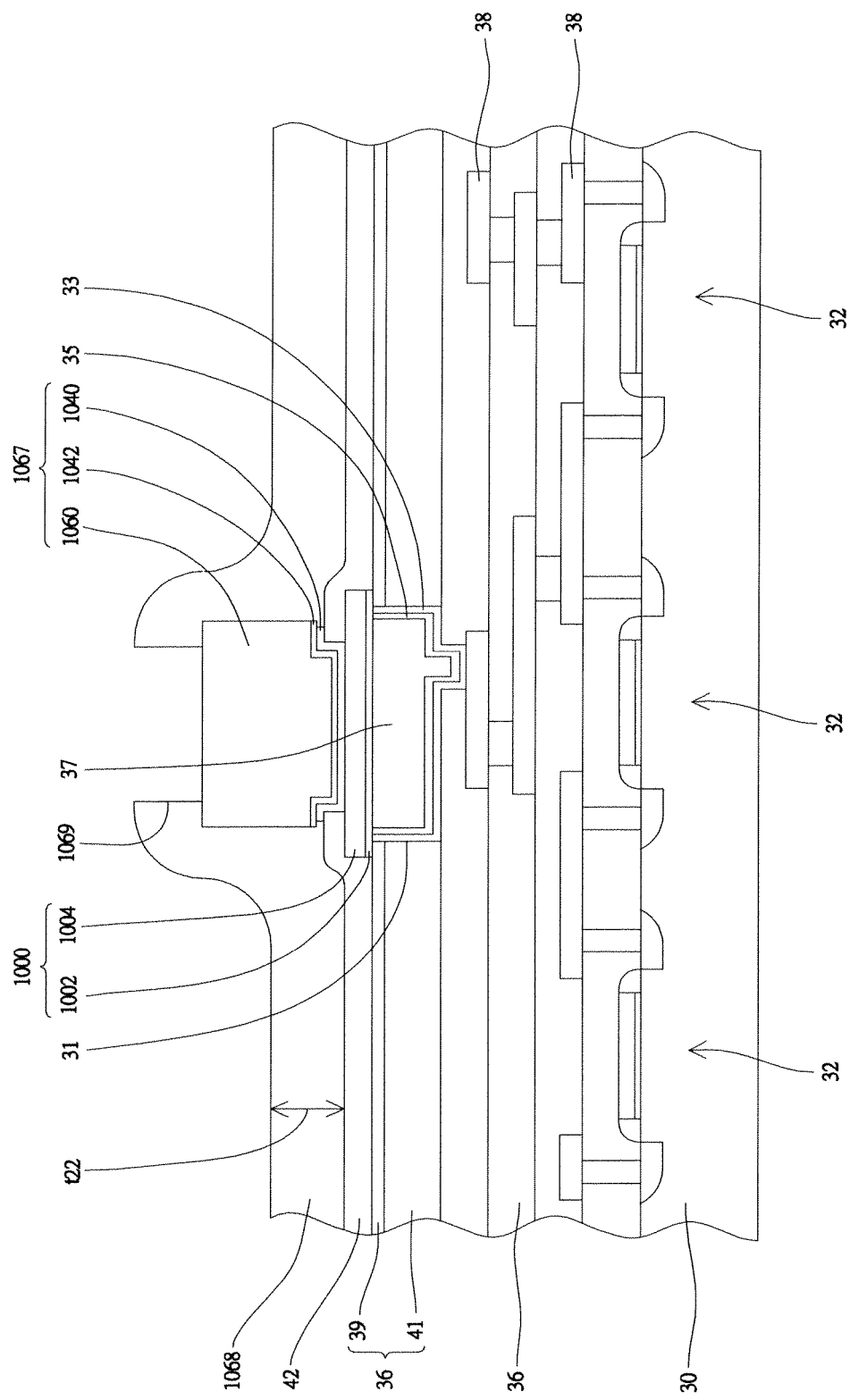

If the metallization structure formed for the metal layers 1040, 1042, and 1060 is used as a metal pad 1067, a patterned polymer layer 1068 can be optionally formed on the passivation layer 42 and on the peripheral region of the metal pad 1067, as shown in FIGS. 88 and 89.

Referring to FIGS. 88-89, it is an optional process to form the patterned polymer layer 1068. The patterned polymer layer 1068 can be formed by spin coating a polymer layer 1071 of polyimide, benzo-cyclo-butene (BCB), parylene-based material, epoxy-based material, or elastomer, with a thickness of between 2 and 50 microns, and preferably between 8 and 30 microns, on the metal pads 1067 and on the passivation layer 42.

Next, if the spin-coated polymer layer 1071 is photosensitive, a photolithography process including exposing and developing steps can be used to form an opening 1069 in the spin-coated polymer layer 1071, shown as the patterned polymer layer 1068, exposing the metal layer 1067. Next, the patterned polymer layer 1068 is cured at the temperature of 300 and 450 degrees centigrade if the patterned polymer layer 1068 is polyimide. The patterned polymer layer 1068 after being cured may have a thickness t22 of between 2 and 50 microns, and preferably between 6 and 20 microns.

If the spin-coated polymer layer 1071 is non-photosensitive, photolithography and etching processes are typically needed to pattern the spin-coated polymer layer 1071.

Alternatively, the patterned polymer layer 1068 can be formed by screen printing a patterned polymer layer of polyimide, benzocyclobutene (BCB), parylene-based material or epoxy-based material, with a thickness of between 5 and 50 microns on the metal pads 1067 and on the passivation layer 42, and then curing the screen-printed polymer layer at the temperature of 300 and 450 degrees centigrade if the screen-printed polymer layer is polyimide. Alternatively, the patterned polymer layer 1068 can be formed by laminating a patterned dry film of polyimide, benzocyclobutene (BCB), parylene-based material or epoxy, with a thickness of between 10 and 500 microns on the metal pads 1067 and on the passivation layer 42.

Figure 90:
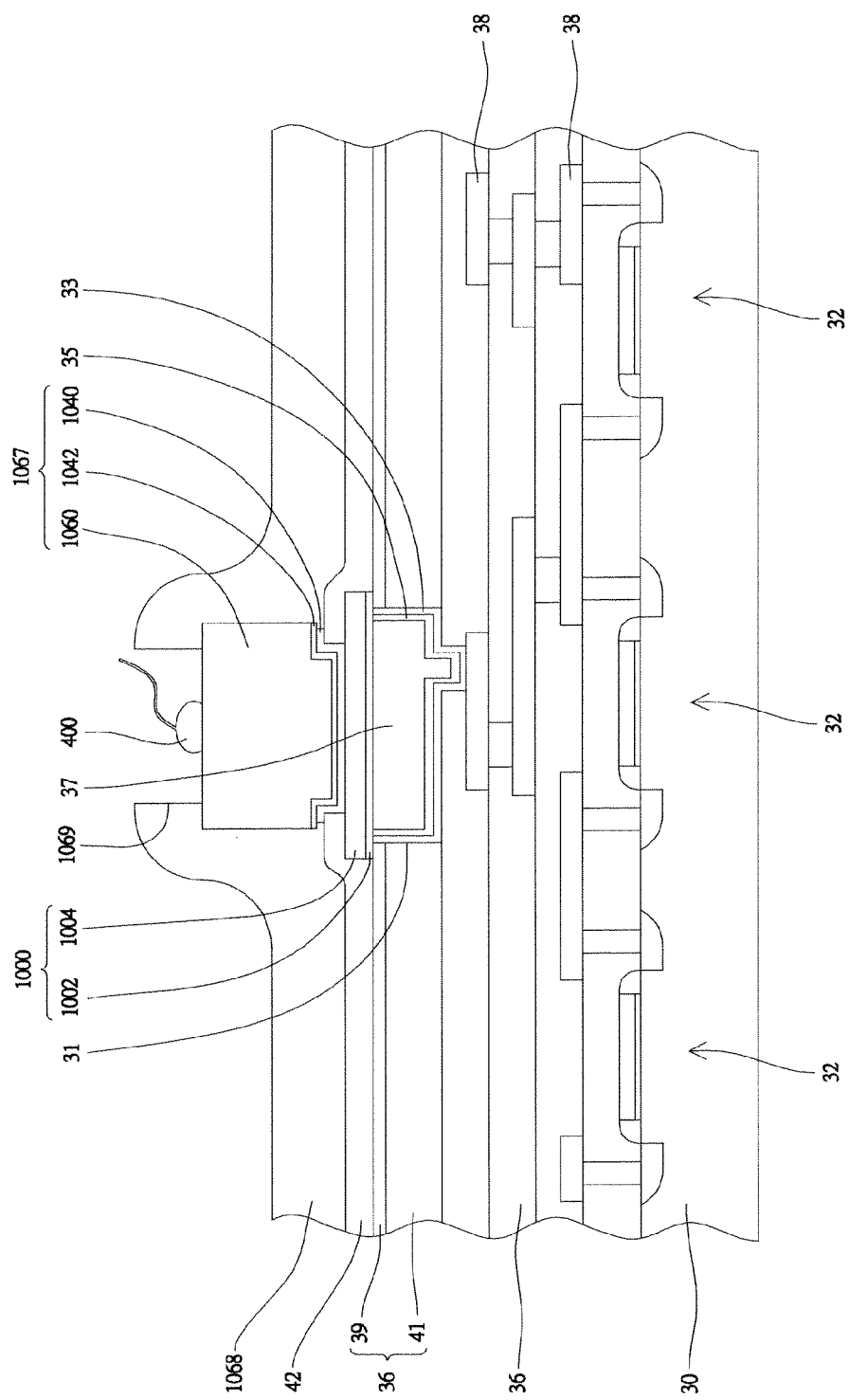

Next, referring to FIG. 90, the metal pad 1067 can be used for being wirebonded thereto or having a gold bump or solder bump formed thereover. A gold wire 400 can be connected to the metal pad 1067 exposed by the opening 1069 in the polymer layer 1068 using a wirebonding process. Alternatively, a gold bump or tin-containing bump, not shown, can be formed over the metal pad 1067 exposed by the opening 1069 in the polymer layer 1068.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A semiconductor chip comprising:
   a semiconductor substrate;
   a transistor on said semiconductor substrate;
   a copper pad over said semiconductor substrate;
   a tantalum-containing layer at a sidewall and a bottom surface of said copper pad;
   a copper seed layer at said sidewall and said bottom surface, wherein said copper seed layer is between said tantalum-containing layer and said copper pad;
   a single layer of a titanium-containing material directly on a top surface of said copper pad;
   a gold seed layer on said single layer of said titanium-containing material, wherein said gold seed layer contacts said single layer of said titanium-containing material; and
   an electroplated gold layer on said gold seed layer, wherein said electroplated gold layer has a thickness between 0.1 and 30 micrometers.

2. The semiconductor chip of claim 1 further comprising a passivation layer over said semiconductor substrate, wherein an opening in said passivation layer is over a contact point of said top surface of said copper pad, and said contact point is at a bottom of said opening, wherein said single layer of said titanium-containing material is directly on said contact point, wherein said passivation layer comprises a nitride layer.

3. The semiconductor chip of claim 1 further comprising an insulating layer over said semiconductor substrate, wherein said copper pad is further over said insulating layer, wherein said insulating layer has a dielectric constant less than 3.

4. The semiconductor chip of claim 3, wherein said insulating layer comprises a compound comprising silicon, oxygen, nitrogen and carbon.

5. The semiconductor chip of claim 1, wherein said electroplated gold layer is configured to be wirebonded thereto.

6. The semiconductor chip of claim 1, wherein the semiconductor chip is configured for a tape-automated bonding (TAB) package.

7. The semiconductor chip of claim 1, wherein the semiconductor chip is configured for a chip-on-film (COF) package.

8. The semiconductor chip of claim 1, wherein the semiconductor chip is configured for a chip-on-glass (COG) package.

9. The semiconductor chip of claim 1, wherein said single layer of said titanium-containing material comprises a titanium-tungsten alloy.

10. A semiconductor chip comprising:
a semiconductor substrate;
a transistor on said semiconductor substrate;
a copper pad over said semiconductor substrate;
a metal layer on a sidewall and a bottom surface of said copper pad;
a passivation layer over said semiconductor substrate, wherein an opening in said passivation layer is over a contact point of said copper pad, and said contact point is at a bottom of said opening, wherein said passivation layer comprises a nitride layer;
a single layer of a titanium-containing material directly on said contact point and directly on a top surface of said passivation layer;
a gold seed layer on said single layer of said titanium-containing material, wherein said gold seed layer contacts said single layer of said titanium-containing material; and
an electroplated gold layer on said gold seed layer, wherein said electroplated gold layer has a thickness between 0.1 and 30 micrometers.

11. The semiconductor chip of claim 10 further comprising an insulating layer over said semiconductor substrate, wherein said copper pad is further over said insulating layer, wherein said insulating layer has a dielectric constant less than 3.

12. The semiconductor chip of claim 11, wherein said insulating layer comprises a compound comprising silicon, oxygen, nitrogen and carbon.

13. The semiconductor chip of claim 10, wherein said electroplated gold layer is configured to be wirebonded thereto.

14. The semiconductor chip of claim 10, wherein said semiconductor chip is configured for a tape-automated bonding (TAB) package.

15. The semiconductor chip of claim 10, wherein said semiconductor chip is configured for a chip-on-film (COF) package.

16. The semiconductor chip of claim 10, wherein said semiconductor chip is configured for a chip-on-glass (COG) package.

17. The semiconductor chip of claim 10, wherein said single layer of said titanium-containing material comprises a titanium-tungsten alloy.

18. The semiconductor chip of claim 10, wherein said metal layer comprises tantalum.

19. A semiconductor chip comprising:
a semiconductor substrate;
a transistor on said semiconductor substrate;
a copper pad over said semiconductor substrate;
a metal layer on a sidewall and a bottom surface of said copper pad;
a passivation layer over said semiconductor subtrate, wherein an opening in said passivation layer is over a contact point of said copper pad, and said contact point is at a bottom of said opening;
a single layer of a titanium-containing material directly on said contact point; and
a gold layer over said single layer of said titanium-containing material, wherein said semiconductor chip is configured for a chip-on-glass (COG) package.

20. The semiconductor chip of claim 19, wherein said metal layer comprises tantalum.

21. The semiconductor chip of claim 19, wherein said gold layer has a thickness between 0.1 and 30 micrometers.

22. The semiconductor chip of claim 19, wherein said passivation layer comprises an insulating layer.

23. The semiconductor chip of claim 22, wherein said insulating layer comprises silicon nitride.

24. The semiconductor chip of claim 22, wherein said insulating layer comprises silicon oxynitride.

25. The semiconductor chip of claim 22, wherein said insulating layer comprises silicon oxide.

26. A circuit component comprising:
a first dielectric layer;
a first copper layer over said first dielectric layer;
a barrier layer at a bottom of said first copper layer and at a sidewall of said first copper layer;
an aluminum-containing layer over a top surface of said first copper layer, wherein said aluminum-containing layer is connected to said first copper layer;
a passivation layer over said aluminum-containing layer, said first copper layer and said first dielectric layer, wherein said passivation layer contacts a sidewall of said aluminum-containing layer, wherein a first opening in said passivation layer is over a contact point of said aluminum-containing layer; and
a metal bump on said contact point, wherein said metal bump is connected to said contact point through said first opening, wherein said metal bump is connected to said first copper layer through said aluminum-containing layer, wherein said metal bump comprises a metal layer on said contact point and a gold layer on said metal layer, wherein said gold layer is configured for chip-on-glass (COG) bonding.

27. The circuit component of claim 26, wherein said barrier layer comprises tantalum.

28. The circuit component of claim 26, wherein said barrier layer comprises titanium.

29. The circuit component of claim 26 further comprising a second dielectric layer over said first dielectric layer, wherein said first copper layer is further in a second opening in said second dielectric layer, wherein said barrier layer has a portion between said sidewall of said first copper layer and a sidewall of said second opening.

30. The circuit component of claim 26, wherein said passivation layer comprises a nitride layer.

31. The circuit component of claim 30, wherein said nitride layer comprises silicon nitride.

32. The circuit component of claim 30, wherein said nitride layer comprises silicon oxynitride.

33. The circuit component of claim 30, wherein said passivation layer further comprises a silicon-oxide layer.

34. The circuit component of claim 26, wherein said gold layer has a thickness between 2 and 30 micrometers.

35. The circuit component of claim 26, wherein said metal layer comprises titanium.

36. The circuit component of claim 26, wherein said metal layer comprises a second copper layer between said contact point and said gold layer.

37. The circuit component of claim 36, wherein said metal layer further comprises a nickel layer between said second copper layer and said gold layer.

38. The circuit component of claim 36, wherein said second copper layer has a thickness between 0.1 and 10 micrometers.

39. The circuit component of claim 36, wherein said metal layer further comprises a titanium-containing layer between said contact point and said second copper layer.

40. The circuit component of claim 26, wherein said metal layer is under said gold layer, but is not at a sidewall of said gold layer.

* * * * *